(12) United States Patent
Murakami et al.

(10) Patent No.: US 10,700,811 B2
(45) Date of Patent: Jun. 30, 2020

(54) TRANSMISSION METHOD, TRANSMISSION DEVICE, RECEPTION METHOD, AND RECEPTION DEVICE

(71) Applicant: Panasonic Intellectual Property Management Co., Ltd., Osaka (JP)

(72) Inventors: Yutaka Murakami, Kanagawa (JP); Tomohiro Kimura, Osaka (JP); Mikihiro Ouchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/391,939

(22) Filed: Apr. 23, 2019

(65) Prior Publication Data

US 2019/0253189 A1    Aug. 15, 2019

Related U.S. Application Data

(63) Continuation of application No. 15/618,404, filed on Jun. 9, 2017, now Pat. No. 10,326,554, which is a (Continued)

(30) Foreign Application Priority Data

Feb. 10, 2015 (JP) ................................. 2015-024242
Jul. 13, 2015 (JP) ................................. 2015-139840

(51) Int. Cl.
*H03M 13/00* (2006.01)
*H04L 1/00* (2006.01)
(Continued)

(52) U.S. Cl.
CPC ....... *H04L 1/0054* (2013.01); *H03M 13/1111* (2013.01); *H03M 13/1125* (2013.01);
(Continued)

(58) Field of Classification Search
CPC .......... H03M 13/1111; H03M 13/1125; H03M 13/3707; H03M 13/3715; H03M 13/373;
(Continued)

(56) References Cited

U.S. PATENT DOCUMENTS 8,001,452 B2 * 8/2011 Azadet ............. H03M 13/6577
714/794
8,286,048 B1 * 10/2012 Chen .................. H03M 13/1128
714/752
(Continued)

FOREIGN PATENT DOCUMENTS

JP    2008-527948    7/2008
JP    2010-178928    8/2010
(Continued)

OTHER PUBLICATIONS

International Search Report issued Mar. 1, 2016 in International (PCT) Application No. PCT/JP2016/000574.
(Continued)

*Primary Examiner* — Christine T. Tu
(74) *Attorney, Agent, or Firm* — Wenderoth, Lind & Ponack, L.L.P.

(57) ABSTRACT

A decoding device includes: a BP decoder that performs BP decoding on an input signal; a maximum likelihood decoder that performs maximum likelihood decoding on a signal subjected to the BP decoding; and a selector that selects one of the input signal, the signal subjected to the BP decoding, and a signal subjected to the maximum likelihood decoding. In a configuration of the decoding device, when a decoder is appropriately operated according to quality of data, a calculation scale can be reduced, and power consumption can be decreased.

2 Claims, 39 Drawing Sheets

Related U.S. Application Data continuation of application No. PCT/JP2016/000574, filed on Feb. 4, 2016.

(51) Int. Cl.
   *H03M 13/11* (2006.01)
   *H03M 13/37* (2006.01)

(52) U.S. Cl.
   CPC ..... *H03M 13/373* (2013.01); *H03M 13/3707* (2013.01); *H03M 13/3715* (2013.01); *H03M 13/3776* (2013.01); *H03M 13/616* (2013.01); *H04L 1/0053* (2013.01); *H04L 1/0057* (2013.01); *H04L 1/0061* (2013.01); *H04L 1/005* (2013.01); *H04L 2001/0097* (2013.01)

(58) Field of Classification Search
   CPC ............ H03M 13/3776; H03M 13/616; H04L 1/0054; H04L 1/0053; H04L 1/0057; H04L 1/0061; H04L 1/005; H04L 2001/0097
   See application file for complete search history.

(56) References Cited

U.S. PATENT DOCUMENTS

| | | | |
|---|---|---|---|
| 9,214,962 | B2 | 12/2015 | Murakami |
| 2006/0195752 | A1 | 8/2006 | Walker et al. |
| 2008/0270868 | A1 | 10/2008 | Shinagawa |
| 2010/0192040 | A1 | 7/2010 | Yedidia et al. |
| 2012/0284584 | A1 | 11/2012 | Zhang |
| 2013/0136208 | A1 | 5/2013 | Murakami et al. |
| 2014/0214967 | A1 | 7/2014 | Baba et al. |
| 2018/0083802 | A1* | 3/2018 | Kang ................. H04B 7/04 |

FOREIGN PATENT DOCUMENTS

| | | |
|---|---|---|
| JP | 2012-039450 | 2/2012 |
| JP | 2012-120140 | 6/2012 |
| JP | 2012-129579 | 7/2012 |
| WO | 2013/031556 | 3/2013 |

OTHER PUBLICATIONS

Kunitaka Murotsu et al., "An Erasure Correction Scheme based on BP and Gaussian Elimination", The 27th Symposium on Information Theory and Its Applications (SITA 2004), Dec. 14-17, 2004, pp. 271-274. (Whole sentence Translation).

Extended European Search Report dated Feb. 22, 2018 in European Application No. 16748903.8.

Mathieu Cunche et al.: "Improving the Decoding of LDPC Codes for the Packet Erasure Channel with a Hybrid Zyablov Iterative Decoding/Gaussian Elimination Scheme", Rapport de Recherche, No. 6473, Jan. 1, 2008 (Jan. 1, 2008), pp. 1-16, XP055445346, Retrieved from the Internet: URL:https://planete.inrialpes.fr/~roca/doc/RR-6473.pdf [retrieved on Jan. 26, 2018].

Mathieu Cunche et al.: "Optimizing the error recovery capabilities of LDPC-staircase codes featuring a Gaussian elimination decoding scheme", Proc., IEEE 10th International Workshop on Signal Processing for Space Communications (SPSC); Rhodes Island, Greece, Oct. 6, 2008 (Oct. 6, 2008),—Oct. 8, 2008 (Oct. 8, 2008), pp. 1-7, XP055367346.

Weizheng Huang et al.: "Fountain codes with message passing and maximum likelihood decoding over erasure channels", Proc., IEEE Wireless Telecommunications Symposium (WTS), Apr. 13, 2011 (Apr. 13, 2011), pp. 1-5, XP031903488.

* cited by examiner

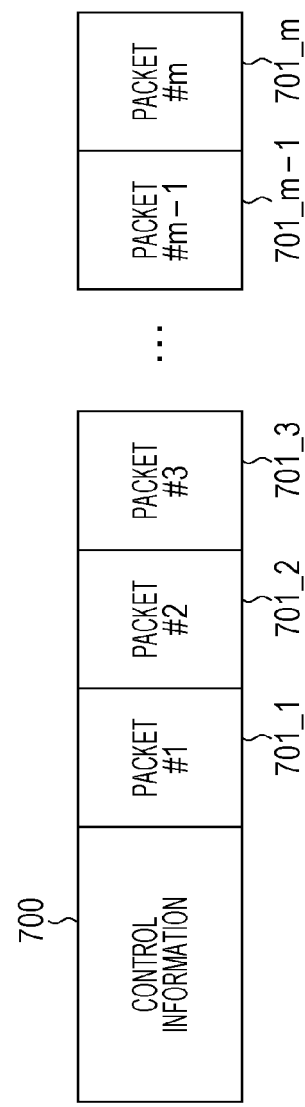

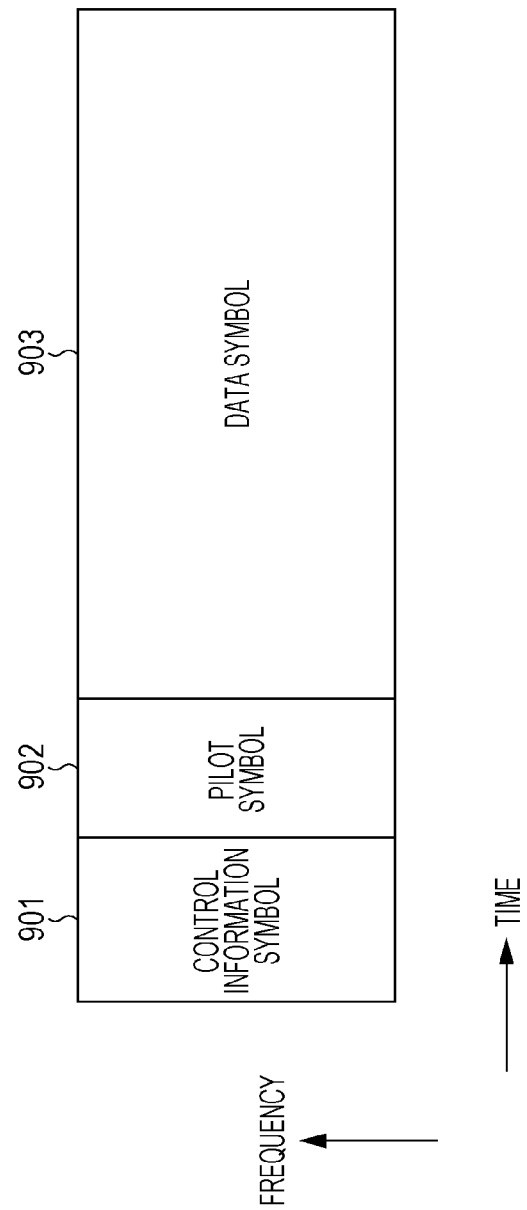

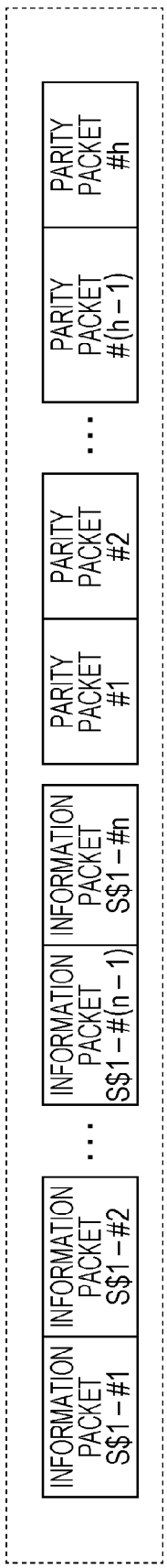
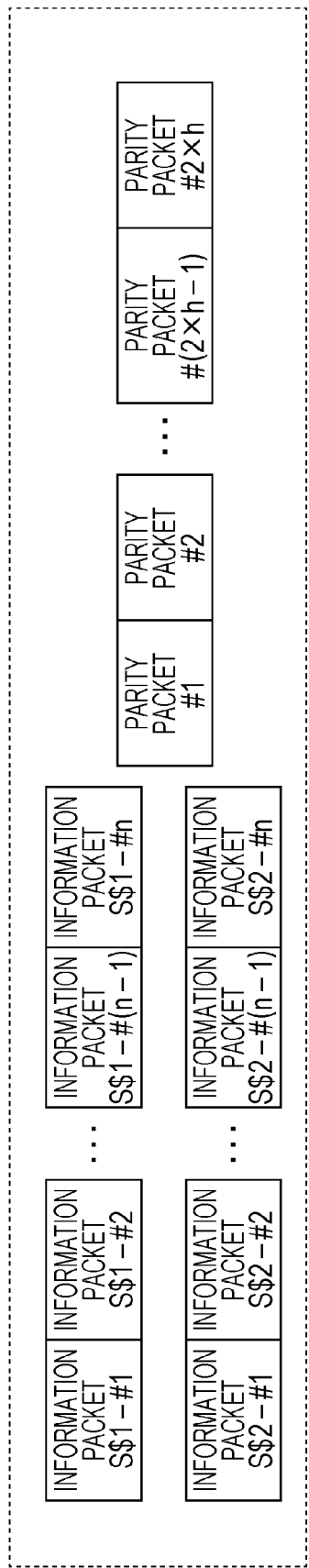
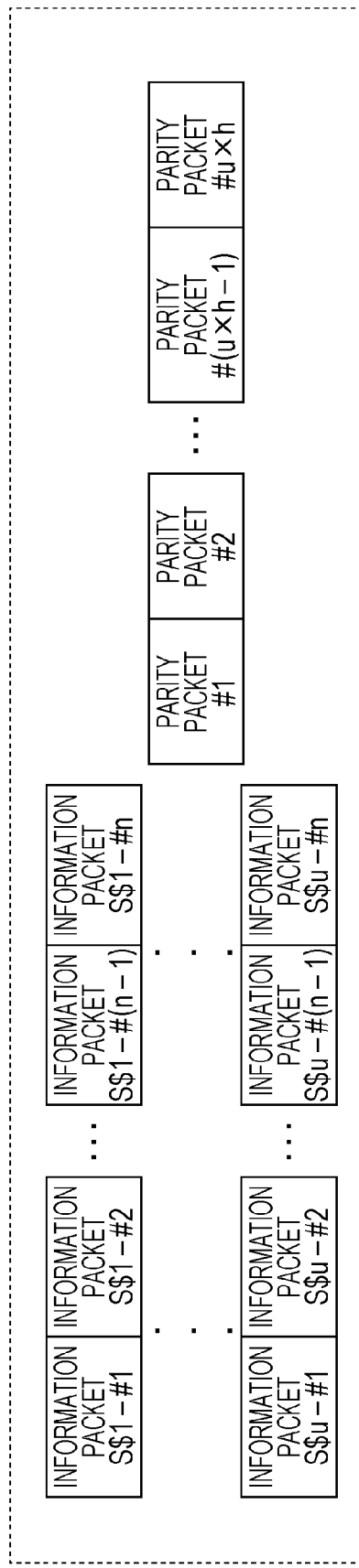

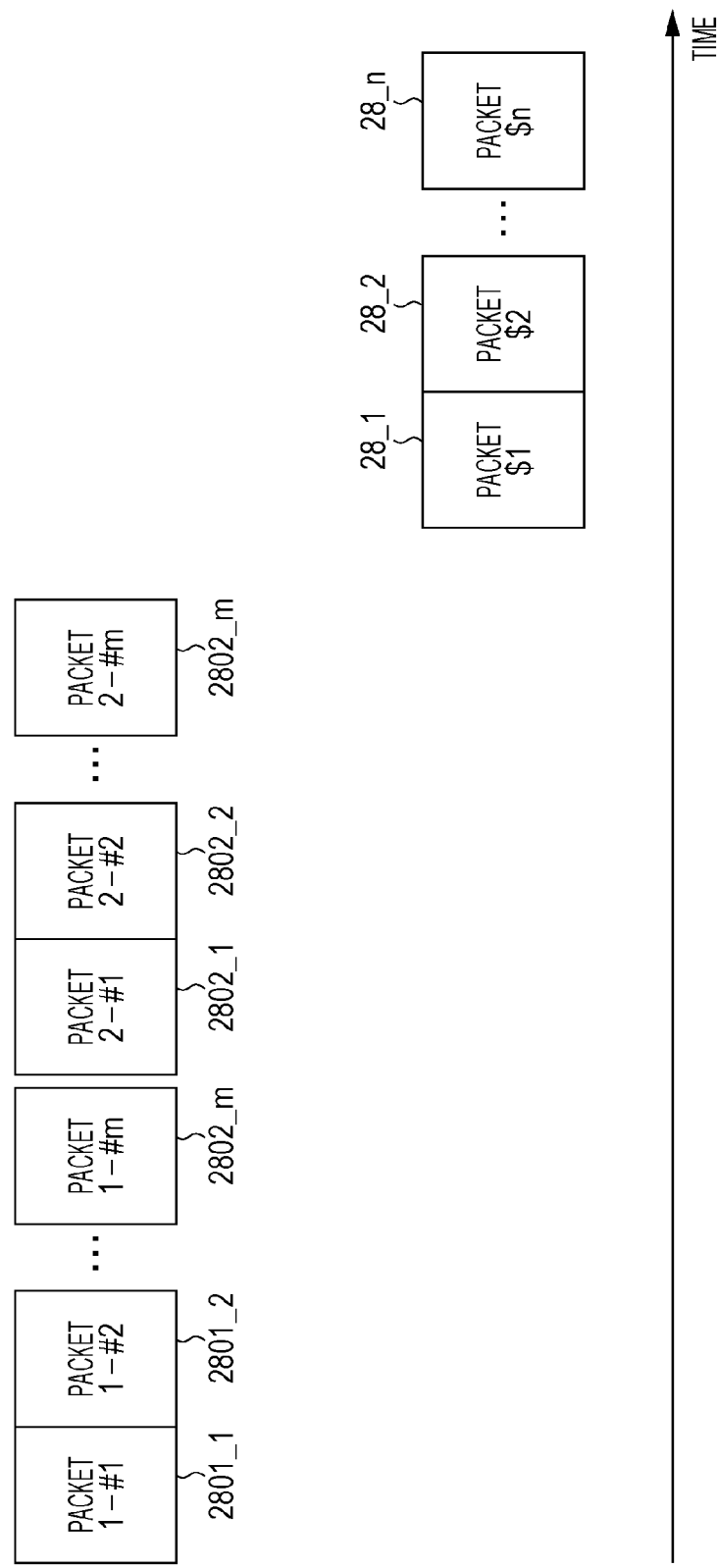

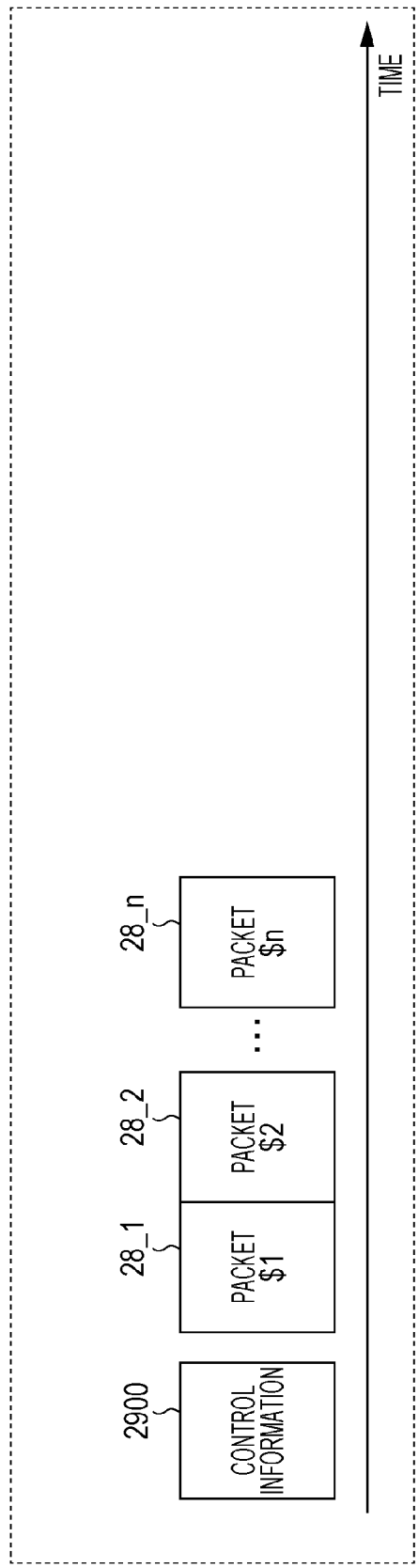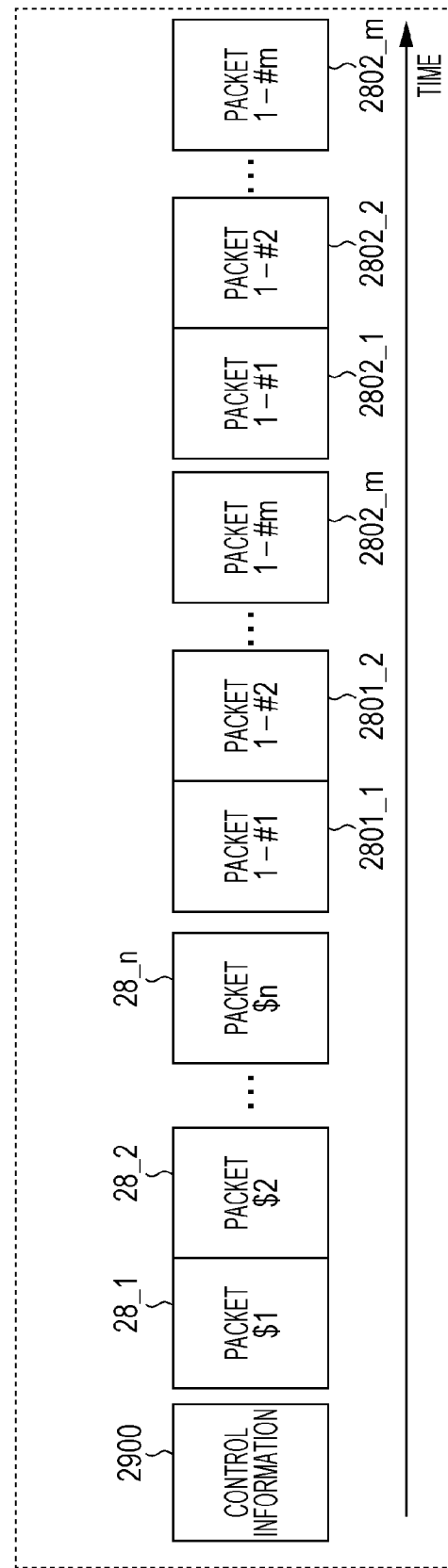

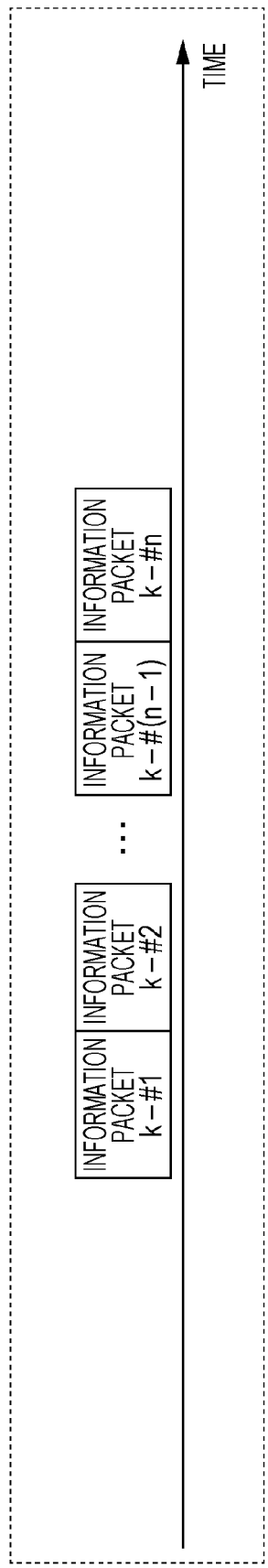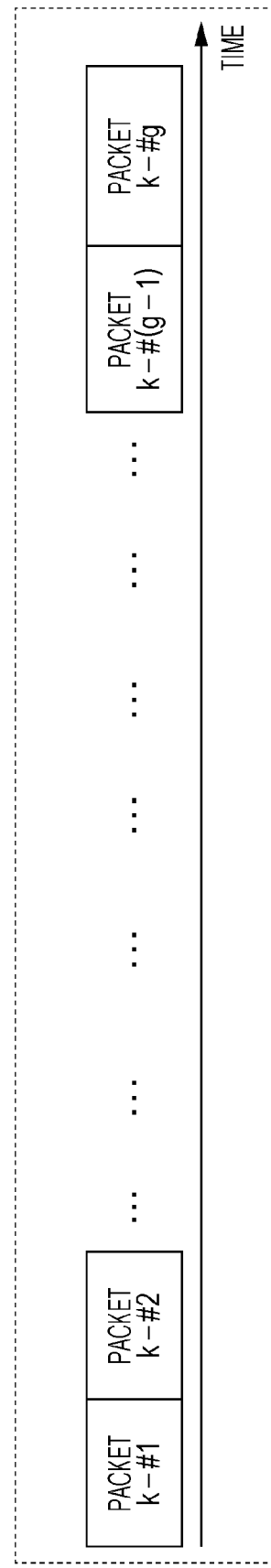

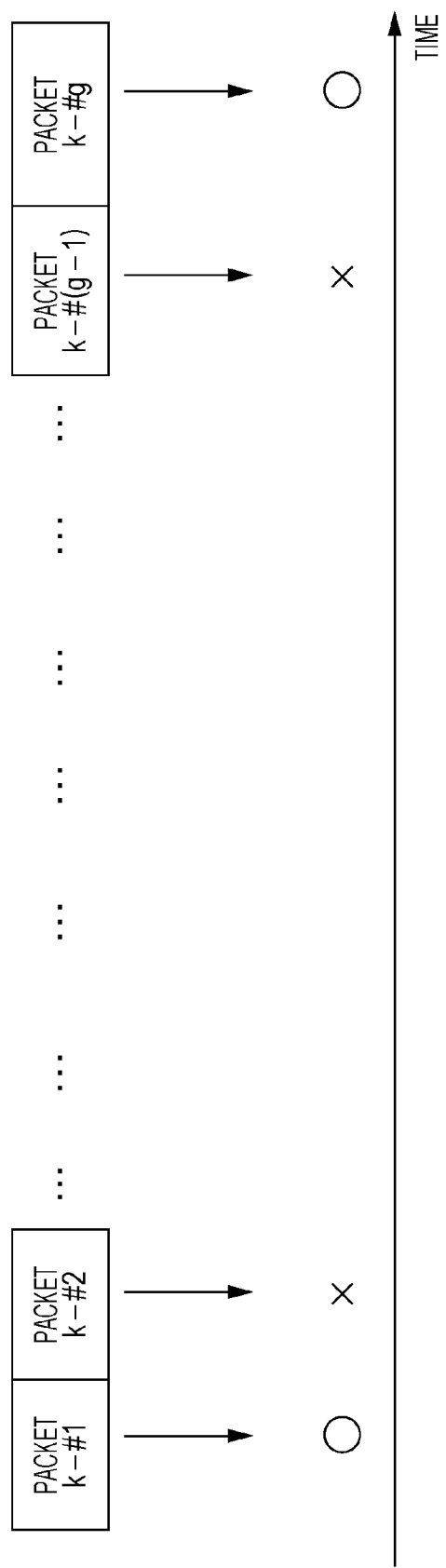

TRANSMISSION METHOD, TRANSMISSION DEVICE, RECEPTION METHOD, AND RECEPTION DEVICE

BACKGROUND

1. Technical Field

The present disclosure relates to a transmission method and a transmission device for transmitting a signal by performing erasure correction coding using, for example, an LDPC (Low Density Parity Check) code, and a reception method and a reception device for receiving the signal.

2. Description of the Related Art

In applications such as a moving image streaming, in the case that packets which are many enough to be hardly permitted are erased at an application level, an error (erasure) correction code is introduced at an application-layer level to ensure quality at the application level. For example, in NPL 1, an application makes an examination, which is assumed to introduce the LDPC code as an application-layer-level error (erasure) correction code. NPL 1 discloses a decoding method, in which BP (Belief Propagation) decoding and Gaussian elimination are combined with each other, as a decoding method for the reception device.

CITATION LIST

Patent Literature

PTL 1: International Patent Publication No. 2013/031556
PTL 2: Unexamined Japanese Patent Publication No. 2012-120140
PTL 3: Unexamined Japanese Patent Publication No. 2012-129579

Non-Patent Literature

NPL 1: Kunitaka Murotsu, Tadashi Wadayama, Jiro Yamakita, "An Erasure Correction Scheme based on BP and Gaussian Elimination", The 27th Symposium on Information Theory and Its Applications (SITA 2004), Dec. 14-17, 2004.

NPL 1 discloses the following decoding method in which the BP decoding and the Gaussian elimination are combined with each other.

(Step 1) The reception device generates a vector (received vector) including the erasure.

(Step 2) The reception device performs decoding by a sum-product decoding method that is one of the BP decoding.

(Step 3) The reception device adopts the decoding method based on the Gaussian elimination only in the case that the decoding is impossible.

(Step 4) The reception device sets a block, which is undecodable even if a decoding method based on the Gaussian elimination is adopted, to a final undecodable block.

The reception device performs the decoding method on a block of each error (erasure) correction code.

However, when performing the decoding by the decoding method, the reception device does not control the decoding in consideration of calculation cost in the reception device. Therefore, it is necessary to perform processing for large power consumption.

SUMMARY

One non-limiting and exemplary embodiment provides a decoding device, which can perform the decoding at low calculation cost by the more accurate control in consideration of the calculation cost in the reception device and reduce the power consumption of the reception device. Additionally, a non-limiting exemplary embodiment of the present disclosure is to provide a flexible system that obtains high reception quality of data by adoption of the transmission method suitable for a characteristic of the erasure correction code in the transmission device.

In one general aspect, the techniques disclosed here feature a decoding device including: a BP decoder that performs BP decoding on an input signal; a maximum likelihood decoder that performs maximum likelihood decoding on the signal subjected to the BP decoding; and a selector that selects one of the input signal, the signal subjected to the BP decoding, and the signal subjected to the maximum likelihood decoding.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 7 illustrates an example of a frame configuration;

FIG. 9 illustrates an example of a frame configuration of a modulation signal transmitted from the transmission device of the transmission station;

FIG. 23A illustrates an example of an error correction coding method of the transmission device;

FIG. 23B illustrates another example of an error correction coding method of the transmission device;

FIG. 23C illustrates still another example of an error correction coding method of the transmission device;

FIG. 28 illustrates a configuration example of a packet, which is input to a physical-layer error correction coder in FIG. 27, on a time axis;

FIG. 29A illustrates an example of an output on a time axis of post-error-correction-coding data output from the physical-layer error correction coder in FIG. 27;

FIG. 29B illustrates another example of an output on a time axis of post-error-correction-coding data output from the physical-layer error correction coder in

FIG. 27;

FIG. 39A illustrates an example of an error correction coding method of the transmission station;

FIG. 39B illustrates another example of an error correction coding method of the transmission station;

FIG. 40 illustrates an example of the reception state when the repeater in FIG. 33 receives a kth packet group in FIG. 39B.

DETAILED DESCRIPTION

Hereinafter, exemplary embodiments of the present disclosure will be described with reference to the drawings.
(BP Decoding and Gaussian Elimination)

First Exemplary Embodiment

Figure 1:
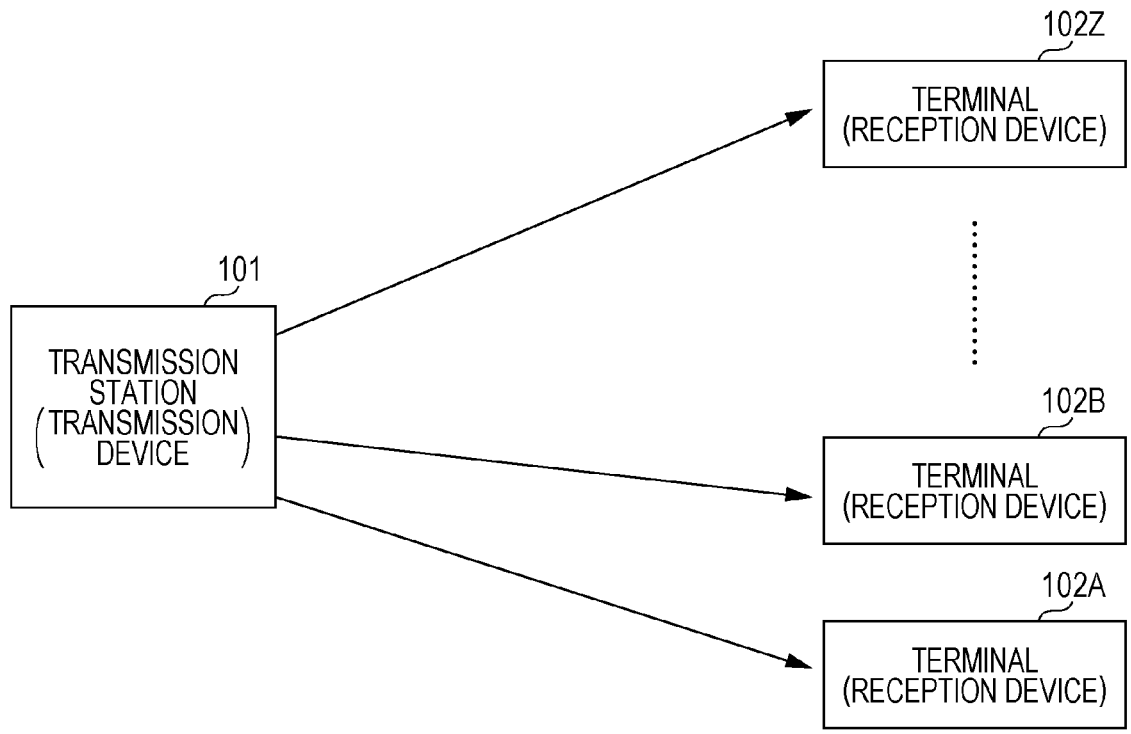
FIG. 1 illustrates an example of a relationship between a transmission station and a terminal.

FIG. 1 illustrates an example of a relationship between a transmission station and a terminal in a first exemplary embodiment. In FIG. 1, for example, transmission station 101 transmits data including identical information to terminal 102A, terminal 102B, . . . , terminal 102Z, namely, a plurality of terminals (or one terminal).

Figure 2:
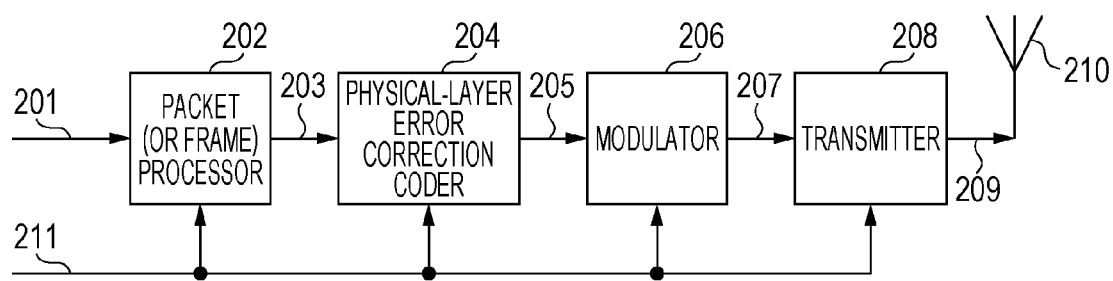
FIG. 2 illustrates a configuration example of a transmission device.

FIG. 2 illustrates a configuration example of transmission device 101 of the transmission station in FIG. 1.

Information 201 and control signal 211 are input to packet (or frame) processor 202, and packet (or frame) processor 202 performs packet (or frame) processing on information 201 according to control signal 211, and outputs post-packet (or -frame) processing data 203. Detailed operation will be described later.

Post-packet (or -frame) processing data 203 and control signal 211 are input to physical-layer error correction coder 204, and physical-layer error correction coder 204 codes data 203 by an error correction coding scheme (specific error correction code and coding rate) according to control signal 211, and outputs post-error-correction-coding data 205.

Post-error-correction-coding data 205 and control signal 211 are input to modulator 206, and modulator 206 modulates data 205 by a modulation scheme according to control signal 211, and outputs baseband signal 207.

Baseband signal 207 and control signal 211 are input to transmitter 208, and transmitter 208 performs signal processing on baseband signal 207 based on a transmission method according to control signal 211, and outputs modulation signal 209. Modulation signal 209 is output as a radio wave from antenna 210. The data transmitted in terms of modulation signal 209 is delivered to the terminal.

In the first exemplary embodiment, the transmission device transmits one modulation signal by way of example. However, the present disclosure is not limited to the first exemplary embodiment. Alternatively, as described in PTLs 1 and 2, it is possible to adopt a transmission method in which a plurality of modulation signals may be transmitted from a plurality of antennas at an identical time and an identical frequency. A single carrier scheme, a multi-carrier scheme such as an OFDM (Orthogonal Frequency Division Multiplexing) scheme, and a spread spectrum communication scheme may be adopted as a transmission method in the transmission device. In FIG. 2, transmission station 101 wirelessly performs the transmission by way of example. Alternatively, a wired transmission method in which a cable or the like is used may be adopted.

Figure 3:
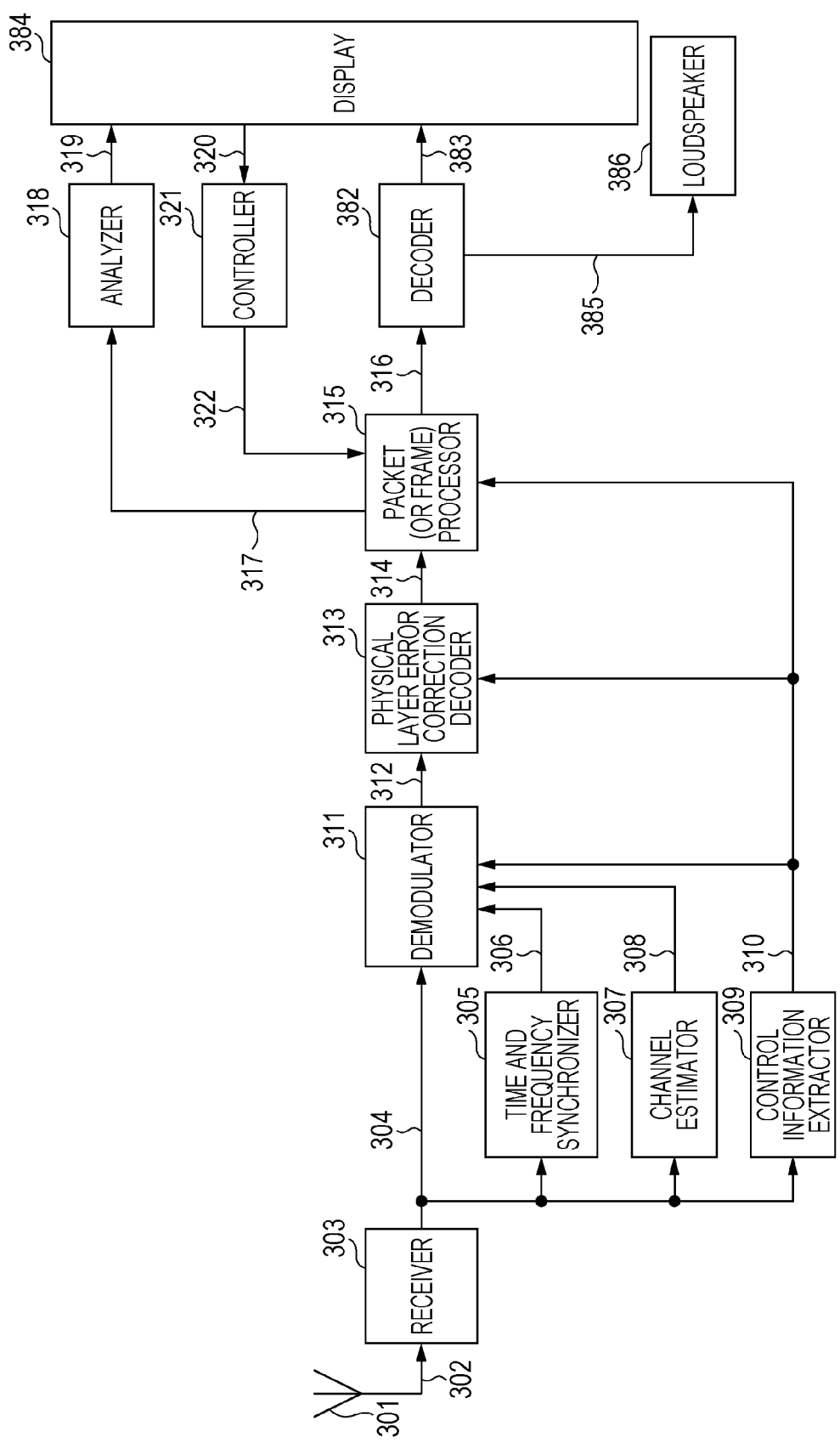
FIG. 3 illustrates a configuration example of a reception device.

FIG. 3 illustrates a configuration example of a receiving device of the terminal in FIG. 1. Antenna 301 receives the modulation signal transmitted from transmission station 101, and outputs the modulation signal to receiver 303. Receiver 303 performs pieces of processing such as frequency conversion and quadrature demodulation on received signal 302 received with antenna 301, and outputs baseband signal 304.

Time and frequency synchronizer 305 extracts a preamble, a pilot symbol, a reference symbol, and the like, which are included in baseband signal 304, performs time synchronization, frequency synchronization, frequency offset estimation, and the like, and outputs synchronous signal 306.

Channel estimator 307 extracts the preamble, the pilot symbol, the reference symbol, and the like, which are included in baseband signal 304, estimates a state of a propagation path (channel estimation), and outputs channel estimation signal 308.

Control information extractor 309 extracts a control information symbol included in baseband signal 304, performs pieces of processing such as demodulation of the control information symbol and error correction decoding, and outputs control information signal 310.

Baseband signal 304, synchronous signal 306, channel estimation signal 308, and control information signal 310 are input to demodulator 311, and demodulator 311 demodulates baseband signal 304 using synchronous signal 306 and channel estimation signal 308 based on modulation signal information included in control information signal 310, obtains a logarithm likelihood ratio for each bit, and outputs logarithm likelihood ratio signal 312. Operation of demodulator 311 is already described in PTLs 2 and 3.

Logarithm likelihood ratio signal 312 and control information signal 310 are input to physical layer error correction decoder 313, and physical layer error correction decoder 313 performs the error correction decoding on logarithm likelihood ratio signal 312 based on information (such as error correction code information, a code length (block length), and a coding rate) about an error correction code, the information being included in control information signal 310, and outputs received data 314.

Received data 314 processed with physical layer error correction decoder 313, control information signal 310, and control signal 322 are input to packet (or frame) processor 315, and packet (or frame) processor 315 performs the packet (or frame) processing on received data 314 based on the information about control information signal 310 and outputs post-packet (or -frame) processing data 316. Packet (or frame) processor 315 may change a decoding algorithm based on control signal 322. Packet (or frame) processor 315 outputs state information 317 such as a situation of error generation. Detailed operation will be described later.

In the first exemplary embodiment, the wireless transmission is performed by way of example. Alternatively, a wired transmission method in which a cable or the like is used may be adopted in the present disclosure. In the present disclosure, one modulation signal is transmitted by way of example. However, the present disclosure is not limited to the first exemplary embodiment. Alternatively, as described in PTLs 1 and 2, it is possible to adopt a transmission method in which the plurality of modulation signals may be transmitted from the plurality of antennas at the identical time and the identical frequency. In the present disclosure, because the single carrier scheme, the multi-carrier scheme such as the OFDM (Orthogonal Frequency Division Multiplexing) scheme, or the spread spectrum communication scheme is adopted as the transmission method, each part performs the processing corresponding to each of these schemes.

Decoder 382 performs video and audio decoding on data 316, and outputs video signal 383 and audio signal 385.

Video signal 383 is output to display 384, or output from an external output terminal. Audio signal 385 is output as sound from loudspeaker 386, or output from the external output terminal.

State information 317 is input to analyzer 318, and analyzer 318 analyzes state information 318, and outputs information 319 about, for example, a recommended packet-level decoding method (an error (erasure) correction decoding method performed with a packet (or) frame processor). Display 384 displays a "recommended packet-level decoding method". Details will be described later.

Setting information 320 is input to controller 321, and controller 321 performs a detailed setting associated with the packet-level decoding method using, for example, display 384. Controller 321 generates control signal 322 based on setting information 320, and outputs control signal 322.

(Packet- or Frame-Level Coding)

Figure 4:
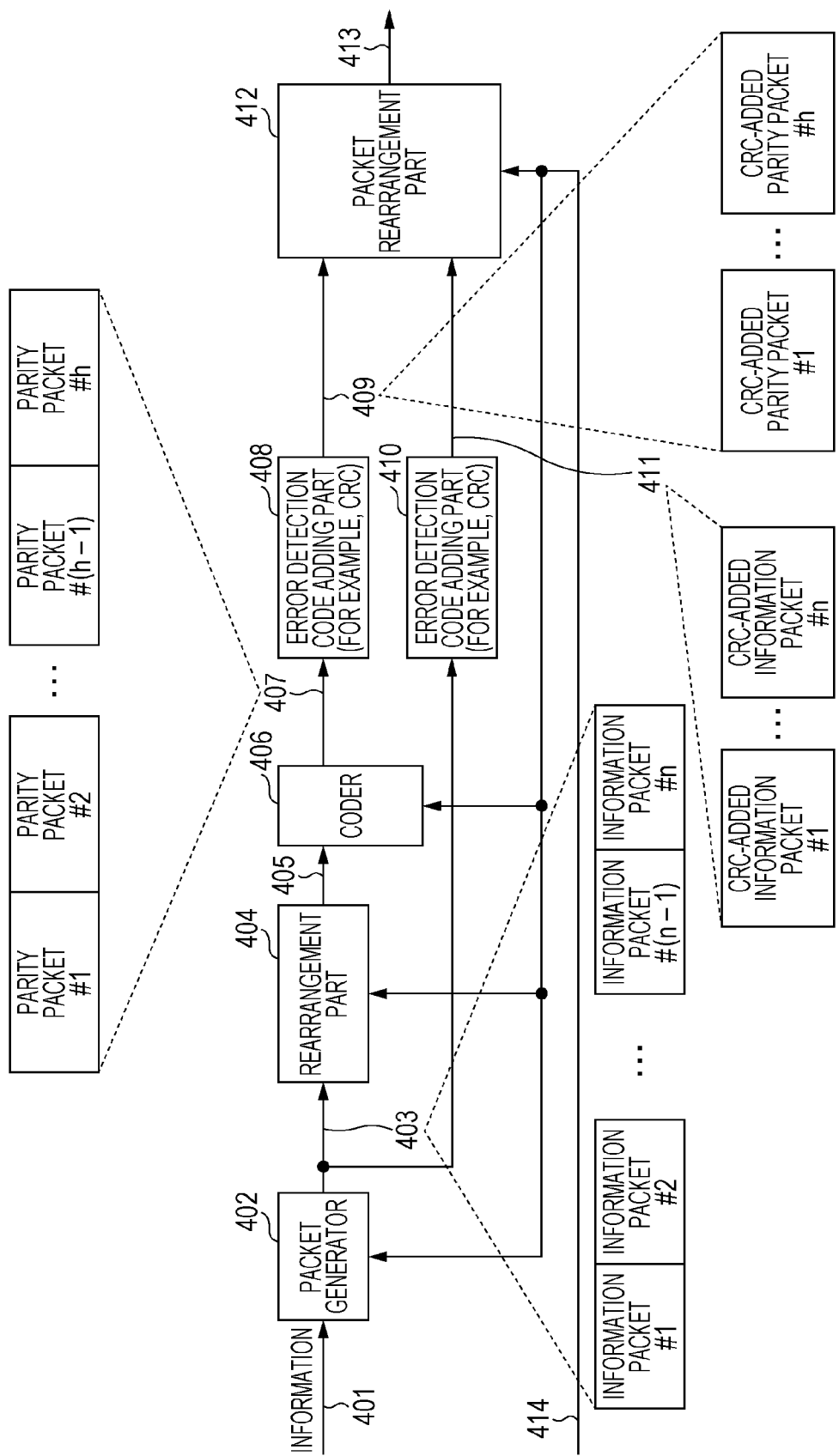
FIG. 4 illustrates a configuration example of a portion associated with an error correction coding method of the transmission device.

FIG. 4 illustrates a partial configuration of the transmission device associated with an error (erasure) correction coding method for restoring a packet or a frame when a packet or frame erasure is generated in transmission station 101. Hereinafter, the partial configuration is referred to as "packet-level error (erasure) correction coding". However, a way of calling of the partial configuration is not limited to the packet-level error (erasure) correction coding. The configuration in FIG. 4 is included in packet (or frame) processor 202 of FIG. 2 in transmission station 101.

Information 401 and control information signal 414 are input to packet generator 402, and packet generator 402 outputs information packet 403 based on information about a packet size (a number of bits constituting one packet), the information being included in control information signal 414. In FIG. 4, packet generator 402 generates information packet #1, information packet #2, . . . , information packet #(n−1), information packet #n (that is, information packet #k (k is an integer between 1 and n both inclusive (n is an integer of 2 or more))). For the deficient number of bits of the information used to generate information packets #1 to #n, packet generator 402 generates information packets #1 to #n by, for example, inserting known data (the information packet is constructed with the plurality of bits).

Information packet 403 and control information signal 414 are input to rearrangement part 404, and rearrangement part 404 rearranges information packet 403 based on information about a rearrangement method, the information being included in control information signal 414, and outputs rearranged data sequence 405.

Rearrangement part 404 does not necessarily perform the rearrangement. For example, information packets #1 to #n are input to rearrangement part 404, and rearrangement part 404 performs the rearrangement within a bit sequence constituting information packets #1 to #n.

Rearranged data sequence 405 and control information signal 414 are input to coder 406, and coder 406 codes rearranged data sequence 405 based on information about an error (erasure) correction coding scheme (such as information about an error (erasure) correction coding scheme to be used, a code length (block length), and a coding rate), the information about the error (erasure) correction coding scheme being included in control information signal 414, and outputs parity packet 407. In FIG. 4, coder 406 generates parity packet #1, parity packet #2, . . . , parity packet #(h−1), parity packet #h (that is, parity packet #k (k is an integer between 1 and h both inclusive (h is an integer of 1 or more))) (the parity packet is constructed with the plurality of bits).

Parity packet 407 is input to error detection code adding part 408, and error detection code adding part 408 adds, for example, CRC (Cyclic Redundancy Check) to detect an error packet by packet, and outputs CRC-added parity packet 409. Therefore, the reception device can determine whether all pieces of data in a packet are right or whether the packet is lost by the addition of the CRC.

Although the CRC is described by way of example in the first exemplary embodiment, error detection code adding part 410 may use any block code and any check code as long as whether all pieces of data in a packet are right or whether the packet is lost can be determined using the block code and the check code.

In FIG. 4, error detection code adding part 408 generates CRC-added parity packet #1, CRC-added parity packet #2, . . . , CRC-added parity packet #(h−1), CRC-added parity packet #h (CRC-added parity packet #k (k is an integer between 1 and h both inclusive (h is an integer of 1 or more))).

Similarly, information packet 403 is input to error detection code adding part 410, and error detection code adding part 410 adds, for example, the CRC to perform error detection packet by packet, and outputs CRC-added information packet 411. Therefore, the reception device can determine whether all pieces of data in a packet are right or whether the packet is lost by the addition of the CRC.

Although the CRC is described by way of example in the first exemplary embodiment, error detection code adding part 410 may use any block code and any check code as long as whether all pieces of data in a packet are right or whether the packet is lost can be determined using the block code and the check code.

In FIG. 4, error detection code adding part 410 generates CRC-added information packet #1, CRC-added information packet #2, . . . , CRC-added information packet #(n−1), CRC-added information packet #n (that is, CRC-added information packet #k (k is an integer between 1 and n both inclusive (n is an integer of 2 or more))).

CRC-added parity packet 409 and CRC-added information packet 411 are input to packet rearrangement part 412, and packet rearrangement part 412 rearranges the packet, and outputs rearranged packet 413.

Information 401 in FIG. 4 may include, but not limited to, control information (such as information about an information type and information (a frame rate, a compression ratio, and a compression method) about a video coding scheme).

Figure 5:
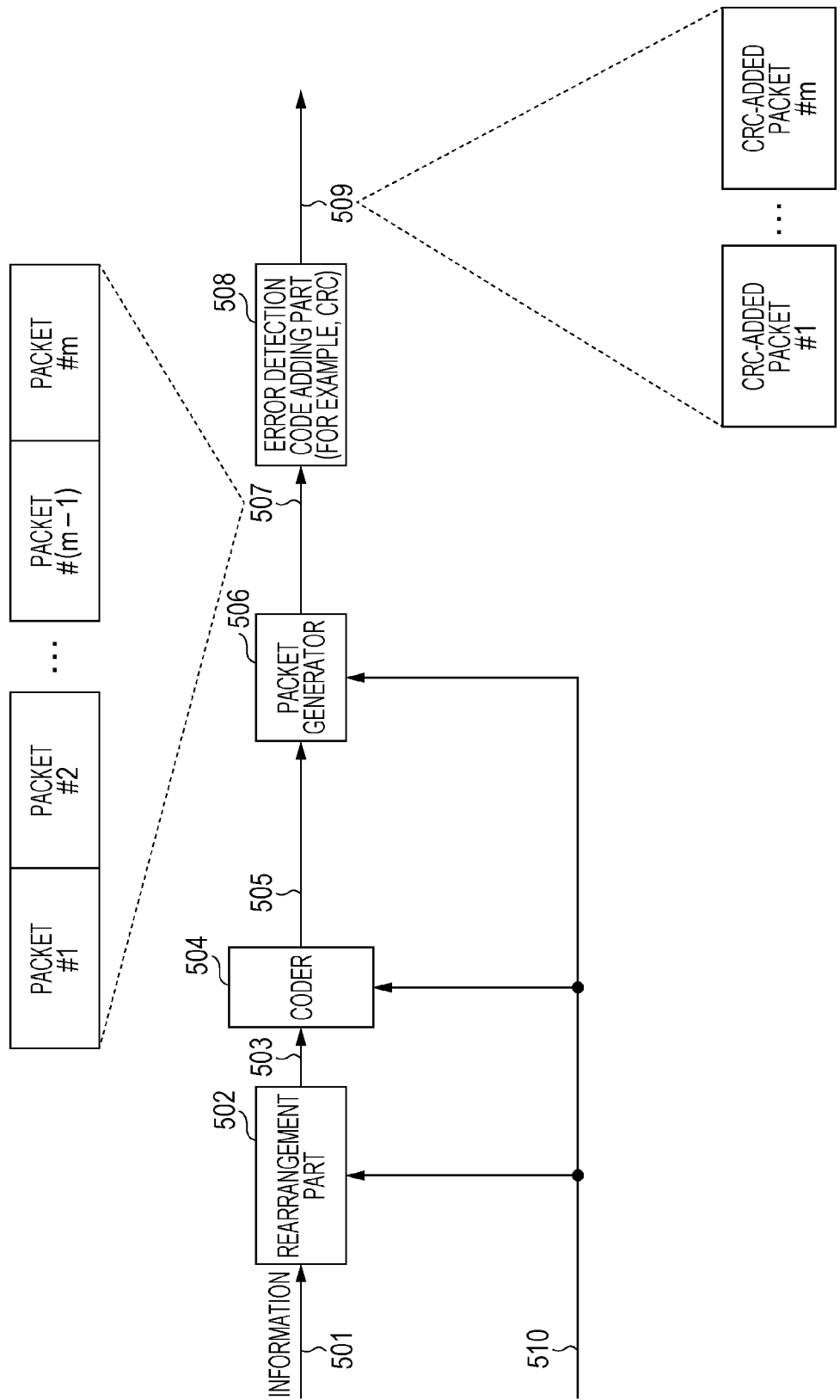
FIG. 5 illustrates a configuration example of a portion associated with the error correction coding method of the transmission device.

FIG. 5 illustrates a partial configuration of the transmission device associated with an error (erasure) correction coding method for restoring the packet or the frame when the packet or frame loss is generated in transmission station 101, the error (erasure) correction coding method being different from that in FIG. 4. In the transmission device of FIG. 2, the configuration in FIG. 5 is included in packet (or frame) processor 202.

Information 501 and control information signal 510 are input to rearrangement part 502, and rearrangement part 502 rearranges the data of information 501 based on information about a rearrangement method, the information being included in control information signal 510, and outputs rearranged information 503.

Rearranged information 503 and control information signal 510 are input to coder 504, and coder 504 codes rearranged information 503 based on information about an error (erasure) correction coding scheme (such as information about an error (erasure) correction coding scheme to be used, a code length (block length), and a coding rate), the information being included in control information signal 510, and outputs coded data 505. In this case, the code used in the coding may be either a systematic code (a code in which an information sequence is directly included in a codeword) or a nonsystematic code.

Coded data 505 and control information signal 510 are input to packet generator 506, and packet generator 506 packetizes coded data 505 based on information about the packet size (the number of bits constituting one packet), the information being included in control information 503, and outputs packet 507. In the example of FIG. 5, packet generator 506 generates packet #1, packet #2, . . . , packet #(m−1), information packet #m (that is, packet #k (k is an integer between 1 and m both inclusive (m is an integer of 2 or more))). For the deficient number of bits of the information used to generate information packets #1 to #m, coder 504 performs the coding by, for example, inserting known data.

Packet 507 is input to error detection code adding part 508, and error detection code adding part 508 adds, for example, the CRC to perform the error detection packet by packet, and outputs CRC-added packet 509. Therefore, the reception device can determine whether all pieces of data in a packet are right or whether the packet is lost by the addition of the CRC.

Although the CRC is described by way of example in the first exemplary embodiment, error detection code adding part 508 may use any block code and any check code as long as whether all pieces of data in a packet are right or whether the packet is lost can be determined using the block code and the check code.

In FIG. 5, error detection code adding part 508 generates CRC-added packet #1, CRC-added packet #2, . . . , CRC-added packet #(m−1), CRC-added packet #m (CRC-added packet #k (k is an integer between 1 and m both inclusive (m is an integer of 2 or more))).

Information 501 in FIG. 5 may include, but not limited to, control information (such as information about an information type and information (a frame rate, a compression ratio, and a compression method) about a video coding scheme).

(Packet Configuration Method)

An example of the packet configuration method will be described below.

Figure 6:
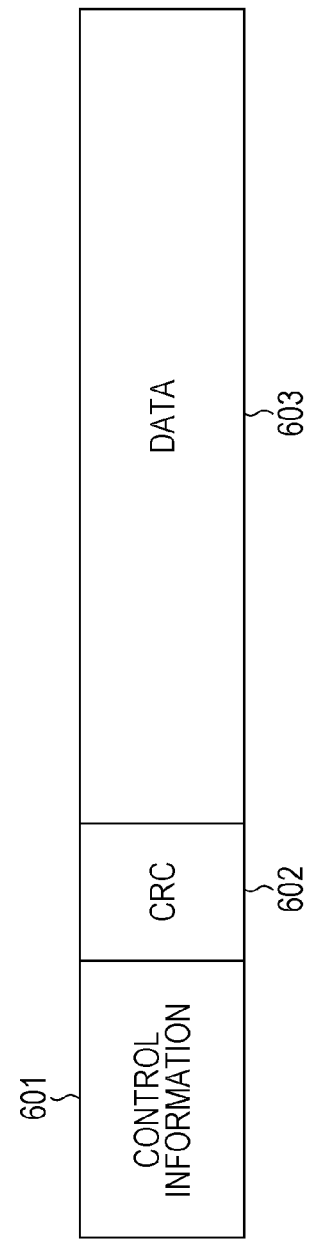
FIG. 6 illustrates an example of a packet configuration.

FIG. 6 illustrates an example of the packet configuration method. CRC 602 is used to detect an error.

Data 603 is obtained by packet-level coding.

For example, control information 601 is one added to the packet as illustrated below.

"Information about the number of packets obtained using the error (erasure) correction code":

Referring to FIG. 4, the number of information packets is n and the number of parity packets is h, and therefore the information is "n+h". Referring to FIG. 5, the information about the number of packets obtained using the error (erasure) correction code is "m".

"Information about packet ID (identification) (identifier)":

Referring to FIG. 4, the number of packets obtained using the error (erasure) correction code is "n+h". Accordingly, one of numbers "0" to "n+h−1" is given as the ID (identification) (identifier) to each packet.

In FIG. 4, one of IDs "0" to "n+h−1" is given to each of n information packets and h parity packets. Referring to FIG. 5, the number of packets obtained by the error (erasure) correction code is "m". Accordingly, one of numbers of the identifiers "0" to "m−1" is given to each packet.

In FIG. 5, one of IDs "0" to "m−1" is given to each of m packets.

"Information about the number of packets obtained using the error (erasure) correction code" and control information except for "packet ID (identification) (identifier)":

For example, in the case that the information about the packet-level error (erasure) correction coding scheme and the packet length are variable, the control information is the number of bits (or bytes) of the packet length.

However, the control information is not limited to the above configuration. The above configuration is described only by way of example. Accordingly, suitable information is added to the control information according to the system (it is conceivable that the control information has a configuration in which the above information such as the number of bits (or bytes) of the packet length is not added).

FIG. 7 illustrates an example of a frame configuration. The control information may be added in units of packets. In FIG. 7, to packet #1(701_1), packet #2(701_2), packet #3(701_3), . . . , packet #m−1(701_m−1), packet #m(701_m), namely, m packets 701, one piece of control information 700 is added.

Control information 700 in FIG. 7 may be some pieces of information embedded in the control information in FIG. 6. Control information 700 may include other pieces of control information.

Transmission station 101 may transmit the data to the terminal by a combination of both the packet configuration in FIG. 6 and the frame configuration in FIG. 7, transmit the data to the terminal using the packet configuration in FIG. 6 (the frame configuration in FIG. 7 is not adopted), or transmit the data to the terminal using the frame configuration in FIG. 7 (the packet configuration in FIG. 6 is not adopted).

In order to adopt the packet configuration in FIG. 6 and the frame configuration in FIG. 7, for example, transmission station may add a control information adding part to preceding or subsequent stages of error detection code adding parts 408, 508 of packet (or frame) processor 202 in FIGS. 4 and 5. In the transmission station in FIG. 8A, control information adding part 802 is disposed at the preceding stage of error detection code adding part 804.

Data 801 and control information 899 are input to control information adding part 802, and control information adding part 802 outputs to data 803 in which the control information is added to data 801. Error detection adding part 804 outputs data 805 in which the error detection code is added to data 803.

Figure 8A:
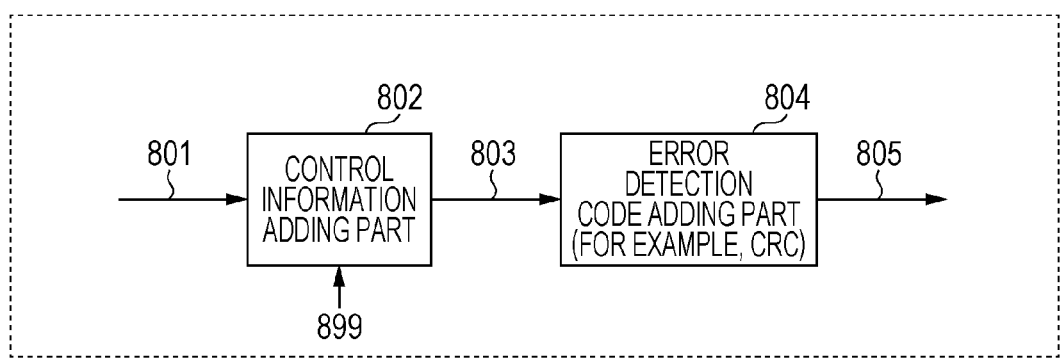
FIG. 8A illustrates configuration examples of an error detection code adding part and a control information adding part.
Figure 8B:
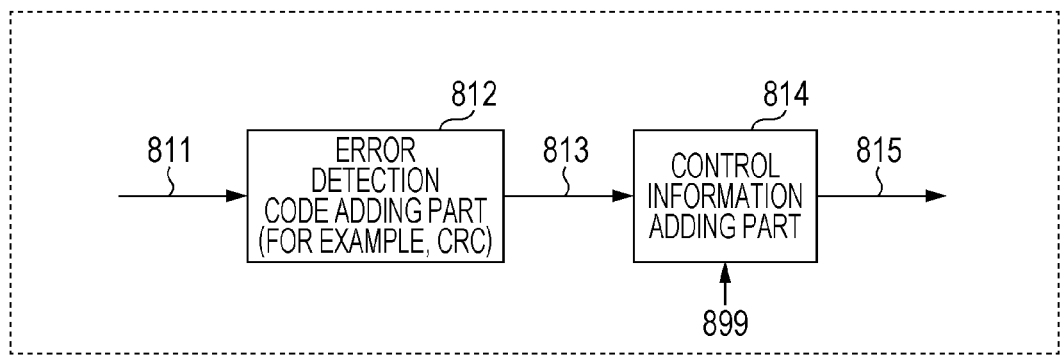
FIG. 8B illustrates configuration examples of an error detection code adding part and a control information adding part.

In transmission station 101 in FIG. 8B, control information adding part 814 is disposed at the subsequent stage of error detection code adding part 812.

Data 811 is input to error detection code adding part 812, and error detection code adding part 812 adds the error detection code to data 811, and outputs data 813 to which the error detection code is added. Data 813 and control information 899 are input to control information adding part 814, and control information adding part 814 adds the control information to data 813, and outputs data 815 to which the control information is added.

Unlike FIGS. 8A and 8B, in transmission station 101, the control information adding part may be disposed at both the preceding and subsequent stages of error detection code adding part 804.

Therefore, transmission station 101 can generate the packet configuration in FIG. 6 and the frame configuration in FIG. 7.

FIG. 9 illustrates an example of a frame configuration of a modulation signal transmitted from the transmission device of transmission station 101 in FIG. 1. In FIG. 9, a horizontal axis indicates time and a vertical axis indicates a frequency. Control information symbol 901 is one used to transmit the transmission method, the information about the error correction code, and the control information demodulating a data symbol such as a modulation scheme (control information symbol 901 may include information about the error (erasure) correction code used at a packet level).

For example, pilot symbol 902 is a PSK (Phase Shift Keying) symbol, and can be used in signal detection, channel estimation, and estimation of a frequency offset in the reception device. Data symbol 903 is used to transmit the data.

The basic operation of the transmission device and reception device are described above. The operation of packet (or frame) processor 315 of the reception device in the first exemplary embodiment will be described below. In the first exemplary embodiment, the error (erasure) correction code used at the packet level is a systematic code (a code in which the information sequence is directly included in the codeword). The information is input to the coder, and the coder obtains the parity by performing the coding. Packet (or frame) processor 202 generates an information packet constituting the packet using the information, and generates a parity packet constituting the packet using the parity (however, as described above, sometimes the information packet includes the error detection code or the control information, and sometimes the parity packet includes the error detection code or the control information. FIG. 4 is a configuration diagram illustrating packet (or frame) processor 202 that performs the coding).

(Operation of Packet (or Frame) Processor in FIG. 3)

Figure 10:
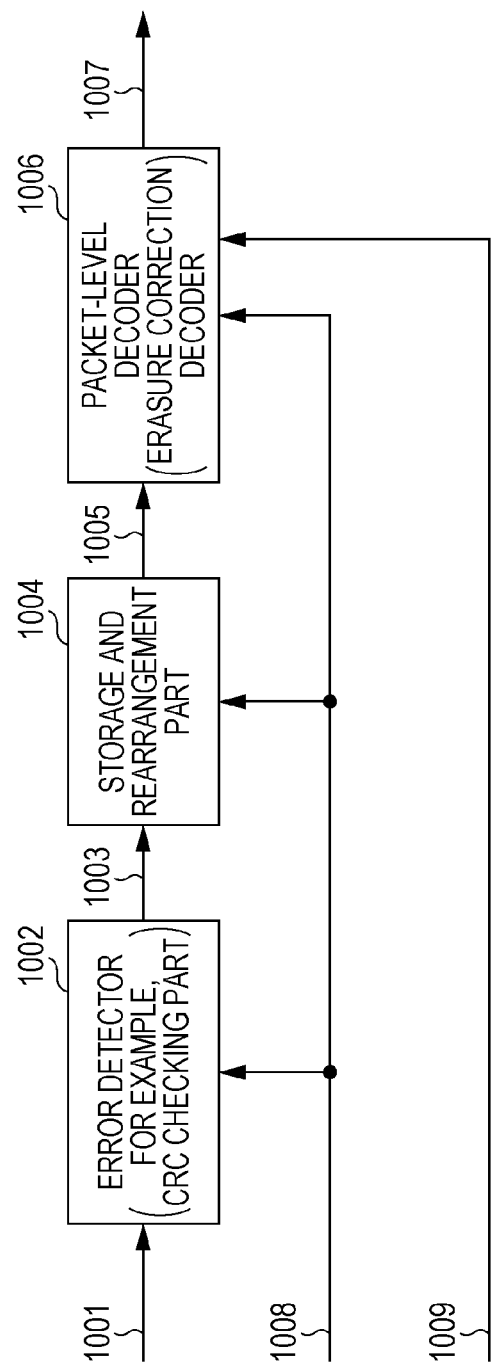
FIG. 10 illustrates a configuration example of a packet (or frame) processor.

FIG. 10 illustrates a configuration example of packet (or frame) processor 315 in FIG. 3. Received data 1001 (corresponding to received data 314) and control information signal 1008 (corresponding to control information signal 310) are input to error detector 1002, and error detector 1002 performs the error detection on received data 1001 based on the information about control information signal 1008. Although not illustrated in FIG. 10, packet (or frame) processor 315 generates state information 317 about data 1007 at the subsequent stage of packet-level decoder (erasure correction decoder) 1006. Operation of packet (or frame) processor 315 will be described with reference to FIG. 11.

Figure 11:
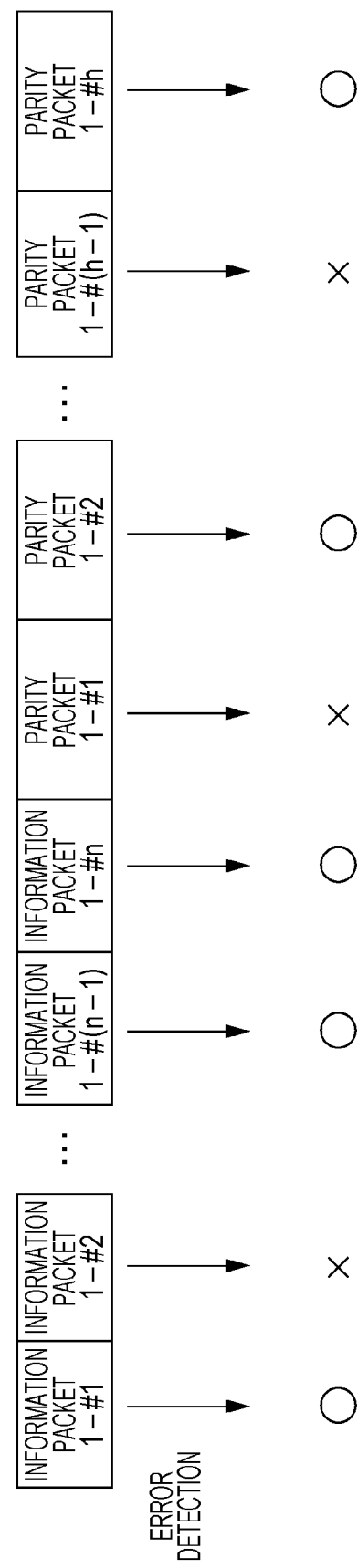
FIG. 11 illustrates error detection operation.

For example, FIG. 11 illustrates a configuration of received data 1001 input to error detector 1002.

In FIG. 11, "information packet 1-#1" is first-block information packet #1.

Similarly, "information packet 1-#2" is first-block information packet #2.

Accordingly, "information packet 1-#i" is first-block information packet #i (i is an integer between 1 and n both inclusive).

"Parity packet 1-#1" is first-block parity packet #1.

Similarly, "parity packet 1-#2" is first-block parity packet #2.

Accordingly, "parity packet 1-#j" is first-block parity packet #j. Note that, j is an integer between 1 and h both inclusive. The coding method is already described with reference to FIG. 4.

At this point, coder 406 obtains the parity by performing block coding on "information packet 1-#1", "information packet 1-#2", . . . , "information packet 1-#(n−1)", "information packet 1-#n", and obtains "parity packet 1-#1", "parity packet 1-#2", . . . , "parity packet 1-#(h−1)", "parity packet 1-#h" from the obtained parity. Therefore, coder 406 obtains the parity by performing the block coding on "information packet k-#1", "information packet k-#2", . . . , "information packet k-#(n−1)", "information packet k-#n", and obtains "parity packet k-#1", "parity packet k-#2", . . . , "parity packet k-#(h−1)", "parity packet k-#h" from the obtained parity (k is an integer).

FIG. 11 illustrates an example of a state in which error detector 1002 performs the error detection. By way of example, one block has n information packets and h parity packets (n is an integer of 1 or more, and h is an integer of 1 or more).

Error detector 1002 determines that the data of "information packet 1-#1" has no error because "information packet 1-#1" has an error detection result of "○". Accordingly, the data of "information packet 1-#1" is determined to be correct.

Error detector 1002 determines that the data of "information packet 1-#2" has an error because "information packet 1-#2" has an error detection result of "x". Accordingly, in the data of "information packet 1-#2", a portion determined to be incorrect is set to indefinite data.

Error detector 1002 determines that the data of "information packet 1-#(n−1)" has no error because "information packet 1-#(n−1)" has the error detection result of "○". Accordingly, the data of "information packet 1-#(n−1)" is determined to be correct.

Error detector 1002 determines that the data of "information packet 1-#n" has no error because "information packet 1-#n" has the error detection result of "○". Accordingly, the data of "information packet 1-#n" is determined to be correct.

Error detector 1002 determines that the data of "parity packet 1-#1" has an error because "parity packet 1-#1" has the error detection result of "x". Accordingly, in the data of "parity packet 1-#1", a portion determined to be incorrect is set to indefinite data.

Error detector 1002 determines that the data of "parity packet 1-#2" has no error because "parity packet 1-#2" has the error detection result of "○". Accordingly, the data of "parity packet 1-#2" is determined to be correct.

Error detector 1002 determines that the data of "parity packet 1-#(h−1)" has an error because "parity packet 1-#(h−1)" has the error detection result of "x". Accordingly, in the data of "parity packet 1-#(h−1)", a portion determined to be incorrect is set to indefinite data.

Error detector 1002 determines that the data of "parity packet 1-#h" has no error because "parity packet 1-#h" has the error detection result of "○". Accordingly, the data of "parity packet 1-#h" is determined to be correct.

Error detector 1002 may detect whether an error exists in the whole packet data. Alternatively, error detector 1002 may divide the packet data into some pieces, generate a data group of group &1, a data group of group &2, . . . , and detect an error in each data group. At this point, error detector 1002 sets the data of the data group in which the error is detected to an indefinite data.

Similarly, error detector 1002 performs the error detection on "information packet k-#1", "information packet k-#2", . . . , "information packet k-#(n−1)", "information packet k-#n" and "parity packet k-#1", "parity packet k-#2", . . . , "parity packet k-#(h−1)", "parity packet k-#h" in a kth block.

Error detector 1002 in FIG. 10 outputs each post-error-detection packet (post-error-detection packet 1003).

Post-error-detection packet 1003 and control information signal 1008 are input to storage and rearrangement part 1004, and storage and rearrangement part 1004 stores post-error-detection packet 1003 based on control information signal 1008, performs the rearrangement, and outputs rearranged data 1005.

For example, after the error detection, "information packet k-#1", "information packet k-#2", . . . , "information packet k-#(n−1)", "information packet k-#n" and "parity packet k-#1", "parity packet k-#2", . . . , "parity packet k-#(h−1)", "parity packet k-#h" in the kth block are input to storage and rearrangement part 1004, and storage and rearrangement part 1004 performs the rearrangement, and outputs data of the kth block.

Rearranged data 1005, control information signal 1008, and control signal 1009 (corresponding to control signal 322 in FIG. 3) are input to packet-level decoder (erasure correction decoder) 1006, and packet-level decoder (erasure correction decoder) 1006 performs the error correction (erasure correction) on rearranged data 1005 based on control information signal 1008 and control signal 1009, and outputs data 1007 (corresponding to data 316 in FIG. 3).

For example, after the error detection, "information packet k-#1", "information packet k-#2", . . . , "information packet k-#(n−1)", "information packet k-#n" and "parity packet k-#1", "parity packet k-#2", . . . , "parity packet k-#(h−1)", "parity packet k-#h" in the kth block are input to packet-level decoder (erasure correction decoder) 1006, and packet-level decoder (erasure correction decoder) 1006 performs the error correction (erasure correction), and outputs data 1007.

(Decoding)

Although an outline of the operation is described above, details of packet-level decoder 1006 will be described below.

Figure 12:
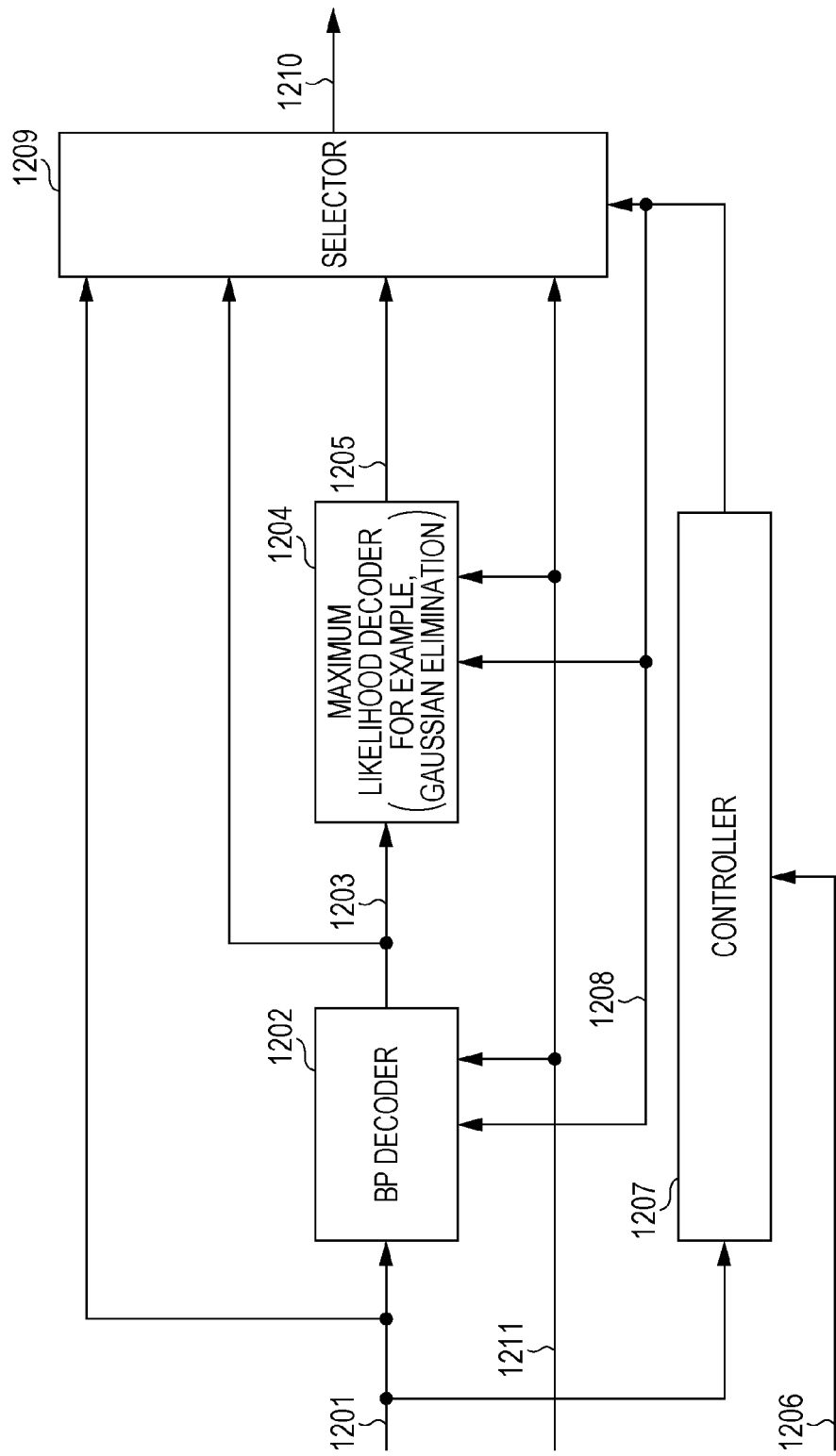
FIG. 12 illustrates a configuration example of a packet-level decoder.

FIG. 12 illustrates an example of the detailed configuration of packet-level decoder 1006. Packet-level decoder 1006 performs BP (Belief Propagation) decoding and/or maximum likelihood decoding in the packet-level decoding. Hereinafter, an outline of the sum-product decoding will be described as an example of the BP decoding, and an outline of the Gaussian elimination (Gaussian elimination) will be described as an example of the maximum likelihood decoding.

<Sum-Product Decoding>

In the present disclosure, for example, the LDPC (Low Density Parity Check) code (for example, an LDPC block code) is used as a packet-level error (erasure) correction code. In the LDPC code, a parity check matrix is used to restore a two-dimensional (M×N) matrix H={Hmn} (M rows and N columns). Subsets A(m), B(n) of a set [1,N]={1, 2, . . . , N} are defined as follows.

[Equation 1]

$$A(m) \equiv \{n : H_{mn} = 1\} \quad (1)$$

[Equation 2]

$$B(n) \equiv \{m : H_{mn} = 1\} \quad (2)$$

Where A(m) is a set of a column index of 1 in an mth row of parity check matrix H, and B(n) is a set of a column index of 1 in an nth row of parity check matrix H. For example, packet-level decoder 1006 uses logarithm likelihood ratio λn of each bit included in received data 314 calculated with physical layer error correction decoder 313 (n is an integer between 1 and N both inclusive). At this point, an algorithm of the sum-product decoding is as follows.

Step A•1 (initialization): Packet-level decoder 1006 sets logarithm likelihood ratio βmn included in received data 314 calculated with physical layer error correction decoder 313 to λn with respect to all sets (m,n) satisfying Hmn=1. Loop variable (the number of iteration) Isum is set to 1, and the maximum number of loop times is set to Isum,max.

Step A•2 (row processing): Using the following update equation, packet-level decoder 1006 updates logarithm likelihood ratio Σmn in the ascending order of m=1, 2, ..., M with respect to all sets (m,n) satisfying Hmn=1.

[Equation 3]

$$\tau_{mn} = \prod_{n' \in A(m)\setminus n} \tanh(z_{mn'}/2) \quad (3)$$

[Equation 4]

$$\varepsilon_{mn} = \log\frac{1+\tau_{mn}}{1-\tau_{mn}} \quad (4)$$

Step A•3 (column processing): Using the following update equation, packet-level decoder 1006 updates logarithm likelihood ratio zmn in the ascending order of n=1, 2, ..., N with respect to all sets (m,n) satisfying Hmn=1.

[Equation 5]

$$z_{mn} = \lambda_n + \sum_{m' \in B(n)\setminus m} \varepsilon_{m'n} \quad (5)$$

Step A•4 (calculation of logarithm likelihood ratio): Packet-level decoder 1006 gives logarithm likelihood ratio Ln with respect to n□[1,N], and makes the following determination.

[Equation 6]

$$L_n = \lambda_n + \sum_{m' \in B(n)} \varepsilon_{m'n} \quad (6)$$

"0" for Ln≥0, and "1" for L n<0.

Step A•5 (counting of the number of iteration): Packet-level decoder 1006 increments Isum for Isum<Isum,max, and returns to Step A•2. For Isum=Isum,max, packet-level decoder 1006 ends the current sum-product decoding.

In the erasure correction decoding,

<1> logarithm likelihood ratio λn=+∞ is given (actually, a positive real number is given) in the case that 0 is given as the bit, <2> logarithm likelihood ratio λn=−∞ is given (actually, a negative real number is given) in the case that 1 is given as the bit, and <3> logarithm likelihood ratio λn=0 is given and the erasure correction decoding is performed using the above algorithm in the case that the bit is an indefinite, namely, in the case that the bit is erased.

<Maximum Likelihood Decoding>

The case that each bit is yn during the reception will be described (n is an integer between 1 and N both inclusive (N is an integer of 2 or more)). Where yn is one of 0, 1, and indefinite. At this point, in the case that the parity check matrix is H (M rows and N columns) for reception word y=(y1, y2, y3, ..., yn−1, yn), HyT=0 holds (where "0" is a vector (zero vector) constructed with an element of 0) (yT is an inverse vector of y).

When an erasure position is vector I=(i1, i2, ip−1, ip), and when parity check matrix H has an ith column vector hi, the following equation holds.

[Equation 7]

$$(h_{i1} \; h_{i2} \; \ldots \; h_{ip-1} \; h_{ip}) \begin{pmatrix} e_{i1} \\ e_{i2} \\ \vdots \\ e_{ip-1} \\ e_{ip} \end{pmatrix}_n = S \quad (7)$$

At this point, S is given as follows.

[Equation 8]

$$S = \sum_{j \in [1,n]\setminus I} y_j h_j \quad (8)$$

Packet-level decoder 1006 can perform the maximum likelihood decoding by solving simultaneous equations of Equation (7).

There are some algorithms for solving the simultaneous equations, and the Gaussian elimination will be described below by way of example.

In the Gaussian elimination, forward elimination and backward substitution are performed. The forward elimination and the backward substitution will be described below.

Simultaneous linear equations are generally given as follows.

[Equation 9]

$$\begin{pmatrix} a_{11} & a_{12} & \ldots & a_{1n} \\ a_{21} & a_{22} & a_{23} & a_{2n} \\ \vdots & \vdots & \ddots & \vdots \\ a_{n1} & a_{n2} & \cdots & a_{nn} \end{pmatrix} \begin{pmatrix} x_1 \\ x_2 \\ \vdots \\ x_n \end{pmatrix} = \begin{pmatrix} b_1 \\ b_2 \\ \vdots \\ b_n \end{pmatrix} \quad (9)$$

At this point, packet-level decoder 1006 obtains (x1, x2, ..., xn) using the simultaneous linear equations. Packet-level decoder 1006 can obtain the following equation by applying row operation to Equation (9) (forward elimination).

[Equation 10]

$$\begin{pmatrix} a'_{11} & a'_{12} & \ldots & a'_{1n} \\ 0 & a'_{22} & a'_{23} & a'_{2n} \\ \vdots & \vdots & \ddots & \vdots \\ 0 & 0 & \ldots & a'_{nn} \end{pmatrix} \begin{pmatrix} x_1 \\ x_2 \\ \vdots \\ x_n \end{pmatrix} = \begin{pmatrix} b'_1 \\ b'_2 \\ \vdots \\ b'_n \end{pmatrix} \quad (10)$$

Packet-level decoder 1006 obtains xn from the last row of Equation (9), and can obtain xn−1 from the obtained xn. Packet-level decoder 1006 can obtain xn−2, ..., x2, x1 by performing the similar operation. This is given by the following equation (backward substitution).

[Equation 11]

$$x_i = \frac{1}{a_{ii}}\left(b_i - \sum_{j=i+1}^{n} a_{ij}x_j\right) \quad (11)$$

Packet-level decoder 1006 can perform the maximum likelihood decoding by solving Equation (7) using the Gaussian elimination.

(Decoding Method of the Present Disclosure)

A characteristic in which the maximum likelihood decoding is adopted is superior to a characteristic in which the BP decoding is adopted in the error (erasure) correction capacity. On the other hand, the BP decoding is smaller than the maximum likelihood decoding in a calculation scale. For these reasons, desirably the decoding method has the high error (erasure) correction capacity and the small calculation scale.

NPL 1 discloses the decoding method in which the BP decoding and the Gaussian elimination are combined with each other. The outline is described above. The present disclosure proposes a decoding method in which the calculation scale is further reduced. The decoding method in which the calculation scale is further reduced will be described below.

The decoding method in which the BP decoding and the Gaussian elimination are combined with each other will supplementally be described with reference to FIG. 12.

For the LDPC code defined by M×N (M rows and N columns (M is an integer of 1 or more, and N is an integer of 2 or more)) parity check matrix H, the codeword (coding sequence) obtained after the coding is $x=(x1, x2, \ldots, xN-1, xN)$ (in xi, i is an integer between 1 and N both inclusive). The reception word (received sequence) is $y=(y1, y2, \ldots, yN-1, yN)$ (corresponding to data 1201 in FIG. 12 (corresponding to rearranged data 1005 in FIG. 10)). In yi, i is an integer between 1 and N both inclusive, and yi is one of "0", "1", and "indefinite (erasure)".

In the decoding method in which the BP decoding and the maximum likelihood decoding are combined with each other, reception word (received sequence) $y=(y1, y2, \ldots, yN-1, yN)$ is input to BP decoder 1202, and BP decoder 1202 performs the above-mentioned sum-product decoding using parity check matrix H (BP decoder 1202 in FIG. 12), and obtains post-BP-decoding received sequence $z=(z1, z2, \ldots, zN-1, zN)$ (post-BP-decoding received sequence 1203 in FIG. 12). In zi, i is an integer between 1 and N both inclusive, and zi is one of "0", "1", and "indefinite (it cannot be restored by the BP decoding)".

Then, post-BP-decoding received sequence $z=(z1, z2, zN-1, zN)$ is input to maximum likelihood decoder 1204, and maximum likelihood decoder 1204 generates an equation corresponding to Equation (7) using parity check matrix H and $z=(z1, z2, zN-1, zN)$, solves the simultaneous equations by, for example, the Gaussian elimination, and obtains post-maximum-likelihood-decoding received sequence $q=(q1, q2, qN-1, qN)$ (corresponding to post-maximum-likelihood-decoding received sequence 1205 in FIG. 12). In qi, i is an integer between 1 and N both inclusive, and qi is one of "0", "1", and "indefinite".

A detailed operation example of packet-level decoder 1006 in FIG. 10 will be described below with reference to FIG. 12.

Based on data 1201, control signal 1206 (corresponding to control signal 322 in FIG. 3), and an error state of the data, controller 1207 outputs operation control signal 1208 to control the operation of each part (BP decoder 1202, maximum likelihood decoder 1204, and selector 1209). An operation control method will be described in detail later.

Data 1201, operation control signal 1208, and control information signal 1211 are input to BP decoder 1202, and BP decoder 1202 determines whether the BP decoding is performed on data 1201 based on operation control signal 1208 and control information signal 1211. BP decoder 1202 outputs post-BP-decoding received sequence 1203 when the BP decoding is performed. A method for determining whether the BP decoding is performed will be described in detail later.

Maximum likelihood decoder 1204 determines whether the maximum likelihood decoding is performed on post-BP-decoding received sequence 1203 based on operation control signal 1208 and control information signal 1211. When the maximum likelihood decoding is performed, maximum likelihood decoder 1204 performs the decoding operation on post-BP-decoding received sequence 1203 and outputs post-maximum-likelihood-decoding received sequence 1205. A method for determining whether the maximum likelihood decoding is performed will be described in detail later.

Control information signal 1208 is input to both BP decoder 1202 and maximum likelihood decoder 1204, and BP decoder 1202 and maximum likelihood decoder 1204 perform the decoding based on information (such as the code length and the coding rate) about the packet-level error (erasure) correction code included in control information signal 1211. In the case that data 1201 is not subjected to the error (erasure) correction coding at the packet level, packet-level decoder 1006 does not perform the error (erasure) correction decoding.

Data 1201, post-BP-decoding received sequence 1203, post-maximum-likelihood-decoding received sequence 1205, operation control signal 1208, and control information signal 1211 are input to selector 1209, and selector 1209 selects one of data 1201, post-BP-decoding received sequence 1203, and post-maximum-likelihood-decoding received sequence 1205 based on operation control signal 1208 and control information signal 1211, and outputs selected data 1210. As described above, in FIG. 12, because the systematic code is dealt with as the packet-level error (erasure) correction code, selected data 1210 may include the data associated with the information.

An example of detailed operation of packet-level decoder 1006 in FIG. 12 will further be described below with reference to FIG. 13.

Figure 13:
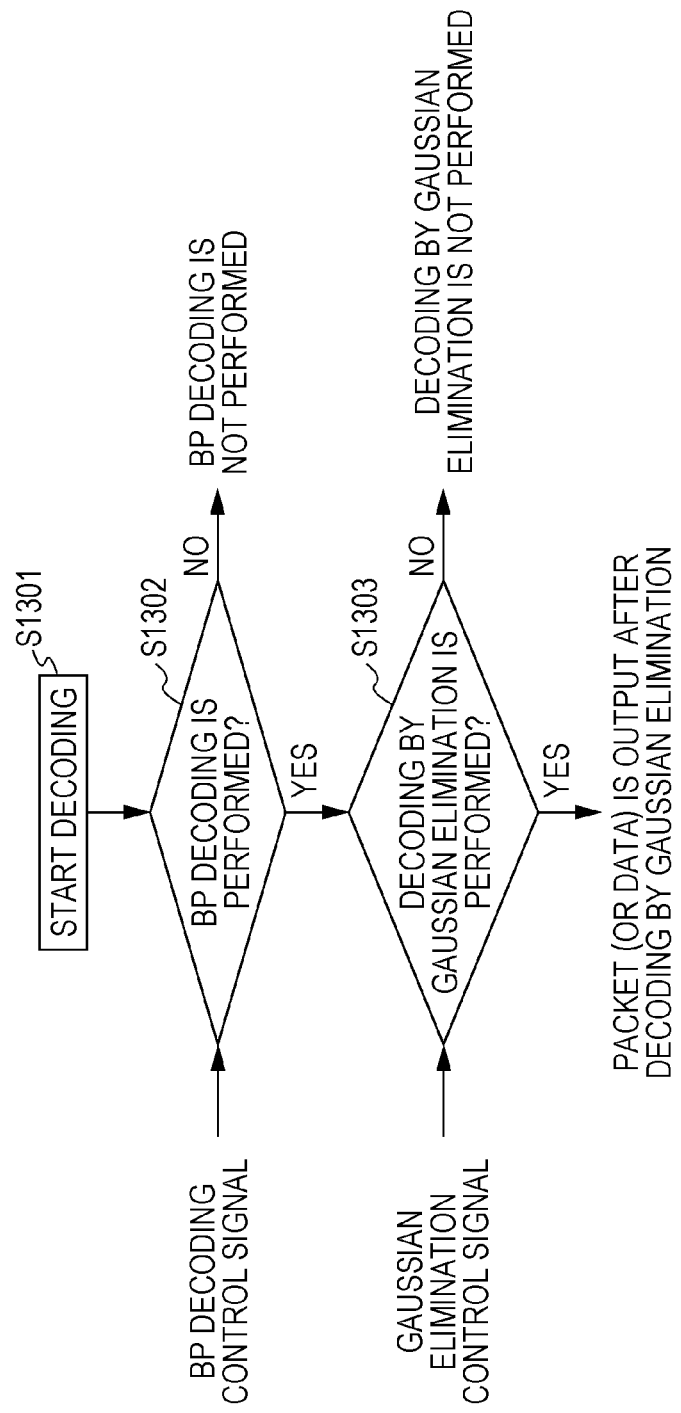
FIG. 13 is a flowchart illustrating an example of basic operation of the packet-level decoder.

FIG. 13 is a flowchart illustrating basic operation of packet-level decoder 1006 in the first exemplary embodiment. For example, controller 1207 in FIG. 12 makes a determination of the flowchart. For example, a determination procedure is as follows.

(Step 1: S1301) Controller 1207 issues an instruction of "decoding start" to each part (for example, control information signal 1206 makes the determination of "decoding start").

(Step 2: S1302) Controller 1207 determines "whether the BP decoding is performed" based on a BP decoding control signal (the BP decoding control signal is included in control signal 1206 and control information signal 1211). When the BP decoding is not performed, selector 1209 selects data 1201, and outputs data 1201 as a selected data (NO in S1302). When the BP decoding is performed, BP decoder 1202 performs the BP decoding on data 1201, and outputs post-BP-decoding received sequence 1203 as the selected data (YES in S1302).

(Step 3: S1303) Controller 1207 determines "whether the decoding is performed by the Gaussian elimination" based on a Gaussian elimination control signal (maximum likelihood decoding control signal) (the Gaussian elimination control signal is included in control signal 1206 and control information signal 1211. The determination "whether the decoding is performed by the Gaussian elimination" is made on the assumption that the BP decoding is performed) (YES in S1303).

When the decoding is not performed by the Gaussian elimination, selector 1209 outputs data 1201 or post-BP-decoding received sequence 1203 (NO in S1303).

When the decoding is performed by the Gaussian elimination, maximum likelihood decoder 1204 decodes post-BP-decoding received sequence 1203 by, for example, the Gaussian elimination, and outputs post-maximum-likelihood-decoding received sequence 1205 (YES in S1303).

Packet-level decoder 1006 performs the basic decoding processing as described above. Selector 1209 in FIG. 12 selects the output data based on control signal 1206 and control information signal 1211.

Control information signal 1211 includes information indicating whether the packet-level error (erasure) correction coding is performed. Control information signal 1211 is input to selector 1209, and selector 1209 outputs data 1201 as selected data 1210 when control information signal 1211 indicates that "the packet-level error (erasure) correction coding is not performed" (NO in S1302).

Another example of the detailed operation of packet-level decoder 1006 in FIG. 12 will be described below with reference to FIG. 14.

Figure 14:
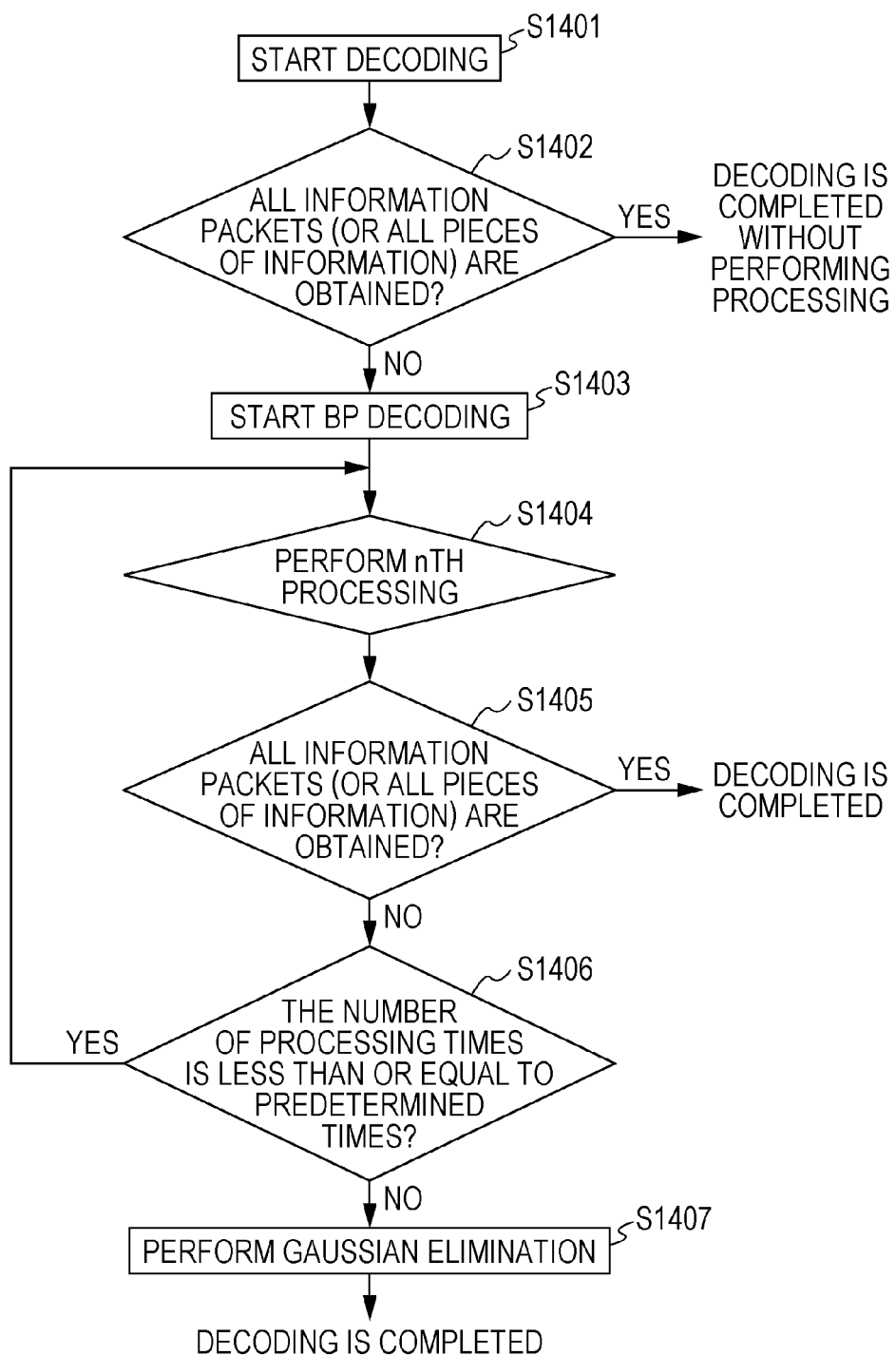
FIG. 14 is a flowchart illustrating an operation example of the packet-level decoder.

FIG. 14 is a flowchart of packet-level decoder 1006 in the first exemplary embodiment. For example, controller 1207, BP decoder 1202, maximum likelihood decoder 1204, or selector 1209 in FIG. 12 makes the determination of the flowchart.

For example, packet-level decoder 1006 performs the following procedure (however, in the flowchart of FIG. 14, it is assumed that data 1201 is already subjected to the packet-level error (erasure) correction coding).

(Step 1: S1401) Controller 1207 issues the instruction of "decoding start" to each part (BP decoder 1202, maximum likelihood decoder 1204, and selector 1209) (for example, control information signal 1211 makes the determination of "decoding start").

(Step 2: S1402) For example, controller 1207 or BP decoder 1202 determines "whether all the information packets (or all the pieces of information) are obtained" (in the first exemplary embodiment, because of the assumption that the systematic code is used in the packet-level error (erasure) correction code, data 1201 includes the information packet or the information).

When all the information packets (or all the pieces of information) are obtained, BP decoder 1202 does not perform the error (erasure) correction decoding (YES in S1402). Accordingly, selector 1209 outputs the information extracted from data 1201 or data 1201 as selected data 1210.

When all the information packets (or all the pieces of information) are not obtained (NO in S1402), BP decoder 1202 starts the BP decoding (S1403).

Thus, when all the information packets (or all the pieces of information) are obtained (YES in S1402), packet-level decoder 1006 can reduce the calculation scale of the decoder (for example, BP decoder 1202 and maximum likelihood decoder 1204) by completing the decoding processing. Therefore, packet-level decoder 1006 can reduce the power consumption of the decoder.

(Step 3: S1404) BP decoder 1202 starts the counting of the number of iteration after starting the BP decoding. BP decoder 1202 sets a maximum value of the number of iteration to Nmax.

BP decoder 1202 checks whether the number of iteration n is smaller than Nmax (S1404). When the number of iteration n is smaller than Nmax, BP decoder 1202 performs the decoding processing.

BP decoder 1202 determines "whether all the information packets (or all the pieces of information) are obtained" with respect to the data obtained through the decoding processing (S1405).

When all the information packets (or all the pieces of information) are obtained, BP decoder 1202 completes the BP decoding, and outputs post-BP-decoding received sequence 1203. Selector 1209 outputs post-BP-decoding received sequence 1203 or information extracted from post-BP-decoding received sequence 1203 as selected data 1210 (YES in S1405).

When all the information packets (or all the pieces of information) are not obtained, BP decoder 1202 completes the nth iterative decoding (NO in S1405).

BP decoder 1202 checks whether the number of iteration n is smaller than Nmax (S1406). When the number of iteration n is smaller than Nmax, BP decoder 1202 performs (n+1)th decoding processing (YES in S1406).

When determining that the number of iteration n becomes Nmax, BP decoder 1202 completes the decoding processing at an Nmax-th iteration, and obtains the post-BP-decoding received sequence (NO in S1406).

Because BP decoder 1202 outputs post-BP-decoding received sequence 1203 in which all the information packets (or all the pieces of information) are not obtained, maximum likelihood decoder 1204 starts the decoding by the Gaussian elimination (S1407).

Thus, when BP decoder 1202 obtains all the information packets (or all the pieces of information), packet-level decoder 1006 can reduce the calculation scale of the decoder by completing the decoding processing, which allows the power consumption to be reduced in the decoder.

(Step 4: S1407) The post-BP-decoding received sequence is input to maximum likelihood decoder 1204, and maximum likelihood decoder 1204 performs the decoding on the post-BP-decoding received sequence by, for example, the Gaussian elimination, and outputs post-maximum-likelihood-decoding received sequence 1205.

Still another example which is different from that in FIG. 14, of the detailed operation of packet-level decoder 1006 will be described below with reference to FIG. 15.

Figure 15:
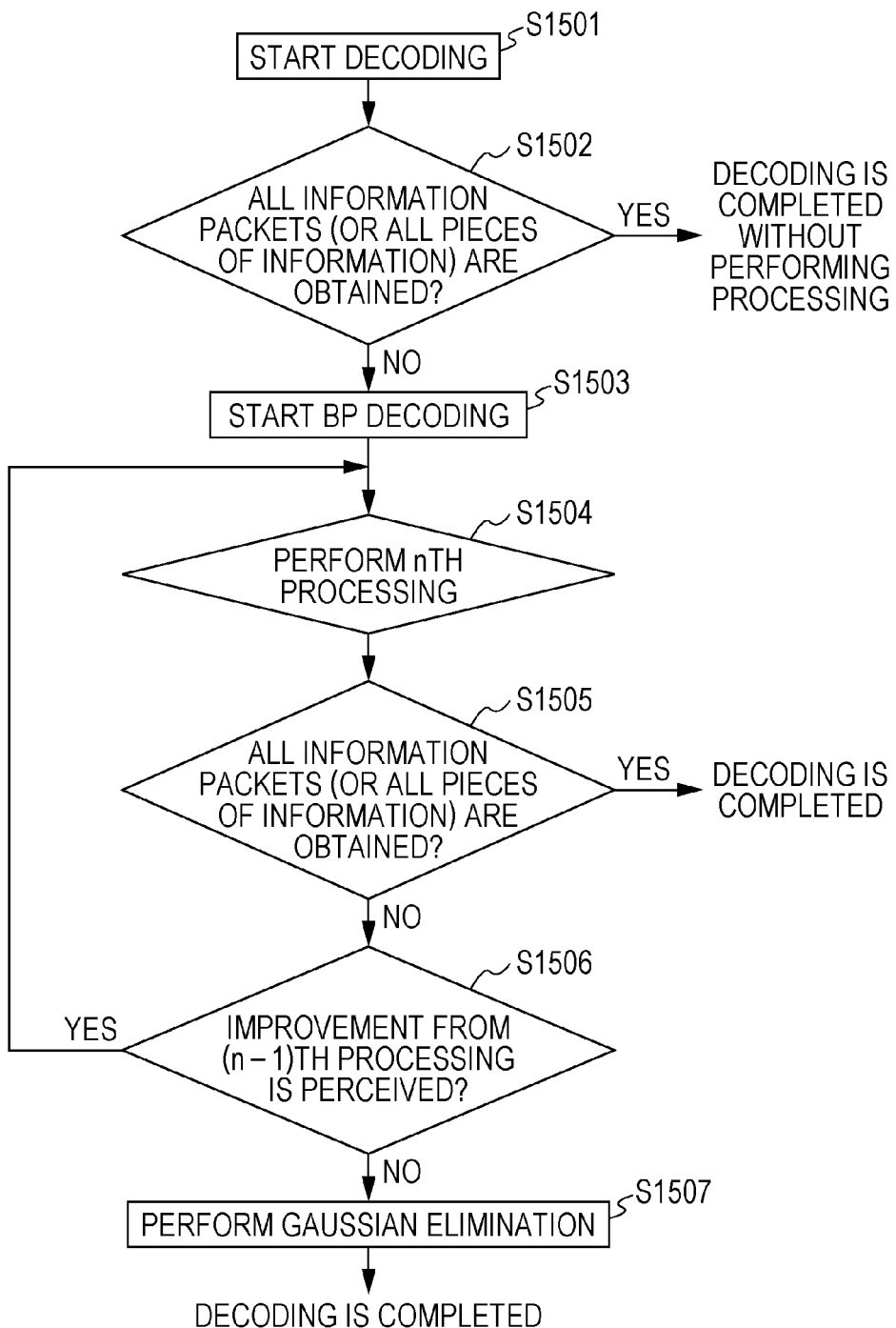
FIG. 15 is a flowchart illustrating an operation example of the packet-level decoder.

FIG. 15 is a flowchart of packet-level decoder 1006 in the first exemplary embodiment. For example, controller 1207, BP decoder 1201, maximum likelihood decoder 1204, or selector 1209 in FIG. 12 makes the determination of the flowchart.

For example, packet-level decoder 1006 performs the following procedure (however, in the flowchart of FIG. 15, it is assumed that data 1201 is already subjected to the packet-level error (erasure) correction coding).

(Step 1: S1501) Controller 1207 issues the instruction of "decoding start" to each part (BP decoder 1202, maximum likelihood decoder 1204, and selector 1209) (for example, control information signal 1211 makes the determination of "decoding start").

(Step 2: S1502) For example, controller 1207 or BP decoder 1202 determines "whether all the information packets (or all the pieces of information) are obtained" (in the first exemplary embodiment, because of the assumption that the systematic code is used in the packet-level error (erasure) correction code, data 1201 includes the information packet or the information).

When all the information packets (or all the pieces of information) are obtained, BP decoder 1202 does not perform the error (erasure) correction decoding (YES in S1502). Accordingly, selector 1209 outputs the information extracted from data 1201 or data 1201 as selected data 1210.

When all the information packets (or all the pieces of information) are not obtained (NO in S1502), BP decoder 1202 starts the BP decoding of data 1201 (S1503).

Thus, when all the information packets (or all the pieces of information) are obtained (YES in S1502), packet-level decoder 1006 can reduce the calculation scale of the decoder by completing the decoding processing, which allows the power consumption to be reduced in the decoder.

(Step 3: S1503) BP decoder 1202 starts counting of the number of iteration after starting the BP decoding (S1504).

BP decoder 1202 determines "whether all the information packets (or all the pieces of information) are obtained" with respect to the data obtained through the decoding processing of the number of iteration n (S1505). When all the information packets (or all the pieces of information) are obtained, BP decoder 1202 completes the BP decoding, and outputs post-BP-decoding received sequence 1203 (YES in S1505).

Selector 1209 outputs post-BP-decoding received sequence 1203 or information extracted from post-BP-decoding received sequence 1203 as selected data 1210.

When all the information packets (or all the pieces of information) are not obtained, BP decoder 1202 completes the nth iterative decoding, and the processing proceeds to S1506 (NO in S1505).

Thus, when BP decoder 1202 obtains all the information packets (or all the pieces of information), packet-level decoder 1006 can reduce the calculation scale of the decoder by completing the decoding processing, which allows the power consumption to be reduced in the decoder (in this case, although the term "the number of iteration is counted" is used, the number of iteration needs not to be counted).

(Step 4: S1506) BP decoder 1202 compares the data obtained through the previous ((n−1)th) decoding processing to the data obtained through the current (nth) decoding processing. When the data obtained through the previous decoding processing is identical to the data obtained through the current decoding processing, BP decoder 1202 determines that an effect of the error (erasure) correction is not obtained any more even if the iterative processing is performed, and the processing proceeds to a next step (S1507) (NO in S1506).

When BP decoder 1202 determines that the data obtained through the previous decoding processing is different from the data obtained through the current decoding processing (the data in which the error (erasure) correction is performed through the current decoding processing exists), the processing proceeds to the next ((n+1)th) iterative processing of the BP decoding (YES in S1506).

(Step 5: S1507) Post-BP-decoding received sequence 1203 is input to maximum likelihood decoder 1204, and maximum likelihood decoder 1204 performs the decoding on post-BP-decoding received sequence 1203 by, for example, the Gaussian elimination, and outputs post-maximum-likelihood-decoding received sequence 1205.

Figure 16:
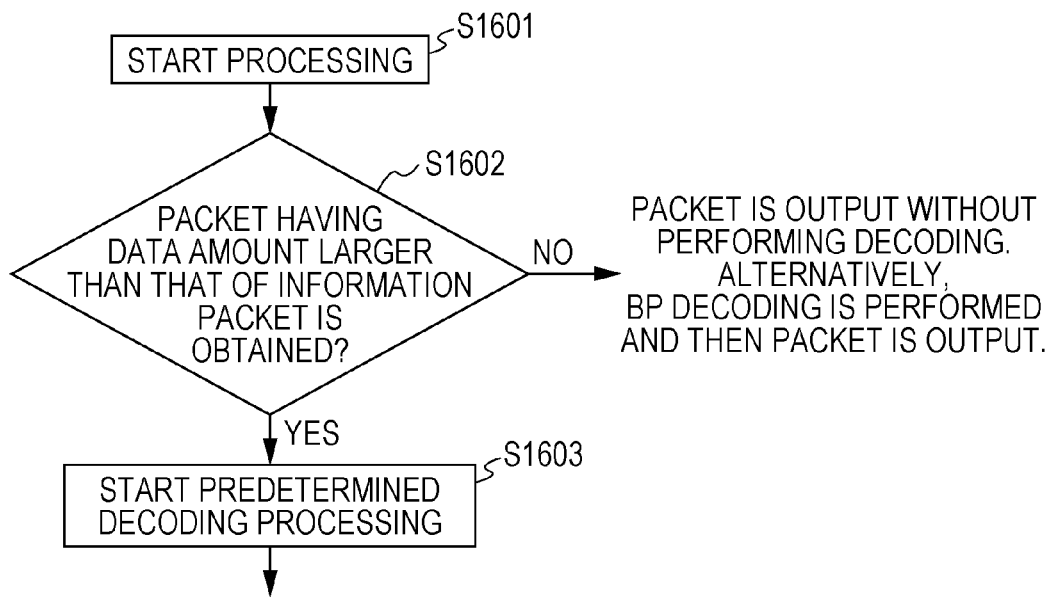
FIG. 16 is a flowchart illustrating an example of processing before operation in FIGS. 13, 14, and 15 is started.

Packet-level decoder 1006 may perform processing in FIG. 16 before starting the decoding processing in FIGS. 13, 14, and 15. Referring to FIG. 16, packet-level decoder 1006 determines "whether a packet having a data amount larger than that of the information packet is obtained" (S1601).

As to the configuration of the error (erasure) correction code to be received, for example, it is assumed that the information has 720 bits, that parity has 360 bits, and that received data 1201 has 720 bits or less (or less than 720 bits). In this case, packet-level decoder 1006 does not perform any piece of decoding processing, but delivers the data of the obtained packet to a next layer (for example, an application layer). All the information bits are hardly obtained because packet-level decoder 1006 cannot solve the simultaneous equations (NO in S1602).

In the case that the received data has 720 bits or more (or more than 720 bits) (YES in S1602), for example, packet-level decoder 1006 performs the decoding processing in FIGS. 13, 14, and 15 (S1603).

As described above, in packet-level decoder 1006, the calculation scale can be reduced by the omission of the decoding processing, so that the power consumption of the decoder can be reduced.

Figure 17:
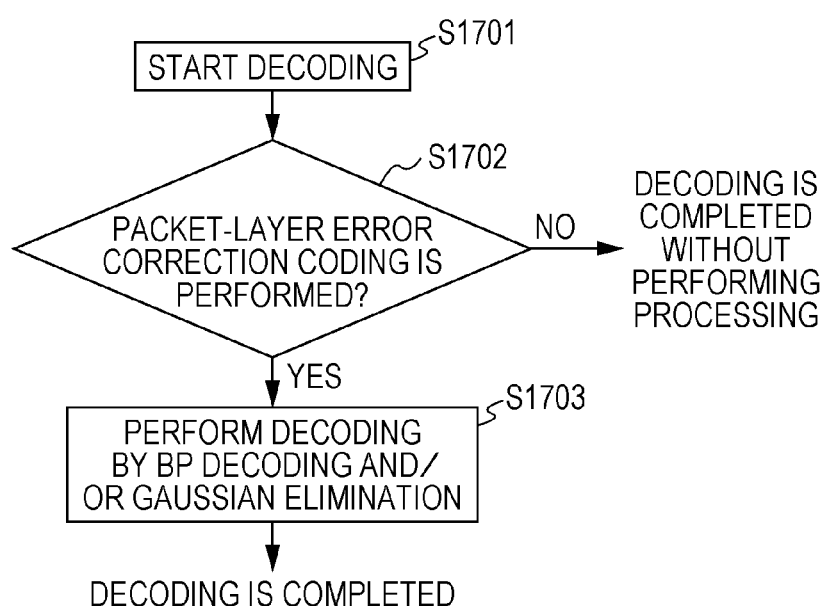
FIG. 17 is a flowchart illustrating an operation example of the packet-level decoder.

The operation of packet-level decoder 1006 in the first exemplary embodiment may be operation in FIG. 17. Referring to FIG. 17, packet-level decoder 1006 determines "whether the packet-layer error correction coding is performed" (S1701).

When the packet-layer error correction coding is not performed, packet-level decoder 1006 does not perform processing (NO in S1702). On the other hand, when the packet-layer error correction coding is performed (YES in S1702), packet-level decoder 1006 performs the decoding by the BP decoding and/or Gaussian elimination (S1703).

(Setting Screen)

Each reception device (terminal) may individually set the decoding method by displaying a setting screen associated with the decoding. The setting method will be described below.

Figure 18:
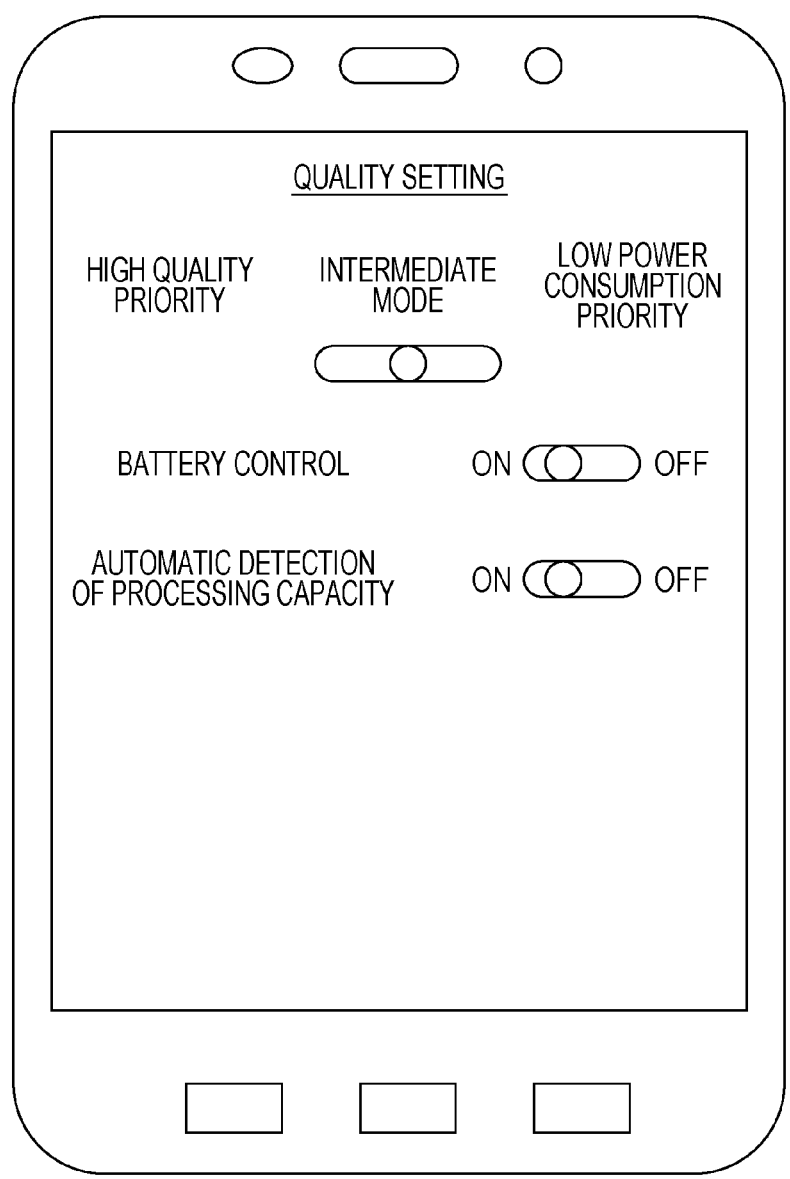
FIG. 18 illustrates an example of a setting item displayed on a screen of the terminal.

FIG. 18 illustrates an example of a setting item displayed on a screen of the terminal. For example, in each reception device (terminal), the setting item is input from display 384 in FIG. 3. FIG. 18 illustrates an example of an input screen on which the setting item is displayed.

Referring to FIG. 18, "high quality priority", "low power consumption priority (saving mode)", or "intermediate mode" can be selected in the reception device (terminal). In the reception device (terminal), the decoding method that can perform the high error (erasure) correction is selected when the "high quality priority" is selected, the decoding method that reduces the power consumption is selected when the "low power consumption priority (saving mode)" is selected, and a balance between the quality of the data and the low power consumption power consumption is established when the "intermediate mode" is selected. Detailed operation will be described later.

For example, in FIG. 18, "ON" and "OFF" of battery control can be selected in the reception device (terminal). When the battery control "ON" is selected, the reception device (terminal) selects a proper signal processing method based on a battery remaining capacity of the reception device (terminal), and performs the packet-level decoding. When the battery control "OFF" is selected, the reception device (terminal) performs the packet-level decoding by the set signal processing method irrespective of the battery remaining capacity of the reception device (terminal). Detailed operation will be described later.

For example, in FIG. 18, "ON" and "OFF" of processing capacity automatic detection can be selected in the reception device (terminal). When the processing capacity automatic detection "ON" is selected, the reception device (terminal) automatically measures a signal processing capacity, selects a proper signal processing method based on a measurement result, and performs the packet-level decoding. When the processing capacity automatic detection "OFF" is selected, the reception device (terminal) omits the measurement of the signal processing capacity, and performs the packet-level decoding by the set signal processing method. Detailed operation will be described later.

Figure 19:
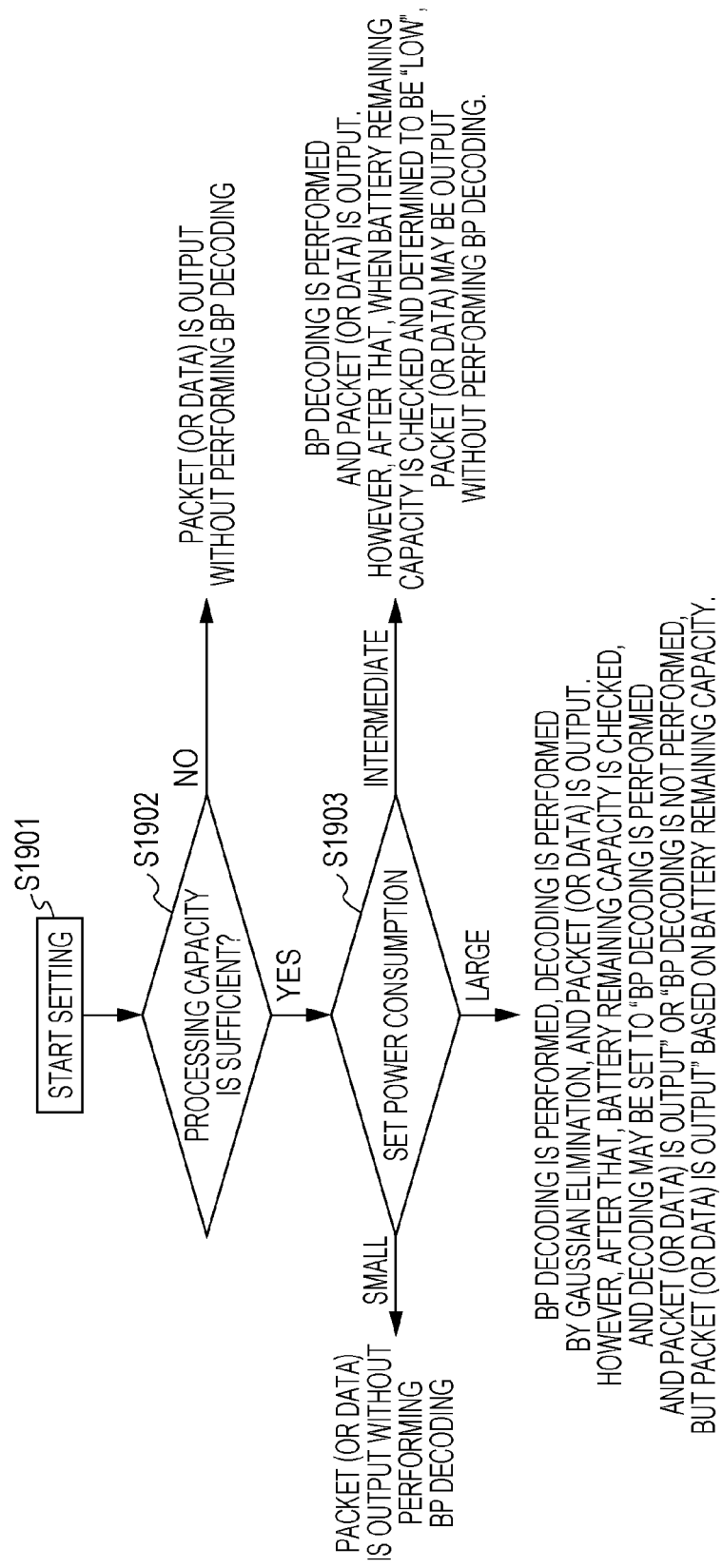
FIG. 19 is a flowchart illustrating an example of a method for deciding packet-level decoding.

The reception device (terminal) decides the packet-level decoding method based on the setting in FIG. 18. FIG. 19 illustrates an example of a flowchart associated with the decision of the decoding method.

For example, in the setting of FIG. 18, when processing capacity automatic detection "ON" is selected while the battery control "OFF" is selected, the reception device (terminal) performs control in a procedure of FIG. 19.

(Step 1: S1901) Controller 1207 starts the setting of the packet-level decoding method in given timing (such as the time the operation of the application is started, the time the reception device is powered on, and the time the application is started up).

(Step 2: S1902) The reception device (terminal) determines "whether the reception device has the sufficient signal processing capacity". When determining that the reception device has the insufficient signal processing capacity (NO in S1902), the reception device performs neither the BP decoding nor the maximum likelihood decoding, but outputs the data. Because the received data is the systematic code, the reception device can obtain the information (data) in which the erasure is not generated in the received data even if the reception device omits the decoding of the received data. That is, selector 1209 outputs data 1201 as selected data 1210. When the reception device determines that the reception device has the sufficient signal processing capacity (YES in S1902), the processing proceeds to the next step (S1903).

(Step 3: S1903) The reception device (terminal) checks the setting of the power consumption (S1903). That is, the reception device (terminal) checks which one of the "high quality priority", "low power consumption priority (saving mode)", and "intermediate mode" in FIG. 18 is selected.

When the "high quality priority" is selected (LARGE in S1903), the reception device (terminal) "performs the BP decoding, performs the decoding by the Gaussian elimination, and outputs the packet (or data)".

The reception device (terminal) does not always perform the decoding by both the BP decoding and the Gaussian elimination. That is, the reception device performs the decoding by the BP decoding and the Gaussian elimination in the case that the decoding by the Gaussian elimination is required as illustrated in FIGS. 14, 15, and 16, and the reception device performs the decoding while one of or both the BP decoding and the Gaussian elimination are omitted in the case that the decoding by the Gaussian elimination is not required.

When the battery control "ON" is selected as illustrated in FIG. 18, the reception device (terminal) "performs the BP decoding, and outputs the packet (or data)" based on the battery remaining capacity.

In the case that the BP decoding is not required as illustrated in FIGS. 14, 15, 16, and 17, the reception device (terminal) omits the BP decoding, or "outputs the packet (or data) without performing the BP decoding" (YES in S1402, YES in S1502, NO in S1602, and NO in S1702). The reception device (terminal) may also omit the decoding by the Gaussian elimination.

When the "intermediate mode" is selected (INTERMEDIATE in S1903), the reception device "performs the BP decoding, and outputs the packet (or data)". In the case that the BP decoding is not required as illustrated in FIGS. 14, 15, 16, and 17, the reception device (terminal) omits the BP decoding (YES in S1402, YES in S1502, NO in S1602, and NO in S1702).

When the battery control "ON" is selected as illustrated in FIG. 18, the reception device "omits the BP decoding, and outputs the packet (or data)" based on the battery remaining capacity. At this point, the reception device may omit the decoding by the Gaussian elimination.

When the "low power consumption priority" is selected (SMALL in S1903), the reception device "does not perform the BP decoding, but outputs the packet (or data)". The reception device (terminal) also omits the decoding by the Gaussian elimination.

Therefore, the reception device (terminal) can achieve the balance between the improvement of the data reception quality and the reduction of the power consumption and the proper control based on the battery capacity.

Figure 20:
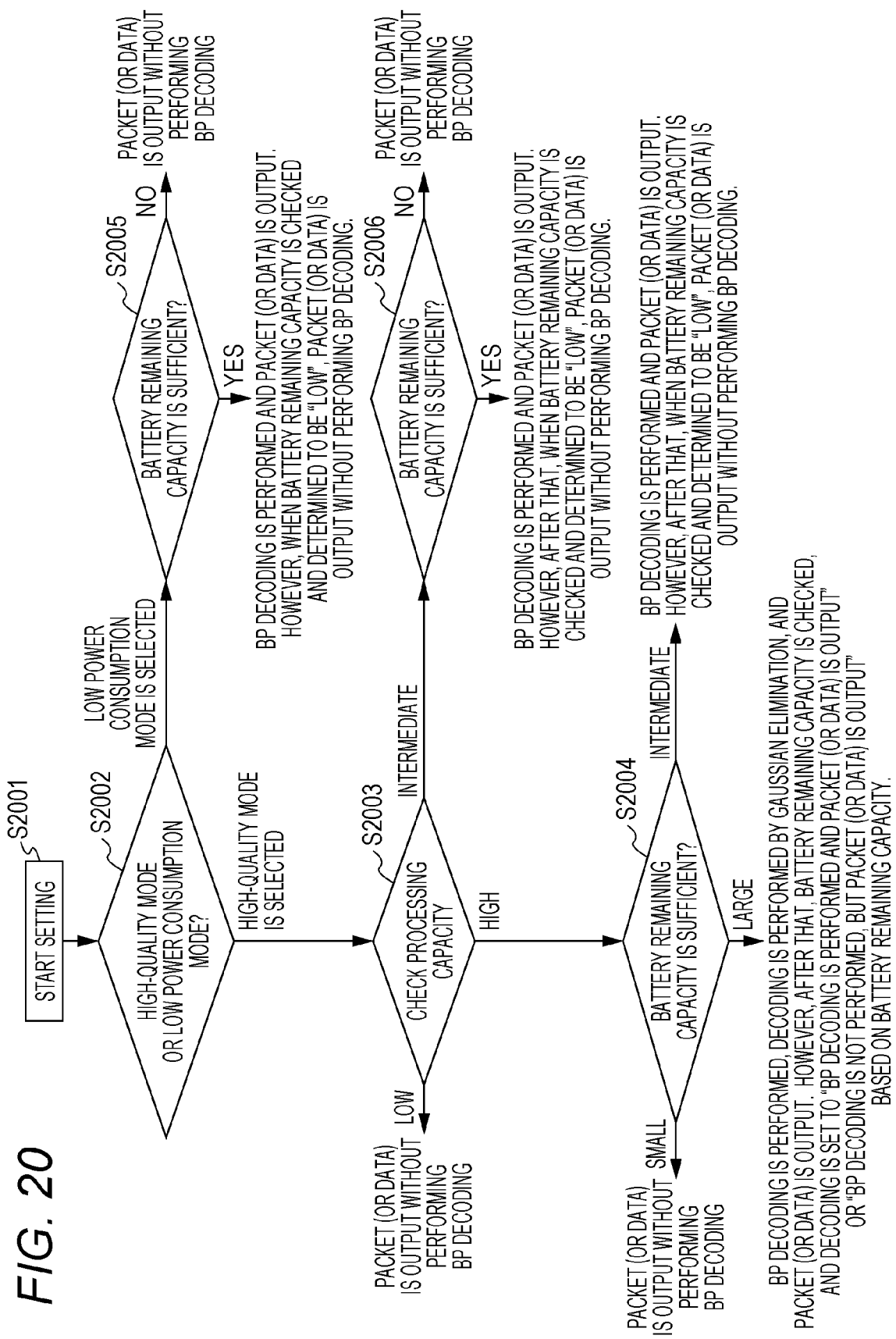
FIG. 20 is a flowchart illustrating an example of the method for deciding the packet-level decoding.

FIG. 20 is a flowchart associated with the decision of the packet-level decoding method, and illustrates an example different from that in FIG. 19. The setting screen may exist as illustrated in FIG. 18, or be set every time based on a setting procedure in FIG. 20, for example, when the application is started up.

The setting procedure in FIG. 20 will be described below.

(Step 1: S2002) One of the "high-quality mode" and the "low power consumption mode" is selected (S2002).

When the "low power consumption mode" is selected in S2002:

Then, the battery remaining capacity is checked (S2005). When the battery remaining capacity is insufficient (NO in S2005), the reception device (terminal) "does not perform the BP decoding, but outputs the packet (or data)". When the battery remaining capacity is sufficient (YES in S2005), the reception device (terminal) "performs the BP decoding, and outputs the packet (or data)". In the case that the BP decoding is not required as illustrated in FIGS. 14, 15, 16, and 17, the reception device (terminal) omits the BP decoding.

When the battery control "ON" is selected as illustrated in FIG. 18, the reception device (terminal) "does not perform the BP decoding, but outputs the packet (or data)" based on the battery remaining capacity. The reception device (terminal) may also omit the decoding by the Gaussian elimination.

When the "high-quality mode" is selected in S2002:

The reception device (terminal) checks the (signal) processing capacity (S2003). For example, the reception device (terminal) executes a test program. In any case for the present description, the processing capacity can be checked by the execution of the test program.

When the processing capacity is determined to be low (LOW in S2003):

The reception device (terminal) "does not perform the BP decoding, but outputs the packet (or data)". The reception device (terminal) also omits the decoding by the Gaussian elimination.

When the processing capacity is determined to be intermediate (INTERMEDIATE in S2003):

The reception device (terminal) checks the battery remaining capacity (S2006). When the battery remaining capacity is insufficient (NO in S2006), the reception device (terminal) "does not perform the BP decoding, but outputs the packet (or data)".

When the battery remaining capacity is sufficient (YES in S2006), the reception device (terminal) "performs the BP decoding, and outputs the packet (or data)". In the case that the BP decoding is not required as illustrated in FIGS. 14, 15, 16, and 17, the reception device (terminal) omits the BP decoding.

When the battery control "ON" is selected as illustrated in FIG. 18, the reception device (terminal) "does not perform the BP decoding, but outputs the packet (or data)" based on the battery remaining capacity. The reception device (terminal) may also omit the decoding by the Gaussian elimination.

When the processing capacity is determined to be high (HIGH in S2003):

The reception device (terminal) checks the battery remaining capacity. When the battery remaining capacity is small (SMALL in S2004), the reception device (terminal) "does not perform the BP decoding, but outputs the packet (or data)".

When the battery remaining capacity is intermediate (INTERMEDIATE in S2004), the reception device (terminal) "performs the BP decoding, and outputs the packet (or data)". In the case that the BP decoding is not required as illustrated in FIGS. 14, 15, 16, and 17, the reception device (terminal) omits the BP decoding.

When the battery control "ON" is selected as illustrated in FIG. 18, the reception device (terminal) "does not perform the BP decoding, but outputs the packet (or data)" based on the battery remaining capacity. The reception device (terminal) may also omit the decoding by the Gaussian elimination.

When the battery remaining capacity is large (sufficient) (LARGE in S2004), the reception device (terminal) "performs the BP decoding, performs the decoding by the Gaussian elimination, and outputs the packet (or data)".

In the case that the decoding by the Gaussian elimination is required as illustrated in FIGS. 14, 15, 16, and 17, the reception device (terminal) performs the decoding by both the BP decoding and the Gaussian elimination. In the case that the decoding by the Gaussian elimination is not required, the reception device may omit the decoding by the Gaussian elimination.

When the battery control "ON" is selected as illustrated in FIG. 18, the reception device (terminal) "performs the BP decoding, and outputs the packet (or data)" based on the battery remaining capacity. As illustrated in FIGS. 14, 15, 16, and 17, the reception device (terminal) may omit both the BP decoding and the Gaussian elimination, or perform the BP decoding and omit the Gaussian elimination.

(The Number of Lost Packets)

Figure 21:
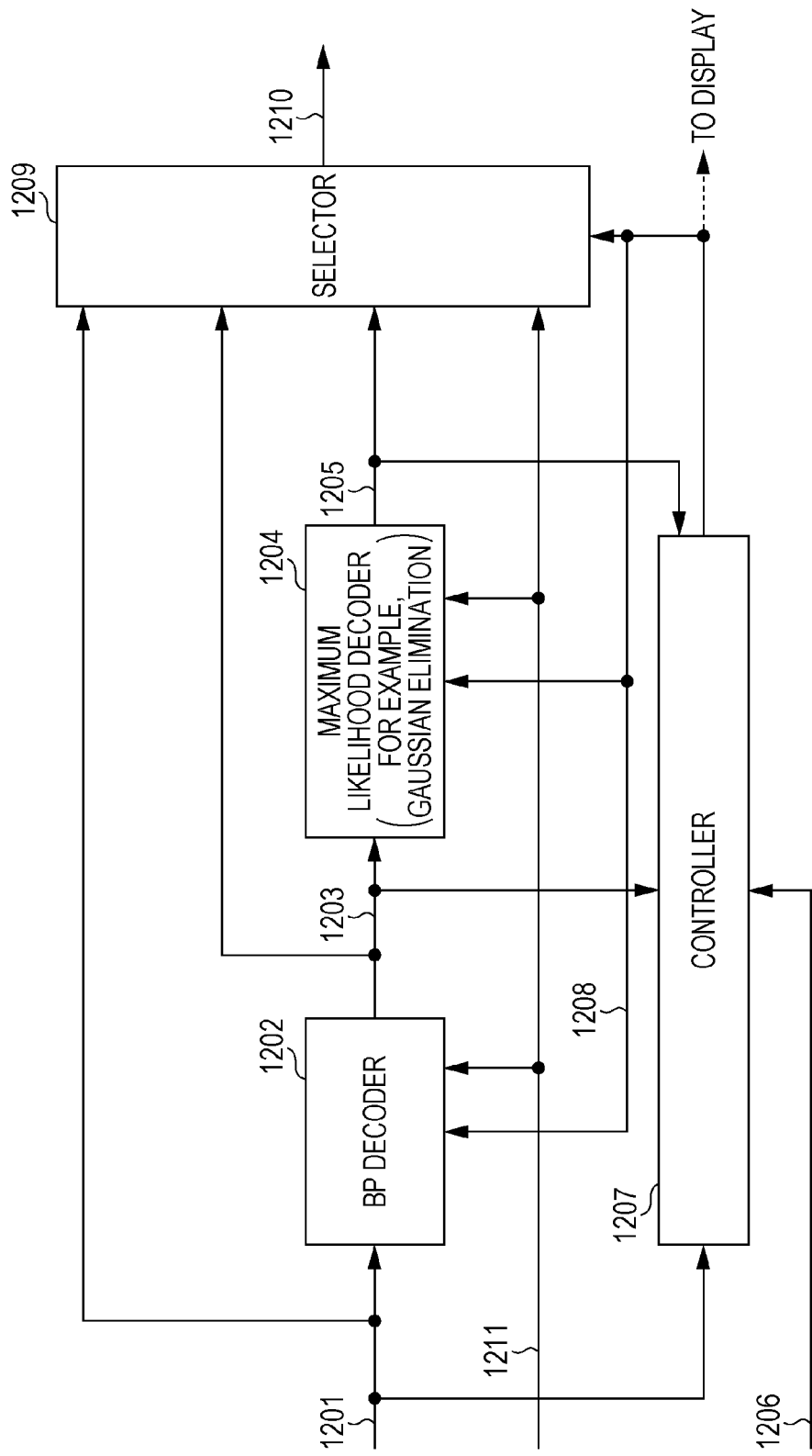
FIG. 21 illustrates a configuration example of the packet-level decoder.

As a modification of FIG. 12, data 1201, post-BP-decoding received sequence 1203, and post-maximum-likelihood-decoding received sequence 1205 are input to controller 1207, and controller 1207 may perform the display such that a change of the method for decoding each of post-decoding data and pre-erasure-correction data is encouraged according to an error (erasure) state of the packet as illustrated in FIG. 21.

For example, the decoding method of the reception device (terminal) is set to "the BP decoding is performed and the packet (or data) is output" (as illustrated in FIGS. 14, 15, 16, and 17, the BP decoding can be omitted as appropriate), and there are many erasure packets. In such cases, controller 1207 may issue an instruction to display a message "a high-quality reception method can be set" to display 384.

In the reception device (terminal), information indicating "whether a user agrees to the setting of the high-quality reception method" is transmitted to controller 1207 using control signal 1206. Controller 1207 may change the decoding method based on the information from the user.

In this case, the reception device (terminal) changes the decoding method to "the BP decoding is performed, the decoding by the Gaussian elimination is performed, and the packet (or data) is output".

As illustrated in FIGS. 14, 15, 16, and 17, the BP decoding and the Gaussian elimination may be omitted as appropriate.

For example, the decoding method of the reception device (terminal) is set to "BP decoding is performed and the packet (or data) is output" (as illustrated in FIGS. 14, 15, 16, and 17, the BP decoding can be omitted as appropriate), and there are few erasure packets. In such cases, controller 1207 may issue an instruction to display a message "power consumption can be reduced" to display 384.

In the reception device (terminal), information indicating "whether the user agrees to the reduction of the power consumption" is transmitted to controller 1207 using control signal 1206. Controller 1207 may change the decoding method based on the information from the user.

In this case, the reception device (terminal) changes the decoding method to "the BP decoding is not performed but the packet (or data) is output" (also the decoding by the Gaussian elimination is not performed).

In another example, the decoding method of the reception device (terminal) is set to "the BP decoding is not performed but the packet (or data) is output" (also the decoding by the Gaussian elimination is not performed), and there are many erasure packets. In such cases, controller 1207 may issue an instruction to display a message "the high-quality reception method can be set" to display 384.

In the reception device (terminal), information indicating "whether a user agrees to the setting of the high-quality reception method" is transmitted to controller 1207 using control signal 1206. Controller 1207 may change the decoding method based on the information from the user.

In this case, the reception device (terminal) can change the decoding method to one of the decoding method "for performing the BP decoding, performing the decoding by the Gaussian elimination, and outputting the packet (or data)" (the reception device (terminal) can appropriately omit the BP decoding and the Gaussian elimination as illustrated in FIGS. 14, 15, 16, and 17) and the decoding method "for performing the BP decoding and outputting the packet (or data)" (the reception device (terminal) can appropriately omit the BP decoding as illustrated in FIGS. 14, 15, and 16).

In another example, the decoding method of the reception device (terminal) is set to "BP decoding is performed, the decoding is performed by the Gaussian elimination, and the packet (or data) is output" (as illustrated in FIGS. 14, 15, 16, and 17, the reception device (terminal) can appropriately omit the BP decoding and the Gaussian elimination), and there are few erasure packets. In such cases, controller 1207 may issue an instruction to display the message "power consumption can be reduced" to display 384.

In the reception device (terminal), information indicating "whether the user agrees to the reduction of the power consumption" is transmitted to controller 1207 using control signal 1206. Controller 1207 may change the decoding method based on the information from the user.

In this case, the reception device (terminal) can change the decoding method to one of the decoding method "for not performing the BP decoding, but outputting the packet (or data)" (also the decoding by the Gaussian elimination is not performed) and the decoding method "for performing the BP decoding and outputting the packet (or data)" (the reception device (terminal) can appropriately omit the BP decoding as illustrated in FIGS. 14, 15, 16, and 17).

As described in the above examples, the reception device (terminal) displays the message "encouraging the user to change" the signal processing method (decoding processing method), the setting content, and the like on display 384 according to the error (erasure) state of the data, which allows the achievement of the balance between the high reception quality of the data and the reduction of the power consumption. Although the example of the quality setting screen is illustrated in FIG. 18, the setting content is not limited to the example in FIG. 18. For example, each decoding method may be set to enable/disable.

That is, the reception device (terminal) can set the decoding method "for performing the BP decoding, performing the decoding by the Gaussian elimination, and outputting the packet (or data)" (the reception device (terminal) can appropriately omit the BP decoding and the Gaussian elimination as illustrated in FIGS. 14, 15, 16, and 17) to enable/disable, set the decoding method "for performing the BP decoding and outputting the packet (or data)" (the reception device (terminal) can appropriately omit the BP decoding as illustrated in FIGS. 14, 15, 16, and 17) to enable/disable, and set the decoding method "for not performing the BP decoding, but outputting the packet (or data)" (also the decoding by the Gaussian elimination is not performed) to enable/disable.

The reception device (terminal) may display the message "encouraging the user to change" enable/disable according to the error (erasure) state of the data on display 384.

As described above, in the first exemplary embodiment, the decoding control method is described in the packet-level decoding method in which the BP decoding and the maximum likelihood decoding are combined with each other, and the calculation scale can be reduced by the decoding control method as in the first exemplary embodiment, and therefore the power consumption can be reduced in the decoding processing portion.

In the first exemplary embodiment, by way of example, the sum-product decoding is described as the BP decoding, and the Gaussian elimination is described as the maximum likelihood decoding. However, the present disclosure is not limited to the sum-product decoding and the Gaussian elimination. Alternatively, for example, min-sum decoding may be adopted as the BP decoding, and Gauss-Jordan elimination, a Gauss-Seidel method, and LU decomposition may be adopted as the maximum likelihood decoding (for the maximum likelihood decoding, an operation to solve simultaneous equations is performed).

Second Exemplary Embodiment

Modifications of the packet-level coding and packet-level decoding of the first exemplary embodiment will be described in a second exemplary embodiment.

The second exemplary embodiment is similar to the first exemplary embodiment in the relationship between the transmission station and the terminal, the configuration of the transmission device of the transmission station (FIG. 2), the configuration of the reception device of the terminal (FIG. 3), and the performance of the packet-level error (erasure) correction coding. In particular, the packet-level coding and decoding that are different from those of the first exemplary embodiment will be described below.

Because the configuration of the transmission device of the transmission station is already described in the first exemplary embodiment with reference to FIG. 2, the description is omitted. Because the configuration of the reception device of the terminal is already described in the first exemplary embodiment with reference to FIG. 3, the description is omitted.

Figure 22:
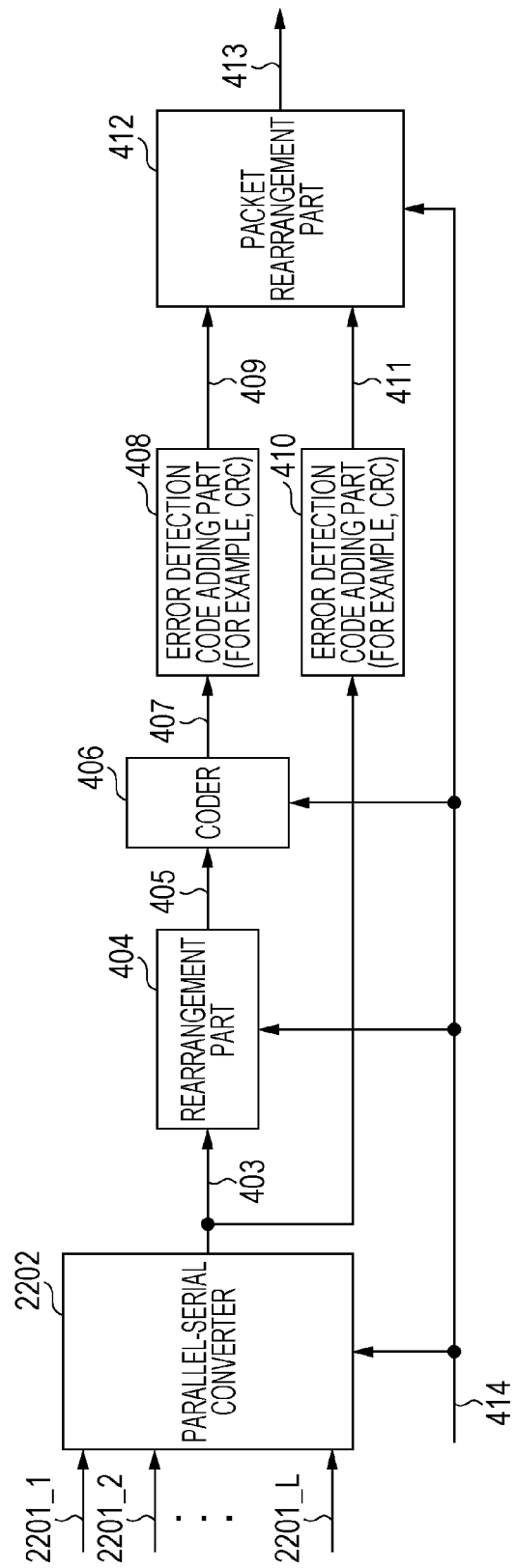
FIG. 22 illustrates a configuration example of a portion associated with the error correction coding method of the transmission device.

FIG. 22, which is different from FIG. 4, illustrates a partial configuration of the transmission device of transmission station 101 associated with the error (erasure) correction coding method for restoring the packet or frame when the packet or frame erasure is generated in the transmission device. In FIG. 22, a component operating similarly to that in FIG. 4 is designated by the same reference mark in FIG. 4, and the description is omitted.

Packet 2201_1 of a stream of video #1, packet 2201_2 of a stream of video #2, . . . , packet 2201_L of a stream of video #L, and control information signal 414 are input to parallel-serial converter 2202, and parallel-serial converter 2202 performs parallel-serial conversion based on information about the number of streams included in control information signal 414, and outputs packet 403 (information about at least one stream) including information about a plurality of streams.

Although packet 2201_1 of the stream of video #1 is described as "video", sometimes packet 2201_1 of the stream of video #1 includes voice, sound (audio), subtitles, and character information, and the like, or sometimes packet 2201_1 of the stream of video #1 is voice, sound (audio), and character information. The same holds true for the following term "packet".

Although parallel-serial converter 2202 is illustrated in FIG. 22, parallel-serial converter 2202 can be omitted in the transmission device in the case that the input data is one packet including the information about the plurality of streams.

Packet 403 including the information about the plurality of streams and control information signal 414 are input to rearrangement part 404, and rearrangement part 404 rearranges the data of packet 403 based on the information about the rearrangement method, the information about the rearrangement method being included in the control information, and outputs rearranged data sequence 405. The transmission device does not necessarily perform the rearrangement.

Rearranged data sequence 405 and control information signal 414 are input to coder 406, and coder 406 codes rearranged data sequence 405 based on the information about the error (erasure) correction coding scheme (such as information about an error (erasure) correction coding scheme to be used, a code length (block length), and a coding rate), the information about the error (erasure) correction coding scheme being included in control information signal 414, and the information about the number of stream, and outputs parity packet 407.

Parity packet 407 is input to error detection code adding part 408, and error detection code adding part 408 adds, for example, the CRC to detect the error packet by packet, and outputs CRC-added parity packet 409. In the reception device, error detection code adding part 408 adds the CRC, so that whether all pieces of data in the packet are right or whether the packet is lost can be determined. Although the CRC is described by way of example, the transmission device may use any block code and any check code as long as whether all pieces of data in the packet are right or whether the packet is lost can be determined using the block code and the check code.

Similarly, information packet 403 is input to error detection code adding part 410, and error detection code adding part 410 adds, for example, the CRC to perform error detection packet by packet, and outputs CRC-added information packet 411. In the reception device, error detection code adding part 410 adds the CRC, so that whether all pieces of data in the packet are right or whether the packet is lost can be determined. Although the CRC is described by way of example, the transmission device may use any block code and any check code as long as whether all pieces of data in the packet are right or whether the packet is lost can be determined using the block code and the check code.

CRC-added parity packet 409 and CRC-added information packet 411 are input to packet rearrangement part 412, and packet rearrangement part 412 rearranges the packet, and outputs rearranged packet 413.

Control information signal 414 in FIG. 22 may include, but not limited to, control information (such as information about an information type and information (a frame rate, a compression ratio, and a compression method) about the video coding scheme).

The operation in FIG. 22 will be described below with reference to FIGS. 23A, 23B, and 23C.

FIG. 23A illustrates a relationship between the information packet and the parity packet for one stream (that is, in FIG. 22, the transmission device transmits packet 2201_1 of the stream of video #1). The information packet is input to coder 406 in FIG. 22, and coder 406 obtains the parity packet by performing the error (erasure) correction coding on the information packet.

In FIG. 23A, coder 406 performs the error (erasure) correction coding on n (n is an integer of 2 or more) information packets of "information packet S$1-1", "information packet S$1-2", "information packet S$1-3", . . . , "information packet S$1-(n–1)", "information packet S$1-n" in packet 2201_1 of the stream of video #1, and generates h (h is an integer of 1 or more) parity packets of "parity packet #1", "parity packet #2", "parity packet #3", . . . , "parity packet #(h–1)", "parity packet #h". That is, coder 406 "generates the h parity packets in each n information packets of the stream of video #1".

FIG. 23B illustrates a relationship between the information packet and the parity packet for two streams (that is, in FIG. 22, the transmission device transmits packet 2201_1 of the stream of video #1 and packet 2201_2 of the stream of video #2). The information packet is input to coder 406 in FIG. 22, and coder 406 obtains the parity packet by performing the error (erasure) correction coding on the information packet.

In FIG. 23B, coder 406 performs the error (erasure) correction coding on a total of (2×n) information packets, namely, n (n is an integer of 2 or more) information packets of "information packet S$1-1", "information packet S$1-2", "information packet S$1-3", "information packet S$1-(n–1)", "information packet S$1-n" in packet 2201_1 of the stream of video #1, and n (n is an integer of 2 or more) information packets of "information packet S$2-1", "information packet S$2-2", "information packet S$2-3", . . . , "information packet S$2-(n–1)", "information packet S$2-n", and generates (2×h) (h is an integer of 1 or more) parity packets of "parity packet #1", "parity packet #2", "parity packet #3", . . . , "parity packet #(2×h–1)", "parity packet #2×h". That is, coder 406 "generates the (2×h) parity packets in each (2×n) packets of the n information packets of the stream of video #1 and the n information packets of the stream of video #2".

FIG. 23C illustrates a relationship between the information packet and the parity packet for u (u is an integer of 1 or more) streams (that is, in FIG. 22, the transmission device transmits packet 2201_1 of the stream of video #1 to packet 2201_u of the stream of video #u). The information packet is input to coder 406 in FIG. 22, and coder 406 obtains the parity packet by performing the error (erasure) correction coding on the information packet.

In FIG. 23C, coder 406 performs the error (erasure) correction coding on a total of (u×n) information packets, namely, n (n is an integer of 2 or more) information packets of "information packet S$1-1", "information packet S$1-2", "information packet S$1-3", "information packet S$1-(n–1)", "information packet S$1-n" in packet 2201_1 of the stream of video #1, n (n is an integer of 2 or more) information packets of "information packet S$2-1", "information packet S$2-2", "information packet S$2-3", . . . , "information packet S$2-(n–1)", "information packet S$2-n", n (n is an integer of 2 or more) information packets of "information packet S$u-1", "information packet S$u-2", "information packet S$u-3", . . . , "information packet S$u-(n–1)", "information packet S$u-n", and generates (u×h) (h is an integer of 1 or more) parity packets of "parity packet #1", "parity packet #2", "parity packet #3", . . . , "parity packet #(u×h–1)", "parity packet #u×h".

That is, in the case that the information packet of the stream of video #j (j is an integer between 1 and u both inclusive) is n (n is an integer of 2 or more) information packets of "information packet S$j-1", "information packet S$j-2", "information packet S$j-3", . . . , "information packet S$j-(n–1)", "information packet S$j-n", the total number of information packets is u×n.

That is, coder 406 "generates the (u×h) parity packets in each (u×n) packets from the n information packets of the stream of video #1 to the n information packets of the stream of video #u".

The relationship between the coding rate and the code length will be described below.

For example, in FIG. 23A, the transmission device performs the erasure correction coding using a 2880-bit block length error (erasure) correction (block) code constructed with 1440-bit information and 1440-bit parity to transmit the packet of the stream of video #1.

In FIG. 23B, the transmission device performs the erasure correction coding using a (2880×2=5760)-bit block length error (erasure) correction (block) code constructed with (1440×2=2880)-bit information and (1440×2=2880)-bit parity to transmit the packet of the stream of video #1 and the packet of the stream of video #2.

In FIG. 23C, the transmission device performs the erasure correction coding using a (2880×u)-bit block length error (erasure) correction (block) code constructed with (1440×u)-bit information and (1440×u)-bit parity to transmit the packet of the stream of video #1 to the packet of the stream of video #u.

Therefore, in FIG. 23A, the transmission device performs the erasure correction coding using an (a+b)-bit block length error (erasure) correction (block) code constructed with a-bit information and a-bit parity to transmit the packet of the stream of video #1 (a is an integer of 1 or more, and b is an integer of 1 or more).

In FIG. 23B, the transmission device performs the erasure correction coding using a (2×(a+b))-bit block length error (erasure) correction (block) code constructed with (2×a)-bit information and (2×b)-bit parity to transmit the packet of the stream of video #1 and the packet of the stream of video #2.

In FIG. 23C, the transmission device performs the erasure correction coding using an ((a+b)×u)-bit block length error (erasure) correction (block) code constructed with (a×u)-bit information and (b×u)-bit parity to transmit the packet of the stream of video #1 to the packet of the stream of video #u.

Figure 24:
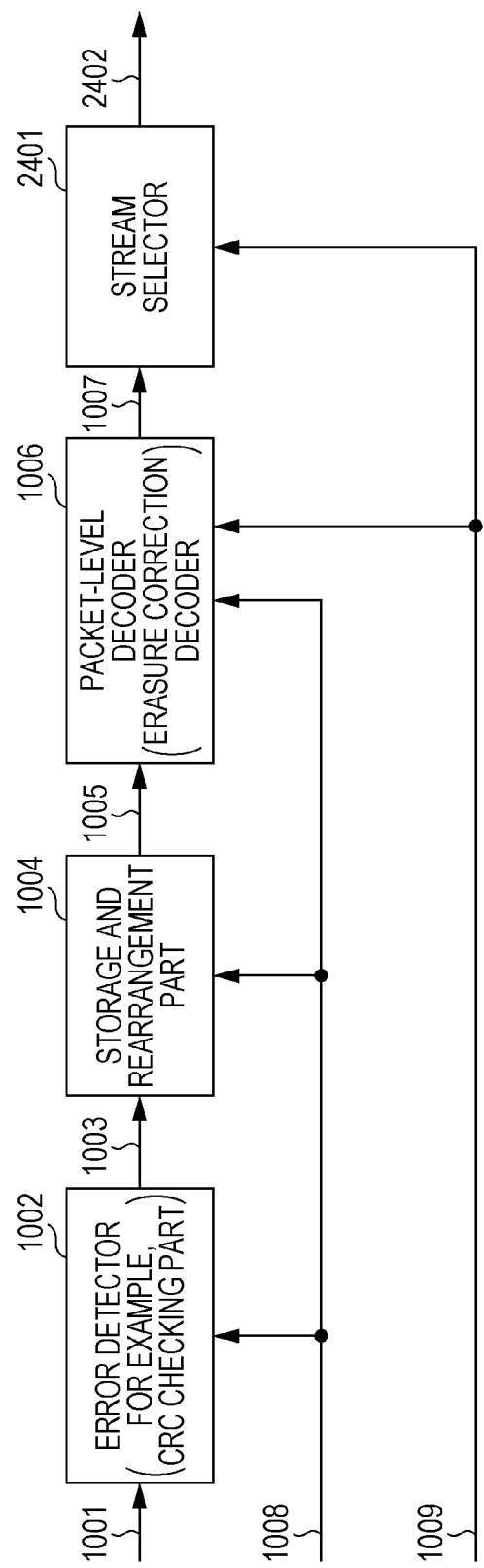
FIG. 24 illustrates a configuration example of a packet (or frame) processor.

The configuration of the receiving device that receives the signal transmitted by the transmission device is illustrated in FIG. 3. The configuration of packet (or frame) processor 315 in FIG. 3 is illustrated in FIG. 24, and a component that operates similarly to that in FIG. 10 is designated by a similar reference mark.

Received data 1001 and control information signal 1008 are input to error detector 1002, and error detector 1002 recognizes the packet configuration of received data 1001 based on, for example, information (such as the information about the packet length and the information about the order of the packet) about the packet configuration of control information signal 1008, performs the error detection of the packet based on the recognized configuration, and outputs post-error-detection packet 1003.

Post-error-detection packet 1003 and control information signal 1008 are input to storage and rearrangement part 1004, and storage and rearrangement part 1004 stores post-error-detection packet 1003 based on information (such as the information about the packet length, the information about the order of the packet, the code length of the error (erasure) correction code, and the coding rate of the error (erasure) correction code) about the packet configuration of the control information signal, performs the rearrangement, and outputs rearranged data 1005.

Rearranged data 1005, control information signal 1008, and control signal 1009 are input to packet-level decoder (erasure correction decoder) 1006, and packet-level decoder (erasure correction decoder) 1006 performs the packet-level decoding on rearranged data 1005 based on information (such as the information about the packet length, the information about the order of the packet, the code length of the error (erasure) correction code, and the coding rate of the error (erasure) correction code) about the packet configuration of control information signal 1008. For example, packet-level decoder (erasure correction decoder) 1006 performs the decoding corresponding to one of FIGS. 23A, 23B, and 23C, and outputs data 1007.

Packet-level decoder (erasure correction decoder) 1006 may output the information packet as data 1007, or output both the information packet and the parity packet. Packet-level decoder (erasure correction decoder) 1006 may determine whether the packet-level decoding is performed using control signal 100. For example, the packet-level decoding method is already described with reference to FIG. 12 in the first exemplary embodiment.

Data 1007 and control signal 1009 are input to stream selector 2401. Data 1007 has a packet configuration as illustrated in one of FIGS. 23A, 23B, and 23C. For the packet configuration in FIG. 23B or 23C, stream selector 2401 extracts the desired packet from data 1007 based on control signal 1009, and outputs selection packet 2402.

Stream selector 2401 does not always select one stream, but may select at least two streams. For example, in the case that the user selects the stream of video #1 as the desired stream with respect to the reception device (terminal), stream selector 2401 extracts and outputs the packet of the stream of video #1. In the case that the user selects the stream of video #1 and the stream of video #2 as the desired stream with respect to the reception device (terminal), stream selector 2401 extracts and outputs the packet of the stream of video #1 and the packet of the stream of video #2. That is, stream selector 2401 may select at least two streams.

An advantageous effect of the use of the packet configuration in FIGS. 22, 23A, 23B, 23C, and 24, the packet transmission method, and the packet decoding method will be described below.

In the terminal, a delay (time necessary to begin application processing) of the video stream mainly depends on a coding rate of the video stream and an information length of the error (erasure) correction code. Accordingly, after the coding rate of the video stream is decided, the delay of the video stream depends on the information length of the error (erasure) correction code.

In the transmission device, when the case that the coding in FIG. 23A is performed, the delay generated in the stream of video #1 is considered as a coding condition, and the information length of the error (erasure) correction code is decided. In the transmission device, it is conceivable that the block length of the error (erasure) correction code, namely, the information length is increased as a method for improving the reception quality of the stream of video #1. However, due to an increase in delay of the video stream, it is necessary to deal with the increase in information length.

In FIG. 23A, the coding is performed on the packet of the stream of video #1. Time necessary to code the packet of the stream of video #1 falls within a predetermined delay range because the time necessary to code the packet of the stream of video #1 is shorter than the time necessary to begin application processing.

Then, as described above, the transmission device codes the packet of the stream of video #1 and the packet of the stream of video #2 in FIG. 23B using the coding condition in FIG. 23A to output one sequence of the parity packet. That is, one sequence of 2h parity packets is output with respect to the packet in which two sequences of n information packets are coupled together, so that a delay for the stream of video #1 in the reception device and a delay for the stream of video #2 in the reception device can fall within a predetermined delay range similarly to the delay in the reception device of FIG. 23A.

In FIG. 23B, the code length (or information length) of the error (erasure) correction code is longer than the packet length of each stream, so that the reception quality can be improved in the reception device.

Similarly, in FIG. 23C, in the transmission device, a delay for each video stream in the reception device falls within a predetermined range, and the erasure correction capacity can be improved.

A modification in FIGS. 23A, 23B, and 23C will be described below.

For example, in FIG. 23A, the coding is performed on the packet of the stream of video #1. In the reception device, the time necessary to code the packet of the stream of video #1 falls within a predetermined delay range because the time necessary to code the packet of the stream of video #1 is shorter than the time necessary to begin application processing.

At this point, for example, the information length of the error (erasure) correction code (block code) to be used is set to 1440 bits as a condition that the information length falls within a predetermined delay range in the reception device.

In FIG. 23B, the error (erasure) correction coding is performed while the packet of the stream of video #1 and the packet of the stream of video #2 are coupled together. The coding is performed while the packet of the stream of video #1 and the packet of the stream of video #2 are coupled together.

At this point, the information length of the error (erasure) correction code (block code) to be used is increased larger than 1440 bits, and set to 1440×2=2880 bits or less (or less than 2880 bits). The reason 1440 is doubled is that the number of streams is 2.

Therefore, the delay for the stream of video #1 in the reception device and the delay for the stream of video #2 in the reception device can be set small.

In order to further decrease the delay for the stream of video #1 in the reception device and the delay for the stream of video #2 in the reception device, the number of bits of the information about the stream of video #1 is set to 1440 bits or less, the number of bits of the information about the stream of video #2 is set to 1440 bits or less, and the error (erasure) correction coding is performed while the information about the stream of video #1 having 1440 bits or less and the information about the stream of video #2 having 1440 bits or less are coupled together. At this point, because the erasure correction capacity is improved, the reception device can obtain the high reception quality of the data.

This point is generalized as follows.

In FIG. 23A, the coding is performed on the packet of the stream of video #1. In the reception device, the information length of the error (erasure) correction code (block code) to be used is set to Z (Z is an integer of 1 or more) bits as the condition that the information length falls within the predetermined delay range.

In FIG. 23C, the error (erasure) correction coding is performed while the packet of the stream of video #1 to the packet of the stream of video #u are coupled together. The coding is performed in the order of the packet of the stream of video #1, the packet of the stream of video #2, . . . , the packet of the stream of video #u.

At this point, in the reception device, the information length of the error (erasure) correction code (block code) to be used is increased larger than Z bits, and set to (Z×u) bits or less (or less than (Z×u) bits) as the condition that the information length falls within the predetermined delay range. The Z bits are set u-fold based on the number of streams u. Therefore, the delay for each stream in the reception device can be set small.

In order to decrease the delay for each stream in the reception device, the number of bits of the information about each stream is set to Z bits or less (the numbers of bits of the pieces of information about all the streams are set to Z bits or less), and the error (erasure) correction coding is performed while the pieces of information about all the streams, each of which has Z bits or less, are coupled together. At this point, because the erasure correction capacity is improved, the reception device can obtain the high reception quality of the data.

The coding is performed and the delay in the reception device is decreased as described above. Therefore, a switching time can advantageously be shortened when the user switches the video stream.

As described above with reference to FIGS. 23B and 23C, the transmission device performs the error (erasure) correction coding while bundling the plurality of video streams up, and the reception device performs the erasure correction decoding (packet-level decoding) on the codeword in which the plurality of video streams are coupled together. Therefore, because the reception device can select the packet of the desired video stream in the plurality of video streams, the delay in the reception device can be decreased, and the high erasure correction capacity can be obtained.

As described in the first exemplary embodiment, packet-level decoder (erasure correction decoder) 1006 in FIG. 24 performs the maximum likelihood decoding (for example, the Gaussian elimination) after the BP decoding. At this point, for example, the reception device performs the packet-level decoding in FIG. 25 or 26.

Figure 25:
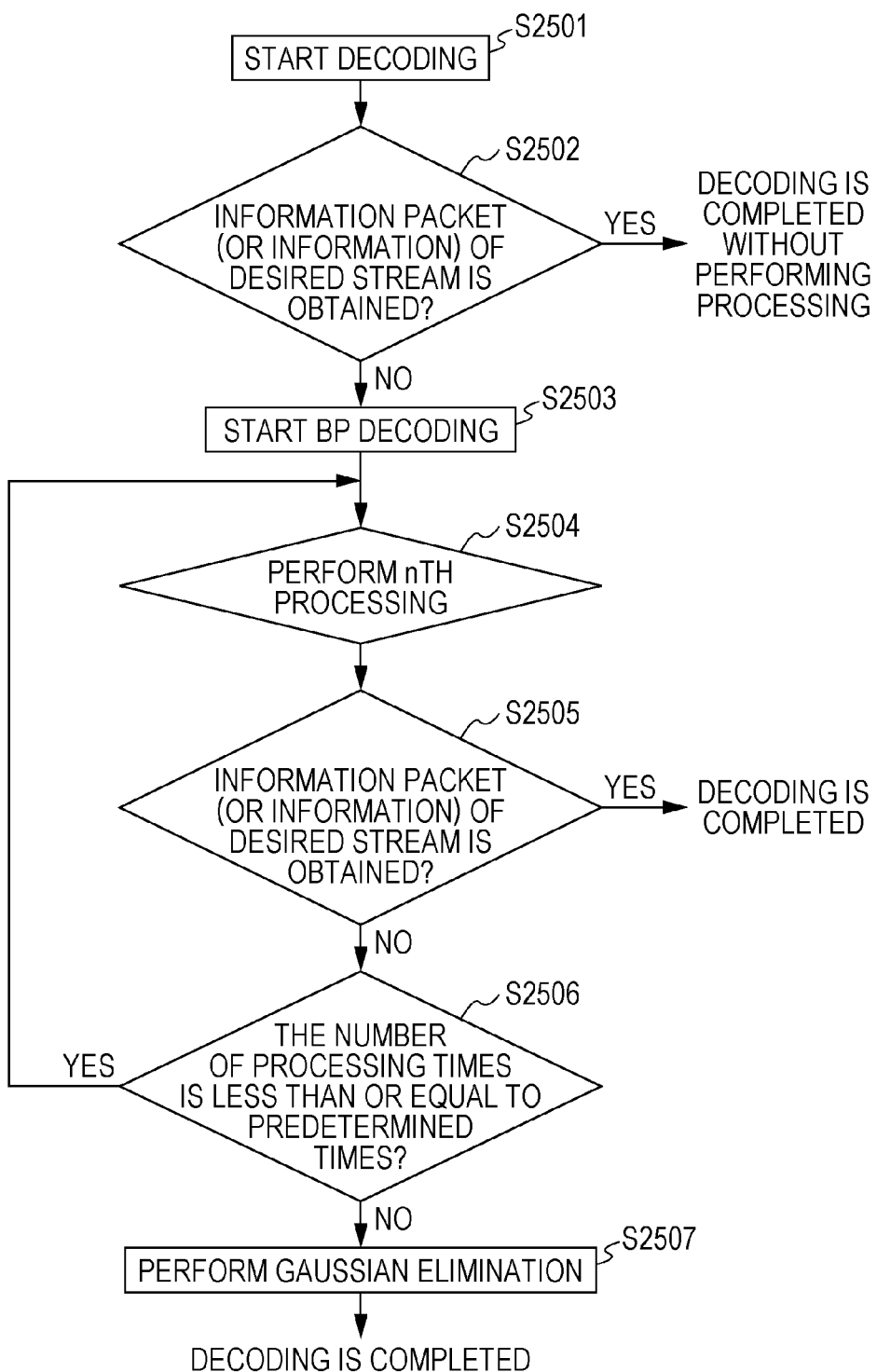
FIG. 25 is a flowchart illustrating an operation example of a packet-level decoder.

FIG. 25 is a flowchart illustrating an example of operation of packet-level decoder 1006 in the second exemplary embodiment. For example, one of controller 1207, BP decoder 1201, maximum likelihood decoder 1204, and selector 1209 in FIG. 12 makes the determination of the flowchart.

An example of the procedure will be described below. However, in the flowchart of FIG. 25, it is assumed that the received data is subjected to the packet-level error (erasure) correction coding.

(Step S2501) Controller 1207 issues an instruction of "decoding start" to each part. For example, control information signal 1206 makes the determination of "decoding start".

(Step S2502) For example, in the case that the received data is coded as illustrated in FIGS. 23B and 23C, controller 1207 or BP decoder 1202 determines "whether the information packet (or information) of the desired stream is obtained". For example, in the case that the terminal makes a request of the information about the stream of video #2, controller 1207 or BP decoder 1202 determines whether the information packet (or) information about the stream of video #2 is obtained.

When all the information packets (or all the pieces of information) of the desired stream are obtained (YES in S2502), BP decoder 1202 does not perform the error (erasure) correction decoding (the decoding processing is omitted). Accordingly, selector 1209 in FIG. 12 outputs received data 1201 or the information about the desired stream extracted from received data 1201 as selected data 1210.

When all the information packets (or all the pieces of information) of the desired stream are not obtained (NO in S2502), BP decoder 1202 starts the BP decoding. That is, BP decoder 1202 in FIG. 12 starts the BP decoding of received data 1201.

When all the information packets (or all the pieces of information) of the desired stream are obtained (YES in S2502), the decoding processing is completed and output to selector 1209 (the decoding processing is omitted). Therefore, the calculation scale (the number of calculation times) of BP decoder 1202 can be reduced, and the power consumption of BP decoder 1202 can be reduced.

(Step S2503) BP decoder 1202 starts the counting of the number of iteration after starting the BP decoding. The maximum value of the number of iteration is set to Nmax.

(Step S2504) BP decoder 1202 checks whether the number of iteration n is smaller than Nmax. When the number of iteration n is smaller than Nmax, BP decoder 1202 performs the decoding processing of the number of iteration n.

Then, BP decoder 1202 determines "whether all the information packets (or all the pieces of information) of the desired stream are obtained" with respect to the data obtained through the nth iterative decoding processing (step S2505). When all the information packets (or all the pieces of information) of the desired stream are obtained (YES in S2505), BP decoder 1202 completes the BP decoding, and outputs post-BP-decoding received sequence 1203 to selector 1209. Selector 1209 in FIG. 12 outputs post-BP-decoding received sequence 1203 or information about the desired stream extracted from post-BP-decoding received sequence 1203 as selected data 1210. When all the information packets (or all the pieces of information) of the desired stream are not obtained (NO in S2505), the nth iterative decoding processing is completed.

(Step S2506) BP decoder 1202 checks whether the number of iteration is smaller than Nmax. When the number of iteration is smaller than Nmax (YES in S2506), the processing returns to S2503, and performs iteration on (n+1)th decoding processing.

When the number of iteration becomes Nmax (NO in S2506), BP decoder 1202 completes the iterative decoding processing, and outputs the post-BP-decoding received sequence in which all the information packets (or all the pieces of information) of the desired stream are not obtained to maximum likelihood decoder 1204.

(Step S2507) The post-BP-decoding received sequence in which all the information packets (or all the pieces of information) of the desired stream are not obtained is input to maximum likelihood decoder 1204, and maximum likelihood decoder 1204 performs the decoding on the post-BP-decoding received sequence by, for example, the Gaussian elimination, and outputs post-maximum-likelihood-decoding received sequence 1205 to selector 1209.

Selector 1209 in FIG. 12 outputs post-BP-decoding received sequence 1203 or information about the desired stream extracted from post-BP-decoding received sequence 1203 as selected data 1210. When all the information packets (or all the pieces of information) of the desired stream are not obtained, post-BP-decoding received sequence 1203 is output.

When all the information packets (or all the pieces of information) of the desired stream are obtained, the decoding processing is completed (the iterative decoding processing is omitted). Therefore, the calculation scale of the decoder can be reduced, and the power consumption of the decoder can be reduced.

Another example which is different from that in FIG. 25, of the operation of packet-level decoder 1006 in FIG. 12 will be described below with reference to FIG. 26.

Figure 26:
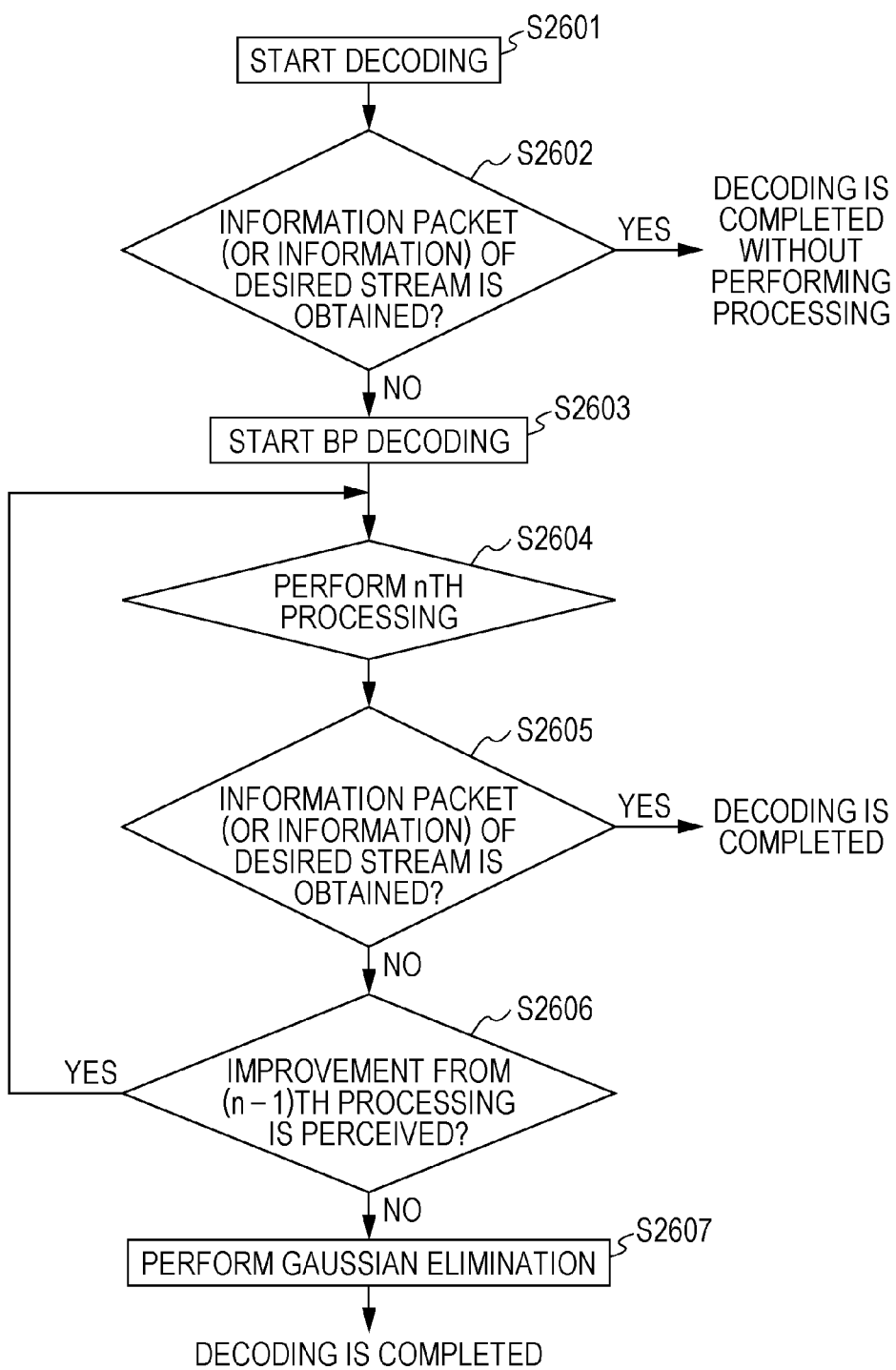
FIG. 26 is a flowchart illustrating an operation example of the packet-level decoder.

FIG. 26 is a flowchart of packet-level decoder 1006 in the second exemplary embodiment. For example, one of controller 1207, BP decoder 1201, maximum likelihood decoder 1204, and selector 1209 in FIG. 12 makes the determination of the flowchart.

An example of the procedure will be described below. However, in the flowchart of FIG. 26, it is assumed that the received data is subjected to the packet-level error (erasure) correction coding.

(Step S2601) Controller 1207 issues an instruction of "decoding start" to each part (for example, control information signal 1211 makes the determination of "decoding start").

(Step S2602) For example, in the case that the received data is coded as illustrated in FIGS. 23B and 23C, controller 1207 or BP decoder 1202 determines "whether all the information packets (or all the pieces of information) of the desired stream are obtained".

When all the information packets (or all the pieces of information) of the desired stream are obtained (YES in S2602), BP decoder 1202 does not perform the error (erasure) correction decoding (the decoding processing is omitted). Accordingly, selector 1209 in FIG. 12 outputs received data 1201 or the information about the desired stream extracted from received data 1201 as selected data 1210.

When all the information packets (or all the pieces of information) of the desired stream are not obtained (NO in S2602), BP decoder 1202 starts the BP decoding. That is, BP decoder 1202 in FIG. 12 starts the BP decoding of received data 1201.

When all the information packets (or all the pieces of information) of the desired stream are obtained (YES in S2602), the decoding processing is completed and output to selector 1209 (the decoding processing is omitted). Therefore, the calculation scale (the number of calculation times) of BP decoder 1202 can be reduced, and the power consumption of BP decoder 1202 can be reduced.

(Step S2603) BP decoder 1202 starts the counting of the number of iteration n after starting the BP decoding.

(Step S2603) BP decoder 1202 performs the decoding processing at an nth iteration.

(Step S2605) BP decoder 1202 determines "whether all the information packets (or all the pieces of information) of the desired stream are obtained" with respect to the data obtained through the nth iterative decoding processing. When all the information packets (or all the pieces of information) of the desired stream are obtained (YES in S2605), BP decoder 1202 completes the BP decoding, and outputs post-BP-decoding received sequence 1203 to selector 1209. Selector 1209 outputs the information about the desired stream extracted from post-BP-decoding received sequence 1203 as selected data 1210.

When all the information packets (or all the pieces of information) of the desired stream are not obtained (NO in S2605), the nth iterative decoding is completed.

When all the information packets (or all the pieces of information) of the desired stream are obtained, BP decoder 1202 completes the decoding processing. Therefore, the calculation scale (the number of calculation times) of BP decoder 1202 can be reduced, and the power consumption of BP decoder 1202 can be reduced. Although the term "counting the number of iteration" is described, the number of iteration is not necessarily counted.

(Step S2606) BP decoder 1202 compares the data obtained through the (n−1)th iterative decoding processing to the data obtained through the nth iterative decoding processing. When the data obtained through the (n−1)th decoding processing is identical to the data obtained through the nth decoding processing (NO in S2606), because the effect of the error (erasure) correction is not obtained any more even if the iterative decoding processing is performed, the iterative decoding processing is ended, and the post-BP-decoding received sequence in which all the information packets (or all the pieces of information) of the desired stream are not obtained is output to maximum likelihood decoder 1204.

When the data obtained through the (n−1)th decoding processing is different from the data obtained through the nth processing (the data in which the error (erasure) correction is newly performed through the nth iterative decoding processing exists) (YES in S2606), the (n+1)th iterative decoding processing is performed.

(Step S2607) The post-BP-decoding received sequence in which all the information packets (or all the pieces of information) of the desired stream are not obtained is input to maximum likelihood decoder 1204, and maximum likelihood decoder 1204 performs the decoding on the post-BP-decoding received sequence by, for example, the Gaussian elimination, and outputs post-maximum-likelihood-decoding received sequence 1205 to selector 1209.

As described above, in the method of the second exemplary embodiment, the transmission device bundles the plurality of video stream up, and performs the error (erasure) correction coding, and the reception device performs the erasure correction decoding (packet-level decoding), and selects the packet of the desired video stream in the plurality of video streams. Therefore, the high erasure correction capacity can be obtained while the delay is decreased in the reception device.

In the second exemplary embodiment, by way of example, the sum-product decoding is described as the BP decoding, and the Gaussian elimination is described as the maximum likelihood decoding. However, the present disclosure is not limited to the sum-product decoding and the Gaussian elimination. Alternatively, for example, min-sum decoding may be adopted as the BP decoding, and Gauss-Jordan elimination, a Gauss-Seidel method, and LU decomposition may be adopted as the maximum likelihood decoding (for the maximum likelihood decoding, an operation to solve simultaneous equations is performed).

In the second exemplary embodiment, the case where the packet-level coding is performed is described. However, the transmission device may have a transmission mode in which the packet (data) is transmitted while the packet-level coding is omitted. The transmission device switches between the mode in which the packet-level coding is performed and the mode in which the packet-level coding is omitted, and transmits the data.

Third Exemplary Embodiment

In a third exemplary embodiment, a description will be given of an example of a transmission method in which both the packet to which the packet-level error (erasure) correction coding method of the first and second exemplary embodiments is applied, and the packet (or information) to which the packet-level error (erasure) correction coding is not applied yet exist.

Figure 27:
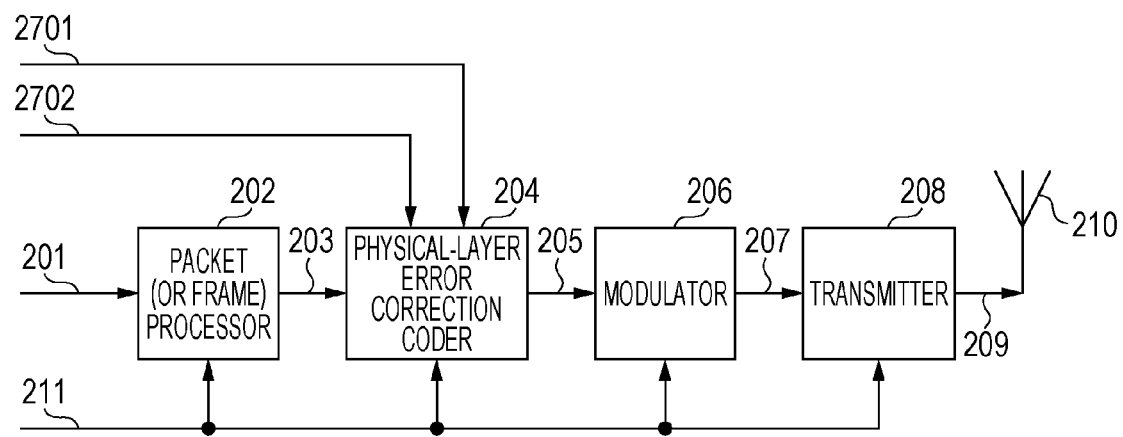
FIG. 27 illustrates a configuration example of the transmission device.

FIG. 27 illustrates a configuration example of a transmission device of a transmission station, and a component operating similarly to that in FIG. 2 is designated by the same reference mark.

FIG. 27 will be described. Post-packet (or -frame) processing data 203, control signal 211, packet (or information) 2701, and signal 2702 associated with the priority control are input to physical layer error correction coding 204, and physical layer error correction coding 204 decides a method for transmitting post-packet- (or frame-) processing data 203 and packet (or information) 2701 based on control signal 211 and signal 2702 associated with the priority control, performs (physical-layer) error correction coding, and outputs post-error-correction-coding data 205 to data 203. The method for transmitting post-packet- (or frame-) processing data 203 and packet (or information) 2701 will be described in detail below with reference to FIGS. 28, 29A, 29B and 30.

FIG. 28 illustrates a configuration example of the packet, which is input to a physical-layer error correction coder in FIG. 27, on a time axis (in FIG. 28, it is assumed that a horizontal axis indicates time).

Packet 1-#1(2801_1), packet 1-#2(2801_2), . . . , packet 1-#m(2801_m) and packet 2-#1(2802_1), packet 2-#2 (2802_2), . . . , packet 2-#m(2802_m) in FIG. 28 correspond to post-packet- (or frame-) processing data 203 in FIG. 27. Post-packet- (or frame-) processing data 203 is subjected to the packet-level error (erasure) correction coding. Packet $1(28_1), packet $2(28_2), . . . , packet $n(28_n) in FIG. 28 correspond to packet (or information) 2701 in FIG. 27. The packet-level error (erasure) correction coding may be either performed or not performed on packet (or information) 2701.

The input of "packet $1(28_1), packet $2(28_2), . . . , packet $n(28_n)" in FIG. 28 to physical-layer error correction coder 204 is completed later in time than "packet 1-#1(2801_1), packet 1-#2(2801_2), . . . , packet 1-#m(2801_m) and packet 2-#1(2802_1), packet 2-#2 (2802_2), . . . , packet 2-#m(2802_m)". Signal 2702 associated with the priority control includes information indicating whether "packet $1(28_1), packet $2(28_2), . . . , packet $n(28_n)" are the packet with high urgency (the packet should preferentially be delivered to the terminal).

FIGS. 29A and 29B illustrate an example of the data output on the time axis of the post-error-correction-coding data output from physical-layer error correction coder 204 in FIG. 27. A horizontal axis indicates time.

In the data input of FIG. 28, signal 2702 associated with the priority control includes the information indicating that "packet $1(28_1), packet $2(28_2), . . . , packet $n(28_n)" are the packet with high urgency (the packet should preferentially be delivered to the terminal).

Physical-layer error correction coder 204 outputs not "packet 1-#1(2801_1), packet 1-#2(2801_2), . . . , packet 1-#m(2801_m) and packet 2-#1(2802_1), packet 2-#2 (2802_2), . . . , packet 2-#m(2802_m)", but "packet $1(28_1), packet $2(28_2), . . . , packet $n(28_n)" as a first method in FIG. 29A.

"Packet $1(28_1), packet $2(28_2), . . . , packet $n(28_n)" are post-error-correction coding data 205 in the physical layer.

In FIG. 29A, physical-layer error correction coder 204 adds control information 2900, and control information 2900 includes the information indicating the packet with high urgency (the packet should preferentially be delivered to the terminal).

Physical-layer error correction coder 204 outputs "packet $1(28_1), packet $2(28_2), . . . , packet $n(28_n)", which are the packet with high urgency (the packet should preferentially be delivered to the terminal), before outputting "packet 1-#1(2801_1), packet 1-#2(2801_2), . . . , packet 1-#m(2801_m) and packet 2-#1(2802_1), packet 2-#2 (2802_2), . . . , packet 2-#m(2802_m)" as a second method in FIG. 29B.

Packet $1(28_1), packet $2(28_2), . . . , packet $n(28_n) are post-error-correction coding data 205 in the physical layer.

In FIG. 29B, physical-layer error correction coder 204 adds control information 2900, and control information 2900 includes the information indicating the packet with high urgency (the packet should preferentially be delivered to the terminal).

Therefore, advantageously, the transmission device can properly transmit the information with high urgency to the terminal device.

Figure 30:
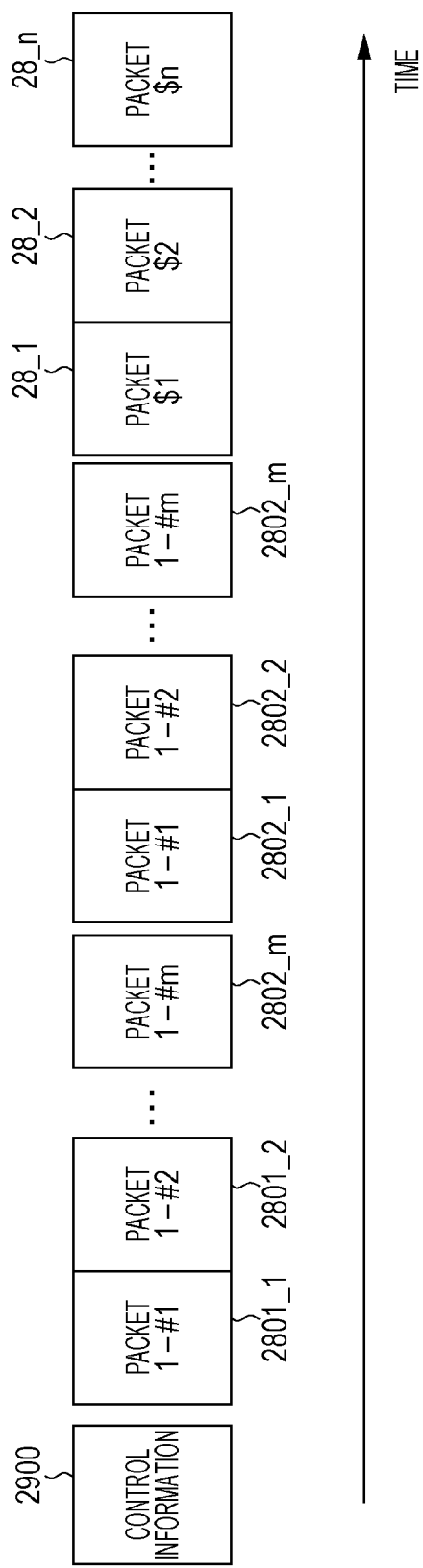
FIG. 30 illustrates an example of the output on the time axis of the post-error-correction-coding data output from the physical-layer error correction coder in FIG. 27.

Depending on the frame configuration of the modulation signal transmitted from the transmission device, in addition to FIG. 29B, it is not necessary for the transmission device to transmit "packet $1(28_1), packet $2(28_2), . . . , packet $n(28_n)" earlier in time as illustrated in FIG. 30. In FIG. 30, control information 2900 also includes the information indicating that the data with high urgency is included.

Figure 31:
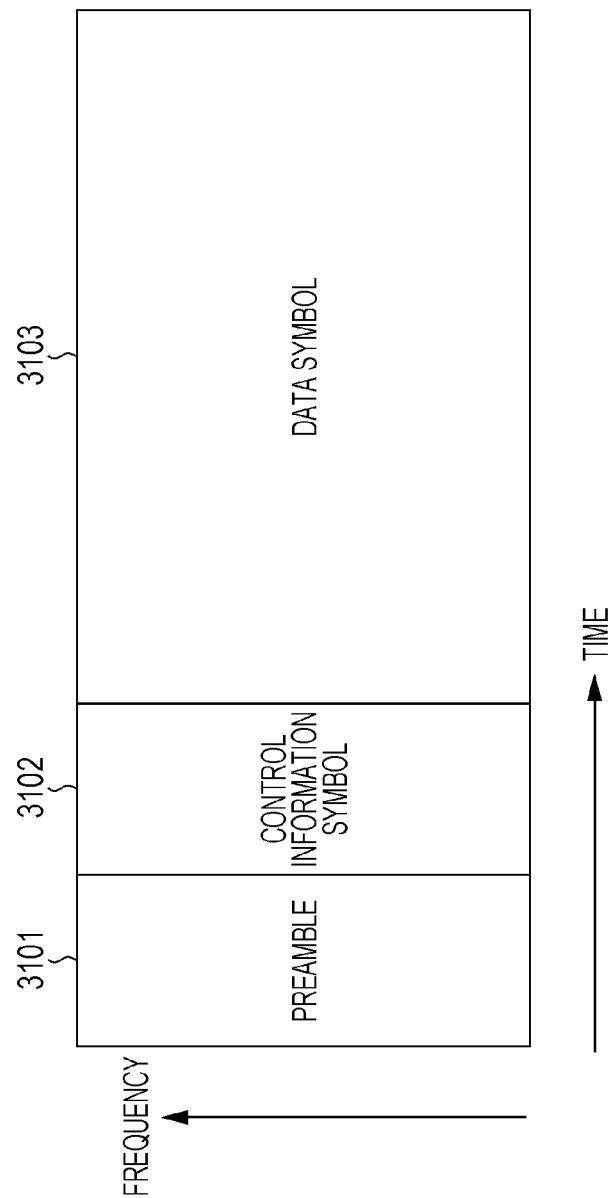
FIG. 31 illustrates a configuration example of a frame of a modulation signal transmitted from the transmission device of the transmission station.

FIG. 31 illustrates an example of the frame configuration of the modulation signal transmitted from the transmission device of the transmission station. In FIG. 31, a horizontal axis indicates time, and a vertical axis indicates a frequency. For example, FIG. 31 illustrates the frame configuration in which a multi-carrier scheme such as OFDM scheme is adopted.

In FIG. 31, for example, preamble 3101 includes a symbol indicating that the terminal and the transmission station perform adjustments to time and frequency synchronization, a symbol indicating that the terminal detects a modulation signal, and a symbol indicating that the terminal estimates a channel variation.

For example, control information symbol 3102 includes information about a modulation scheme, information about a physical-layer error correction coding scheme (such as a type of a code, a code length, and a coding rate), the information about packet-level error (erasure) correction coding (such as a type of a code, a code length, and a coding rate), and the information about the data with high urgency (the information indicating whether the data with high urgency is included or information designating the packet of the data with high urgency).

Data symbol 3103 is one used to transmit the information. Although a pilot symbol (reference symbol) indicating that the terminal estimates the channel variation is not described in FIG. 31, the pilot symbol may be inserted in preamble 3101, control information symbol 3102, or data symbol 3103.

Figure 32:
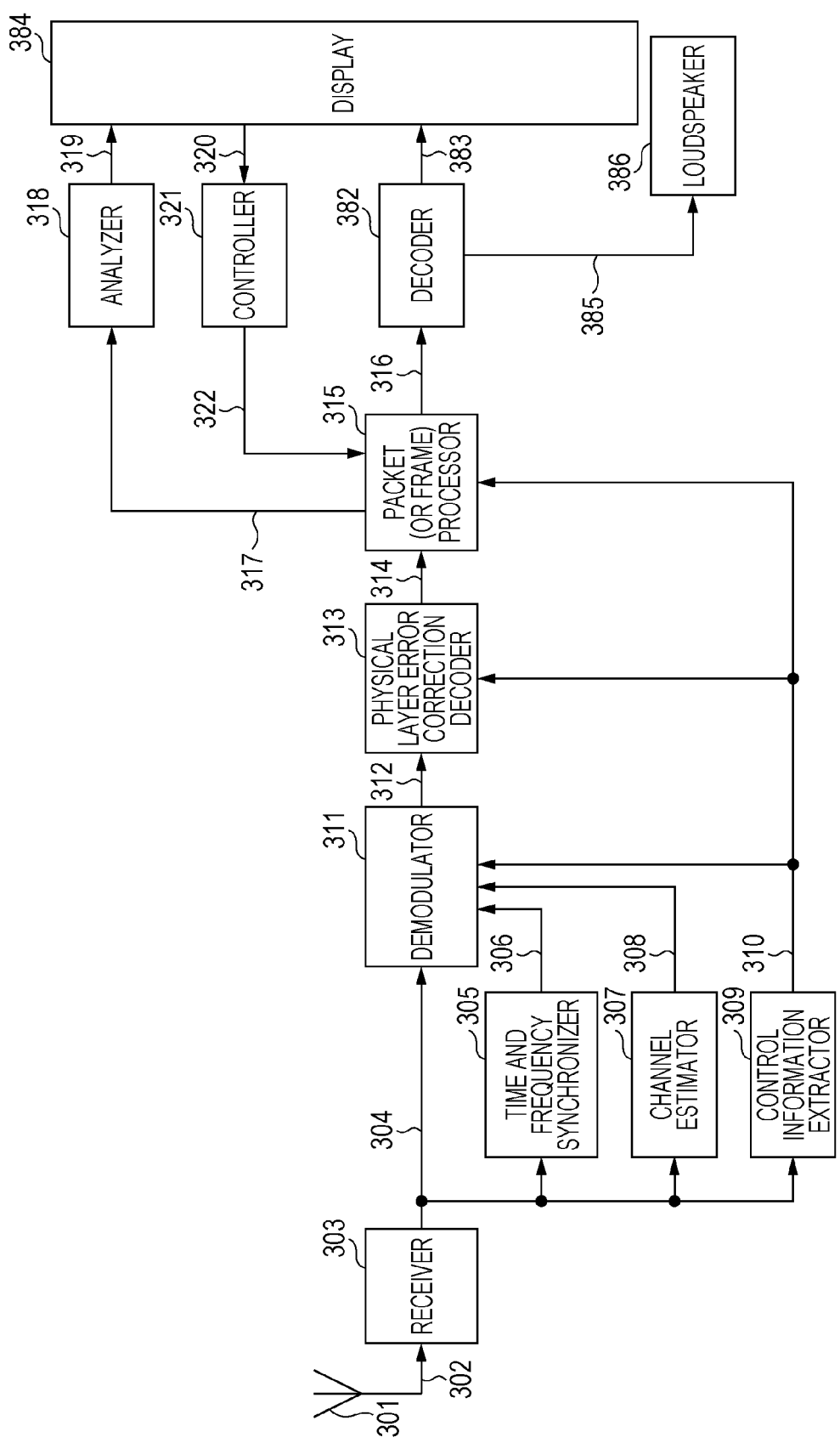
FIG. 32 illustrates a configuration example of the reception device.

FIG. 32 illustrates a configuration example of the reception device of the terminal. In FIG. 32, a component operating similarly to that in FIG. 3 is designated by the same reference mark, and the description is omitted.

When determining that the information with high urgency (the information should preferentially be delivered to the terminal) is included in information, which is included in control information signal 310 and indicates "whether the information with high urgency (the information should preferentially be delivered to the terminal) is included", packet (or frame) processor 315 preferentially processes the data with high urgency, and outputs data 316.

As described above, in the third exemplary embodiment, the data with high urgency (the data should preferentially be delivered to the terminal) is dealt with, so that advantageously, the transmission station can properly transmit the information with high urgency to the terminal.

Fourth Exemplary Embodiment

An example in which the repeater adopts the packet-level error (erasure) correction coding method of the first and second exemplary embodiments will be described in a fourth exemplary embodiment.

Figure 33:
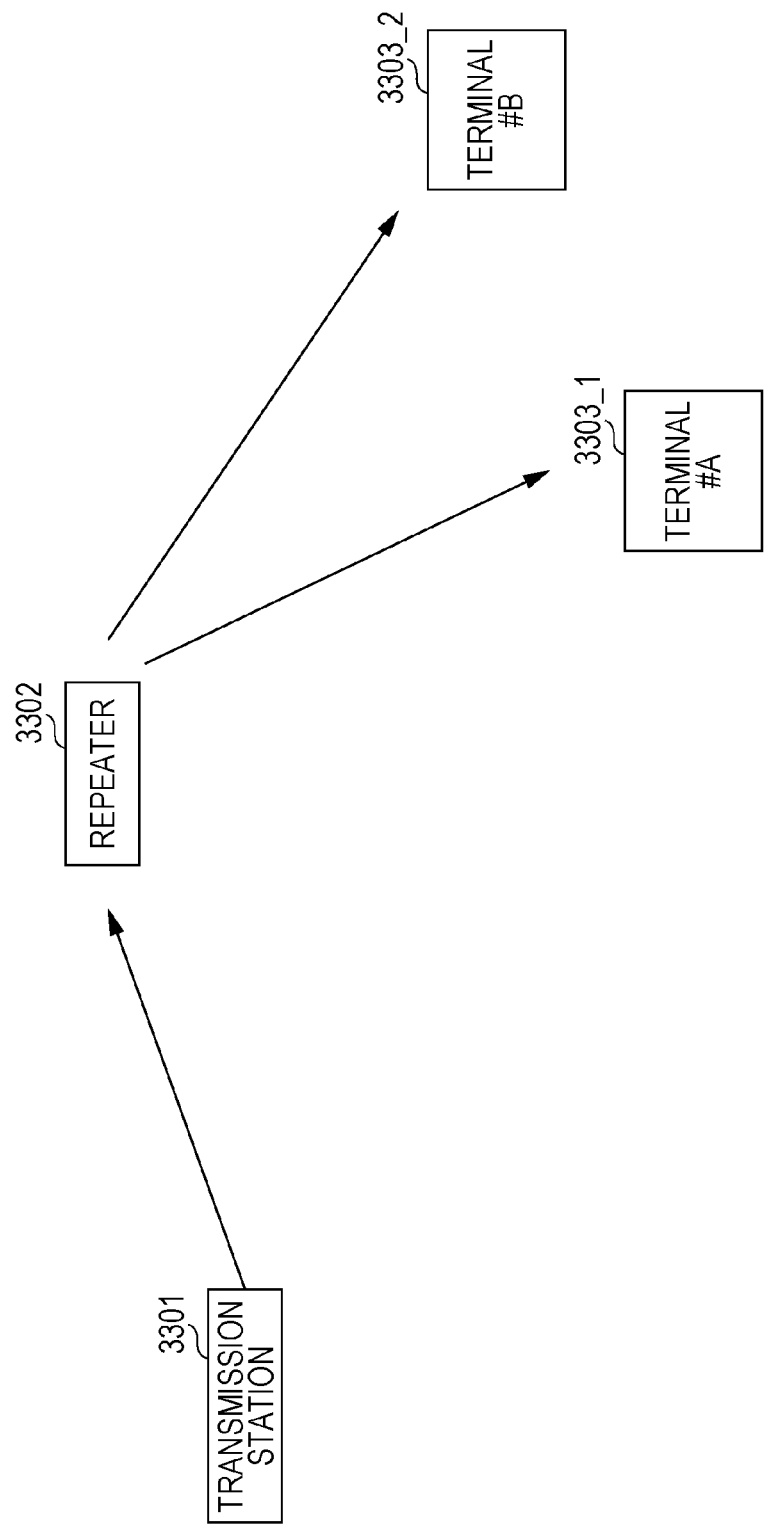
FIG. 33 illustrates an example of a system configuration in a fourth exemplary embodiment.

FIG. 33 illustrates an example of a system configuration in the fourth exemplary embodiment. For example, transmission station 3301 (see FIG. 2) transmits video (for example, a moving image or a still image) and/or audio data.

Repeater 3302 receives the video (for example, a moving image or a still image) and/or audio data transmitted from transmission station 3301, performs the signal processing, and transmits the video (for example, a moving image or a still image) and/or audio data.

Terminal #A(3303_1) and terminal #6(3303_2) receives the modulation signal transmitted from repeater 3302, and performs the signal processing to obtain the video (for example, a moving image or a still image) and/or audio data (see FIG. 3).

Although one repeater 3302 is illustrated in FIG. 33, a plurality of repeaters 3302 may be provided. Although two terminals are illustrated in FIG. 33, one terminal or at least three terminals may be provided.

Operation of transmission station 3301, repeater 3302, and terminals #A, #B will be described below. For example, the configuration of transmission station 3301 is illustrated in FIG. 2. For example, the frame configuration of the modulation signal transmitted from transmission station 3301 is illustrated in FIG. 31. Therefore, the description is omitted to avoid duplication.

Figure 34:
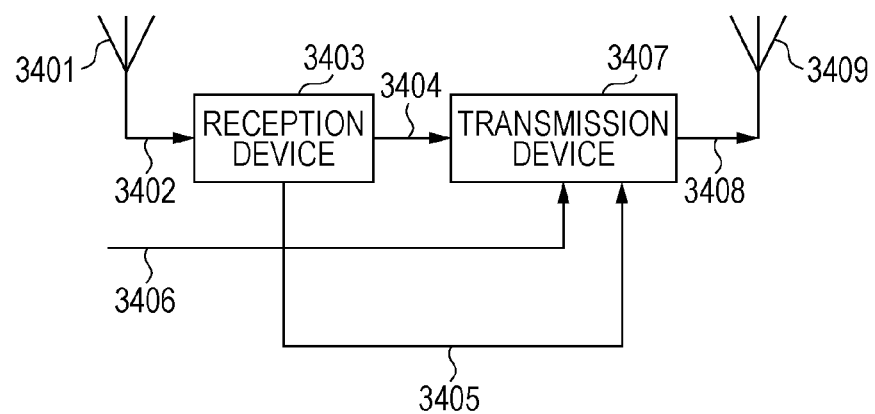
FIG. 34 illustrates a configuration example of a repeater.

FIG. 34 illustrates a configuration example of repeater 3302. Received signal 3402 received with antenna 3401 is input to reception device 3403, and reception device 3403 outputs data 3404 subjected to the signal processing and information 3405 about the data.

Data 3404, information 3405 about the data, and control signal 3406 are input to transmission device 3407, and transmission device 3407 outputs transmitted signal 3408 subjected to the signal processing. Transmitted signal 3408 is output as a radio wave from antenna 3409.

Figure 35:
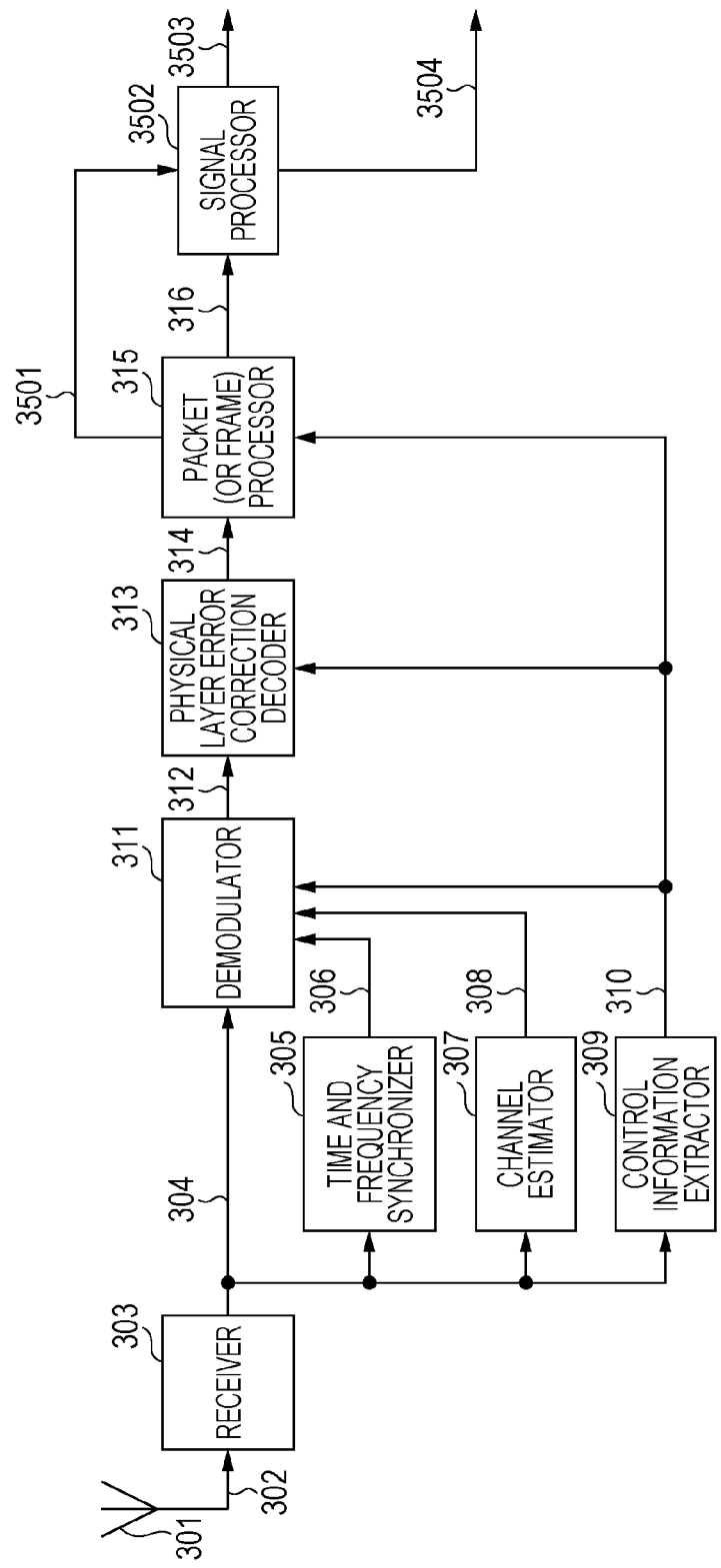
FIG. 35 illustrates a configuration example of a reception device of the repeater in FIG. 34.

FIG. 35 illustrates a configuration example of reception device 3403 in repeater 3302 of FIG. 34. In FIG. 35, a component operating similarly to that in FIG. 3 is designated by the same reference mark, and the description is omitted.

For example, in the case that the packet-level error (erasure) correction coding is performed on the packet of transmission station 3301 in FIG. 33, packet (or frame) processor 315 in FIG. 35 decodes the packet-level error (erasure) correction code, and outputs decoded data 316. Additionally, packet (or frame) processor 315 outputs state information 3501 about decoded data 316.

Decoded data 316 and state information 3501 about the decoded data are input to signal processor 3502, and signal processor 3502 performs the signal processing, and outputs post-signal-processing data 3503 and information 3504 associated with post-signal-processing data.

Figure 36:
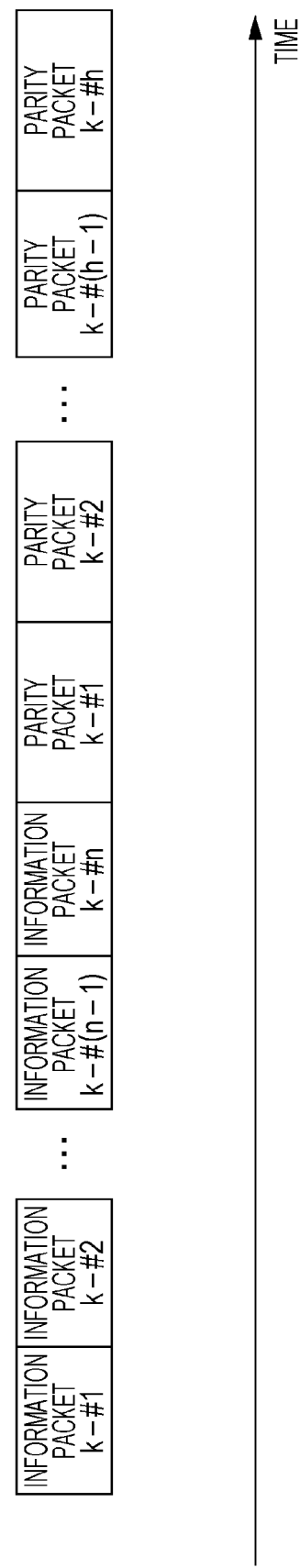
FIG. 36 illustrates an error correction coding method of the transmission device.

An operation example of reception device 3403 of repeater 3302 in FIG. 35 will be described below. For example, transmission station 3301 in FIG. 33 transmits a packet in FIG. 36. FIG. 36 illustrates a configuration example of a kth packet group (for example, k is an integer of 0 or more). The kth packet group includes n information packets (n is an integer of 2 or more) from "information packet k-#1" to "information packet k-#n" and h parity packets (h is an integer of 1 or more) from "parity packet k-#1" to "parity packet k-#h". Accordingly, in the packet-level error (erasure) correction coding, the h parity packets from "parity packet k-#1" to "parity packet k-#h" are obtained by the coding of the n information packets from "information packet k-#1" to "information packet k-#n". Each packet may include control information such as an error detection code and a packet number after the coding.

Figure 37:
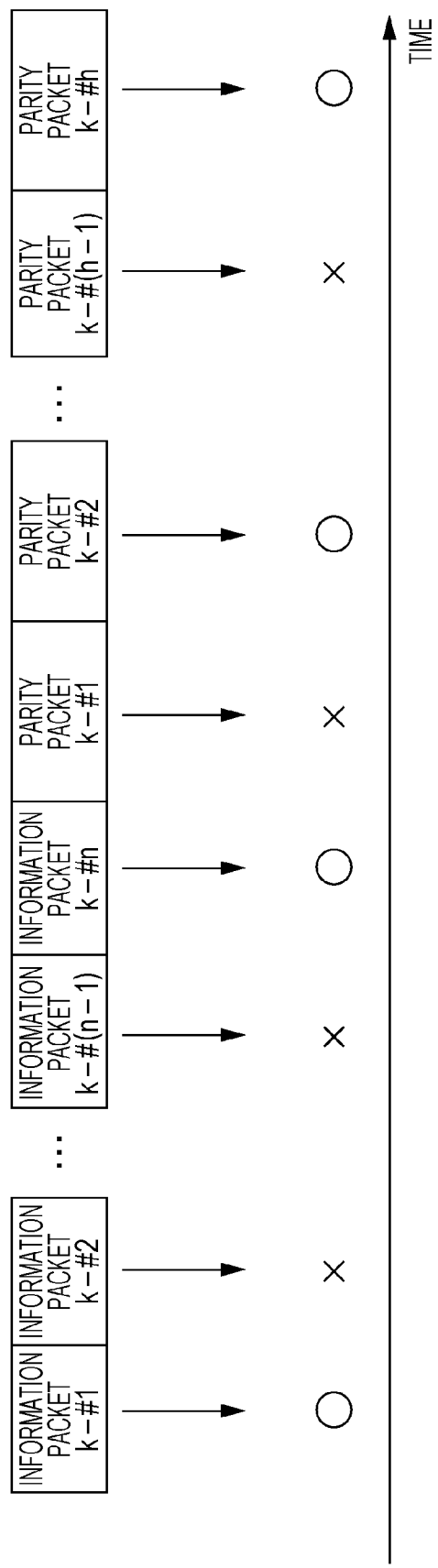
FIG. 37 illustrates an example of a reception state when the repeater in FIG. 33 receives a kth packet group in FIG. 36.

FIG. 37 illustrates an example of the reception state when repeater 3302 in FIG. 33 receives the kth packet group in FIG. 36. In FIG. 37, "information packet k-#1" described with "○" indicates that repeater 3302 receives the packet with no error.

"Information packet k-#2" described with "x" indicates that the packet cannot be obtained because an error is generated in repeater 3302 (an indefinite packet or a lost packet).

"Parity packet k-#(h−1)" described with "x" indicates that the packet cannot be obtained with repeater 3302 (an indefinite packet or a lost packet).

"Parity packet k-#h" described with "○" indicates that repeater 3302 receives the packet with no error.

The packet in the state of FIG. 37 is input to packet (or frame) processor 315 of reception device 3403 of repeater 3302 in FIG. 35, and packet (or frame) processor 315 performs the packet-level error (erasure) correction decoding on the packet.

(First Method)

Packet (or frame) processor 315 of reception device 3403 of repeater 3302 in FIG. 35 outputs n information packets from "information packet k-#1" to "information packet k-#n" in FIG. 37 as data 316 by performing the packet-level error (erasure) correction decoding. However, in data 316, the indefinite information packet is included in the n information packets from "information packet k-#1" to "information packet k-#n" depending on a result of the packet-level error (erasure) correction decoding. That is, data 316 includes an information packet, which is not obtained even if the erasure correction decoding is performed.

Accordingly, packet (or frame) processor 315 outputs information (information indicating whether the packet is obtained or indicating the indefinite packet) indicating the state of each information packet as state information 3501 about the data.

Data 316 and state information 3501 about the data are input to signal processor 3502, and signal processor 3502 outputs the information packet obtained from data 316 as post-signal-processing data 3503, and outputs state information 3501 about the data as information 3504 about the data.

Signal processor 3502 may delete the indefinite information packet, and output the post-deletion information as post-signal-processing data 3503. Alternatively, signal processor 3502 may output a virtual information packet in which the indefinite information packet is filled with the dummy data. The dummy data may be a regular data so as to be recognized as the dummy data.

In another method, data 316 and state information 3501 about the data are input to signal processor 3502, and signal processor 3502 may produce information from data 316. For example, in the case that data 316 is the video (and/or audio) stream, signal processor 3502 may perform the video decoding and coding, change a video compression method and/or a frame rate and/or a bit rate (compression ratio) and/or the number of pixels, produce the information, and output the information as post-signal-processing data 3503.

Figure 38:
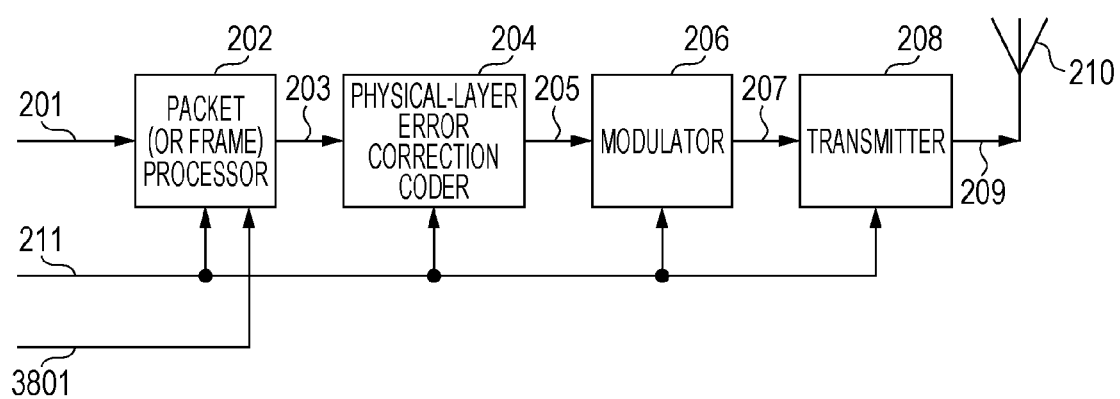
FIG. 38 illustrates a configuration example of a transmission device of the repeater in FIG. 34.

FIG. 38 illustrates a configuration example of transmission device 3407 of repeater 3302 in FIG. 34, and a component operating similarly to that in FIG. 2 is designated by the same reference mark.

For example, transmission device 3407 of repeater 3302 in FIG. 38 performs the packet-level error (erasure) correction coding in the case that repeater 3302 (simultaneously) transmits the data to the plurality of terminals as illustrated in FIG. 33 (for example, multi-carrier transmission).

Post-signal-processing data 3503 output from reception device 3403 of repeater 3302 in FIG. 35 corresponds to information 201 about transmission device 3407 of repeater 3302 in FIG. 38, and information 3504 about the data output from reception device 3403 of repeater 3302 in FIG. 35 corresponds to information 3801 about the data of transmission device 3407 of repeater 3302 in FIG. 38.

Information 201, control signal 211, and information 3801 about the data are input to packet (or frame) processor 202 in FIG. 38, and packet (or frame) processor 202 performs the packet-level error (erasure) correction coding on information 201, and outputs post-packet- (or frame-) processing data 203. In the case that control signal 211 indicates the omission of the packet-level error (erasure) correction coding, packet (or frame) processor 202 in FIG. 38 omits the packet-level error (erasure) correction coding, and outputs data 203.

A second method different from the first method will be described below.

(Second Method)

Packet (or frame) processor 315 of reception device 3403 of repeater 3302 in FIG. 35 outputs the n information packets from "information packet k-#1" to "information packet k-#n" and the h parity packets from "parity packet k-#1" to "parity packet k-#h" in FIG. 37 as data 316 by performing the packet-level error (erasure) correction decoding. However, in data 316, sometimes the indefinite information packet exists in the n information packets from "information packet k-#1" to "information packet k-#n" depending on a result of the packet-level error (erasure) correction decoding. That is, sometimes data 316 includes an information packet, which is not obtained even if the erasure correction decoding is performed. Sometimes the indefinite parity packet or the parity packet, which is not obtained even if the erasure correction decoding is performed, exists in the h parity packets from "parity packet k-#1" to "parity packet k-#h".

Accordingly, packet (or frame) processor 315 outputs information (information indicating whether the packet is obtained or indicating the indefinite packet) indicating the state of each information packet and the state of each parity packet as state information 3501 about the data.

Data 316 and state information 3501 about the data are input to signal processor 3502, and signal processor 3502 outputs the information packet and parity packet, which are obtained from data 316, as post-signal-processing data 3503, and outputs state information 3501 about the data as information 3504 about the data.

Signal processor 3502 may delete the indefinite information packet, and output the post-deletion data as post-signal-processing data 3503. In another method, signal processor 3502 may output a virtual information packet in which the dummy data is embedded to the indefinite information packet, or output virtual parity packet in which the dummy data is embedded to the indefinite parity packet. The dummy data may be a regular data so as to be recognized as the dummy data.

FIG. 38 illustrates a configuration example of transmission device 3407 of repeater 3302 in FIG. 34, and a component operating similarly to that in FIG. 2 is designated by the same reference mark.

For example, transmission device 3407 of repeater 3302 in FIG. 38 performs the packet-level error (erasure) correction coding in the case that repeater 3302 (simultaneously) transmits the data to the plurality of terminals as illustrated in FIG. 33 (for example, multi-carrier transmission).

Post-signal-processing data 3503 output from reception device 3403 of repeater 3302 in FIG. 35 corresponds to information 201 about transmission device 3407 of repeater 3302 in FIG. 38, and information 3504 about the data output from reception device 3403 of repeater 3302 in FIG. 35 corresponds to information 3801 about the data of transmission device 3407 of repeater 3302 in FIG. 38.

Information 201, control signal 211, and information 3801 about the data are input to packet (or frame) processor 202 in FIG. 38, and for example, packet (or frame) processor 202 performs the packet-level error (erasure) correction coding on information 201, and outputs post-packet- (or frame-) processing data 203. In the case that control signal 211 indicates the omission of the packet-level error (erasure) correction coding, packet (or frame) processor 202 in FIG. 38 omits the packet-level error (erasure) correction coding, and outputs data 203.

A third method different from the first and second methods will be described below.

(Third Method)

Packet (or frame) processor 315 of reception device 3403 of repeater 3302 in FIG. 35 omits the packet-level error (erasure) correction decoding.

Therefore, packet (or frame) processor 315 omits the packet-level error (erasure) correction decoding, and outputs the n information packets from "information packet k-#1" to "information packet k-#n" and the h parity packets from "parity packet k-#1" to "parity packet k-#h" in FIG. 37 as data 316. Accordingly, sometimes the indefinite information packet exists in the n information packets from "information packet k-#1" to "information packet k-#n", and sometimes the indefinite parity packet exists in the h parity packets from "parity packet k-#1" to "parity packet k-#h", namely, sometimes the information packet and parity packet, which are not obtained even if the erasure correction decoding is performed, exist in the n information packets from "information packet k-#1" to "information packet k-#n" and the h parity packets from "parity packet k-#1" to "parity packet k-#h".

Accordingly, packet (or frame) processor 315 outputs information (information indicating whether the packet is obtained or indicating the indefinite packet) indicating the state of each information packet and the state of each parity packet as state information 3501 about the data.

Data 316 and state information 3501 about the data are input to signal processor 3502, and signal processor 3502 outputs the information packet and parity packet, which are obtained from data 316, as post-signal-processing data 3503, and outputs state information 3501 about the data as information 3504 about the data.

Signal processor 3502 may delete the indefinite information packet, and output the post-deletion data as post-signal-processing data 3503. In another method, signal processor 3502 may output a virtual information packet in which the dummy data is embedded to the indefinite information packet, or output virtual parity packet in which the dummy data is embedded to the indefinite parity packet. The dummy data may be a regular data so as to be recognized as the dummy data.

FIG. 38 illustrates a configuration example of transmission device 3407 of repeater 3302 in FIG. 34, and a component operating similarly to that in FIG. 2 is designated by the same reference mark.

For example, transmission device 3407 of repeater 3302 in FIG. 38 performs the packet-level error (erasure) correction coding in the case that repeater 3302 (simultaneously) transmits the data to the plurality of terminals as illustrated in FIG. 33 (for example, multi-carrier transmission).

Post-signal-processing data 3503 output from reception device 3403 of repeater 3302 in FIG. 35 corresponds to information 201 about transmission device 3407 of repeater 3302 in FIG. 38, and information 3504 about the data output from reception device 3403 of repeater 3302 in FIG. 35 corresponds to information 3801 about the data of transmission device 3407 of repeater 3302 in FIG. 38.

Information 201, control signal 211, and information 3801 about the data are input to packet (or frame) processor 202 in FIG. 38, and packet (or frame) processor 202 performs the packet-level error (erasure) correction coding on information 201, and outputs post-packet- (or frame-) processing data 203.

As described above, transmission station 3301 in FIG. 33 performs the packet-level error (erasure) correction coding when transmitting the data to repeater 3302. Therefore, in the case that the plurality of repeaters 3302 exist, each repeater 3302 can obtain the high reception quality of the data against the variation of the environment of the communication from transmission station 3301 to repeater 3302 (for example, a radio wave propagation environment) while transmission station 3301 does not re-transmit the data. Additionally, repeater 3302 in FIG. 33 performs the packet-level error (erasure) correction coding when transmitting the data to the terminal. Therefore, in the case that the plurality of terminals 3303 exist, each terminal 3303 can obtain the high reception quality of the data against the variation of the environment of communication from repeater 3302 to terminal 3303 (for example, a radio wave propagation environment) while repeater 3302 does not re-transmit the data. Therefore, terminal 3303 is hardly influenced by the environment of the communication from transmission station 3301 to repeater 3302 and the environment of the communication from repeater 3302 to terminal 3303, so that terminal 3303 can obtain the high reception quality of the data.

In the fourth exemplary embodiment, the data is wirelessly transmitted by way of example. However, the present disclosure is not limited to this case, and the data can also be transmitted in a wired manner. In FIG. 33, transmission station 3301 may directly transmit the data to terminal 3303 with no use of repeater 3302. A frequency band of the modulation signal transmitted from transmission station 3301 may be identical to or different from a frequency band of the modulation signal transmitted from repeater 3302.

Fifth Exemplary Embodiment

In a fifth exemplary embodiment, a description will be given of another example in which repeater 3302 adopts the packet-level error (erasure) correction coding method of the first and second exemplary embodiments, the example being different from the example in the fourth exemplary embodiment.

FIG. 33 illustrates an example of a system configuration in the fourth exemplary embodiment. Because the operation is already described in the fourth exemplary embodiment, the description is omitted.

Operation of transmission station 3301, repeater 3302, and terminals #A, #B will be described below. For example, the configuration of transmission station 3301 is illustrated in FIG. 2. For example, the frame configuration of the modulation signal transmitted from transmission station 3301 is illustrated in FIG. 31. Therefore, the description is omitted to avoid duplication.

FIG. 34 illustrates a configuration example of repeater 3302. Because the operation is already described in the fourth exemplary embodiment, the description is omitted.

FIG. 35 illustrates an example of a detailed configuration of reception device 3403 in repeater 3302 of FIG. 34. In FIG. 35, a component operating similarly to that in FIG. 3 is designated by the same reference mark, and the description is omitted.

An operation example of reception device 3403 of repeater 3302 in FIG. 35 will be described below. For example, transmission station 3301 in FIG. 33 transmits a packet in FIG. 39B. FIG. 39B illustrates a configuration example of a kth packet group (for example, k is an integer of 0 or more). The configuration of the kth packet group includes g packets (g is an integer of 3 or more) from "packet k-#1" to "packet k-#g". Accordingly, in the packet-level error (erasure) correction coding, the g packets from "packet k-#1" to "packet k-#g" are obtained by the coding of the n information packets (n is an integer of 2 or more) from "information packet k-#1" to "information packet k-#n" in FIG. 39A. Each packet may include control information such as an error detection code and a packet number after the coding. The information packet and the parity packet are not distinguished from each other.

FIG. 40 illustrates an example of the reception state when repeater 3302 in FIG. 33 receives the kth packet group in FIG. 39B.

In FIG. 40, "packet k-#1" described with "○" indicates that repeater 3302 receives the packet with no error.

"Packet k-#2" described with "x" indicates that the packet cannot be obtained because an error is generated in repeater 3302 (an indefinite packet or a lost packet).

"Packet k-#(g−1)" described with "x" indicates that the packet cannot be obtained because an error is generated in repeater 3302 (an indefinite packet or a lost packet).

"Packet k-#g" described with "○" indicates that repeater 3302 receives the packet with no error.

The packet in the state of FIG. 40 is input to packet (or frame) processor 315 of reception device 3403 of repeater 3302 in FIG. 35, and packet (or frame) processor 315 performs the packet-level error (erasure) correction decoding on the packet.

(First Method)

Packet (or frame) processor 315 of reception device 3403 of repeater 3302 in FIG. 35 performs the packet-level error (erasure) correction decoding. Therefore, packet (or frame) processor 315 obtains the g packets from "packet k-#1" to "packet k-#g" in FIG. 39B, and outputs the n information packets from "information packet k-#1" to "information packet k-#n" in FIG. 39A as data 316. However, in data 316, the indefinite information packet is included in the n information packets from "information packet k-#1" to "information packet k-#n" depending on a result of the packet-level error (erasure) correction decoding. That is, data 316 includes an information packet, which is not obtained even if the erasure correction decoding is performed.

Accordingly, packet (or frame) processor 315 outputs information (information indicating whether the packet is obtained or indicating the indefinite packet) indicating the state of each information packet as state information 3501 about the data.

Data 316 and state information 3501 about the data are input to signal processor 3502, and signal processor 3502 outputs the information packet obtained from data 316 as post-signal-processing data 3503, and outputs state information 3501 about the data as information 3504 about the data.

Signal processor 3502 may delete the indefinite information packet, and output the post-deletion information as post-signal-processing data 3503. Alternatively, signal processor 3502 may output a virtual information packet in which the indefinite information packet is filled with the dummy data. The dummy data may be a regular data so as to be recognized as the dummy data.

In another method, data 316 and state information 3501 about the data are input to signal processor 3502, and signal processor 3502 may produce information from data 316. For example, in the case that data 316 is the video (and/or audio) stream, signal processor 3502 may perform the video decoding and coding, change a video compression method and/or a frame rate and/or a bit rate (compression ratio) and/or the number of pixels, produce the information, and output the information as post-signal-processing data 3503.

FIG. 38 illustrates a configuration example of transmission device 3407 of repeater 3302 in FIG. 34, and a component operating similarly to that in FIG. 2 is designated by the same reference mark.

For example, transmission device 3407 of repeater 3302 in FIG. 38 performs the packet-level error (erasure) correction coding in the case that repeater 3302 (simultaneously) transmits the data to the plurality of terminals as illustrated in FIG. 33 (for example, multi-carrier transmission).

Post-signal-processing data 3503 output from reception device 3403 of repeater 3302 in FIG. 35 corresponds to information 201 about transmission device 3407 of repeater 3302 in FIG. 38, and information 3504 about the data output from reception device 3403 of repeater 3302 in FIG. 35 corresponds to information 3801 about the data of transmission device 3407 of repeater 3302 in FIG. 38.

Information 201, control signal 211, and information 3801 about the data are input to packet (or frame) processor 202 in FIG. 38, and for example, packet (or frame) processor 202 performs the packet-level error (erasure) correction coding on information 201, and outputs post-packet- (or frame-) processing data 203. In the case that control signal 211 indicates the omission of the packet-level error (erasure) correction coding, packet (or frame) processor 202 in FIG. 38 omits the packet-level error (erasure) correction coding, and outputs data 203.

A second method different from the first method will be described below.

(Second Method)

Packet (or frame) processor 315 of reception device 3403 of repeater 3302 in FIG. 35 outputs the g packets from "packet k-#1" to "packet k-#g" in FIG. 39B as data 316 by performing the packet-level error (erasure) correction decoding. However, in data 316, sometimes the indefinite information packet exists in the g packets from "packet k-#1" to "packet k-#g" depending on a result of the packet-level error (erasure) correction decoding. That is, sometimes data 316 includes a packet, which is not obtained even if the erasure correction decoding is performed.

Accordingly, packet (or frame) processor 315 outputs information (information indicating whether the packet is obtained or indicating the indefinite packet) indicating the state of each packet as state information 3501 about the data.

Data 316 and state information 3501 about the data are input to signal processor 3502, and signal processor 3502 outputs the packet obtained from data 316 as post-signal-processing data 3503, and outputs state information 3501 about the data as information 3504 about the data.

Signal processor 3502 may delete the indefinite information packet, and output the post-deletion data as post-signal-processing data 3503. Alternatively, signal processor 3502 may output a virtual packet in which the indefinite packet is filled with the dummy data. The dummy data may be a regular data so as to be recognized as the dummy data.

FIG. 38 illustrates a configuration example of transmission device 3407 of repeater 3302 in FIG. 34, and a component operating similarly to that in FIG. 2 is designated by the same reference mark.

For example, transmission device 3407 of repeater 3302 in FIG. 38 performs the packet-level error (erasure) correction coding in the case that repeater 3302 (simultaneously) transmits the data to the plurality of terminals as illustrated in FIG. 33 (for example, multi-carrier transmission).

Post-signal-processing data 3503 output from reception device 3403 of repeater 3302 in FIG. 35 corresponds to information 201 about transmission device 3407 of repeater 3302 in FIG. 38, and information 3504 about the data output from reception device 3403 of repeater 3302 in FIG. 35 corresponds to information 3801 about the data of transmission device 3407 of repeater 3302 in FIG. 38.

Information 201, control signal 211, and information 3801 about the data are input to packet (or frame) processor 202 in FIG. 38, and for example, packet (or frame) processor 202 performs the packet-level error (erasure) correction coding on information 201, and outputs post-packet- (or frame-) processing data 203. In the case that control signal 211 indicates the omission of the packet-level error (erasure) correction coding, packet (or frame) processor 202 in FIG. 38 omits the packet-level error (erasure) correction coding, and outputs data 203.

A third method different from the first and second methods will be described below.

(Third Method)

Packet (or frame) processor 315 of reception device 3403 of repeater 3302 in FIG. 35 omits the packet-level error (erasure) correction decoding.

Packet (or frame) processor 315 of reception device 3403 of repeater 3302 in FIG. 35 outputs the g packets from "packet k-#1" to "packet k-#g" in FIG. 39B as data 316 by performing the packet-level error (erasure) correction decoding. Sometimes the indefinite packet, namely, the packet that is not obtained even if the erasure correction decoding is performed exists in the g packets from "packet k-#1" to "packet k-#g".

Accordingly, packet (or frame) processor 315 outputs information (information indicating whether the packet is obtained or indicating the indefinite packet) indicating the state of each packet as state information 3501 about the data.

Data 316 and state information 3501 about the data are input to signal processor 3502, and signal processor 3502 outputs the packet obtained from data 316 as post-signal-processing data 3503, and outputs state information 3501 about the data as information 3504 about the data.

Signal processor 3502 may delete the indefinite information packet, and output the post-deletion data as post-signal-processing data 3503. Alternatively, signal processor 3502 may output a virtual packet in which the indefinite packet is filled with the dummy data. The dummy data may be a regular data so as to be recognized as the dummy data.

FIG. 38 illustrates a configuration example of transmission device 3407 of repeater 3302 in FIG. 34, and a component operating similarly to that in FIG. 2 is designated by the same reference mark.

For example, transmission device 3407 of repeater 3302 in FIG. 38 performs the packet-level error (erasure) correction coding in the case that repeater 3302 (simultaneously) transmits the data to the plurality of terminals as illustrated in FIG. 33 (for example, multi-carrier transmission).

Post-signal-processing data 3503 output from reception device 3403 of repeater 3302 in FIG. 35 corresponds to information 201 about transmission device 3407 of repeater 3302 in FIG. 38, and information 3504 about the data output from reception device 3403 of repeater 3302 in FIG. 35 corresponds to information 3801 about the data of transmission device 3407 of repeater 3302 in FIG. 38.

Information 201, control signal 211, and information 3801 about the data are input to packet (or frame) processor 202 in FIG. 38, and packet (or frame) processor 202 performs the packet-level error (erasure) correction coding on information 201, and outputs post-packet- (or frame-) processing data 203.

As described above, in the fifth exemplary embodiment, transmission station 3301 in FIG. 33 performs the packet-level error (erasure) correction coding when transmitting the data to repeater 3302. Therefore, in the case that the plurality of repeaters 3302 exist, each repeater 3302 can obtain the high reception quality of the data against the variation of the environment of the communication from transmission station 3301 to repeater 3302 (for example, a radio wave propagation environment) while transmission station 3301 does not re-transmit the data. Additionally, repeater 3302 in FIG. 33 performs the packet-level error (erasure) correction coding when transmitting the data to the terminal. Therefore, in the case that the plurality of terminals 3303 exist, each terminal 3303 can obtain the high reception quality of the data against the variation of the environment of the communication from repeater 3302 to terminal 3303 (for example, a radio wave propagation environment) while repeater 3302 does not re-transmit the data. Therefore, terminal 3303 is hardly influenced by the environment of the communication from transmission station 3301 to repeater 3302 and the environment of the communication from repeater 3302 to terminal 3303, so that terminal 3303 can obtain the high reception quality of the data.

In the fifth exemplary embodiment, the data is wirelessly transmitted by way of example. However, the present disclosure is not limited to this case, and the data can also be transmitted in a wired manner. In FIG. 33, transmission station 3301 may directly transmit the data to terminal 3303 with no use of repeater 3302. A frequency band of the modulation signal transmitted from transmission station 3301 may be identical to or different from a frequency band of the modulation signal transmitted from repeater 3302.

Sixth Exemplary Embodiment

In a sixth exemplary embodiment, an example of a method for providing software when a function of the erasure correction decoding (at least one of the packet-level erasure correction decoder and application-layer erasure correction decoding) described herein is implemented will be described with reference to FIG. 41.

Figure 41:
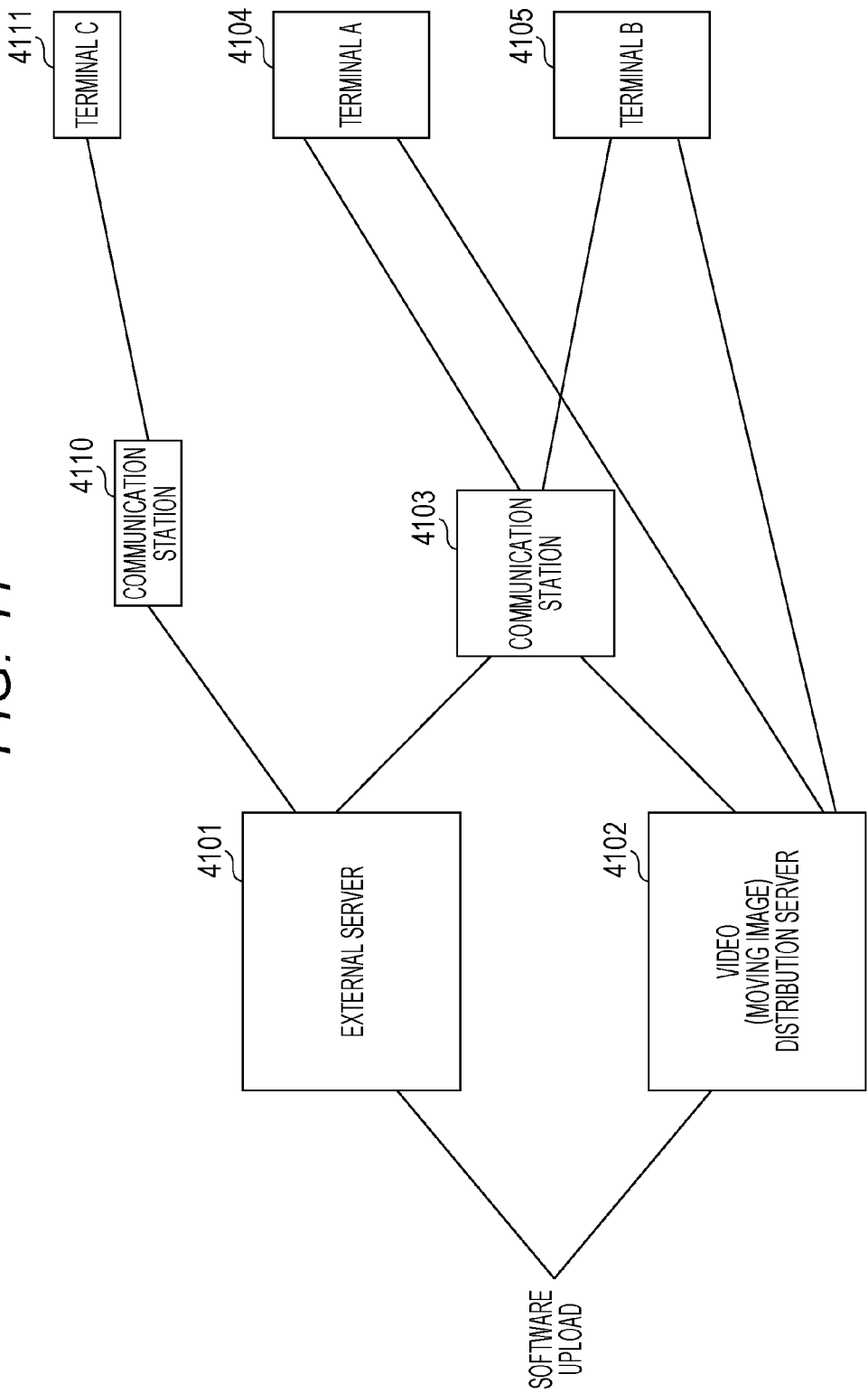
FIG. 41 illustrates an example of a method for providing software implementing an erasure correction decoding function.

In FIG. 41, a description will be given of a case where for example, software implementing the erasure correction decoding function is uploaded on external server 4101, and external server 4101 holds the software implementing the erasure correction decoding function.

External server 4101 includes the software implementing the erasure correction decoding function, and external server 4101 performs at least the packet-level coding on the video information, and may include the data including the video information.

Video (moving image) distribution server 4102 performs at least the packet-level coding on the video information, and includes the data including the video information.

External server 4101 and video (moving image) distribution server 4102 may transmit the data to terminals 4104, 4105, 4111 through communication stations 4110, 4103. In the case that external server 4101 and video (moving image) distribution server 4102 include an access point function, external server 4101 and video (moving image) distribution server 4102 may directly transmit the data to terminals 4104, 4105, 4111 with no use of communication stations 4110, 4103.

The software implementing the erasure correction decoding function may be uploaded on at least one of external server 4101 and video (moving image) distribution server 4102, and at least one of external server 4101 and video (moving image) distribution server 4102 may hold the software implementing the erasure correction decoding function.

In the case that terminal A (4104) needs the software implementing the erasure correction decoding function, terminal A (4104) makes a request to transmit the software implementing the erasure correction decoding function to external server 4101 through communication station 4103, and downloads the software. Then, for example, terminal A (4104) installs the software implementing the erasure correction decoding function.

Similarly, in the case that terminal B (4105) needs the software implementing the erasure correction decoding function, terminal B (4105) makes a request to transmit the software implementing the erasure correction decoding function to external server 4101 through communication station 4103, and downloads the software. Then, for example, terminal B (4105) installs the software implementing the erasure correction decoding function.

The software implementing the erasure correction decoding function may be integrated into software, such as video (moving image) decoding software, which implements another function. The "video (moving image)" may include information such as audio, sound, and subtitles.

Terminal A (4104) and terminal B (4105) receives the data including the video information transmitted from video (moving image) distribution server 4102 through communication station 4103, performs the erasure correction decoding using the downloaded software, and for example, decodes the video (moving image).

In the case that terminal C (4111) needs the software implementing the erasure correction decoding function, terminal C (4111) makes a request to transmit the software implementing the erasure correction decoding function to external server 4101 through communication station 4110, and downloads the software. Then, terminal C (4111) installs the software implementing the erasure correction decoding function.

Because communication station 4110 is not connected to video (moving image) distribution server 4102, after terminal C (4111) enters a wirelessly transmissible area of video (moving image) distribution server 4102 including the access point function, terminal C (4111) receives the data including the video information wirelessly transmitted from video (moving image) distribution server 4102, performs the erasure correction decoding using the software downloaded from external server 4101, and decodes the video (moving image).

As described above, the function of the erasure correction decoding (at least one of the packet-level erasure correction decoder and application-level erasure correction decoding) described herein can be implemented by the software, and the software may be provided to the terminal from, for example, the server (external server 4101 and video (moving image) distribution server 4102).

<Supplement>

As a matter of course, the present disclosure may be carried out by combining a plurality of the exemplary embodiments and other contents described herein.

Moreover, each exemplary embodiment and the other contents are only examples. For example, while a "modulating scheme, an error (erasure) correction coding scheme (an error correction code to be used, a code length, a coding rate and the like), control information and the like" are exemplified, it is possible to carry out the present disclosure with the same configuration even when other types of a "modulating scheme, an error (erasure) correction coding scheme (an error correction code to be used, a code length, a coding rate and the like), control information and the like" are applied.

As to a modulating scheme, even when a modulating scheme other than the modulating schemes described herein is used, it is possible to carry out the exemplary embodiments and the other contents described herein. For example, APSK (Amplitude Phase Shift Keying) (such as 16APSK, 64APSK, 128APSK, 256APSK, 1024APSK and 4096APSK), PAM (Pulse Amplitude Modulation) (such as 4PAM, 8PAM, 16PAM, 64PAM, 128PAM, 256PAM, 1024PAM and 4096PAM), PSK (Phase Shift Keying) (such as BPSK, QPSK, 8PSK, 16PSK, 64PSK, 128PSK, 256PSK, 1024PSK and 4096PSK), and QAM (Quadrature Amplitude Modulation) (such as 4QAM, 8QAM, 16QAM, 64QAM, 128QAM, 256QAM, 1024QAM and 4096QAM) may be applied, or in each modulating scheme, uniform mapping or non-uniform mapping may be performed. The transmission method may be a transmission method (an SISO (Single-Input Single-Output) transmission method and an SIMO (Single-Input Multiple-Output) transmission method) in which the transmission device receives the signal using one antenna while the reception device receives the signal using at least one antenna like the above exemplary embodiments. Alternatively, a scheme (an MIMO (Multiple-Input Multiple-Output) transmission scheme and a MISO (Multiple-Input Single-Output) transmission scheme) in which the transmission device transmits the plurality of streams while the reception device receives the modulation signal using at least one antenna may be adopted. A time-space block code or a time-space trellis code may be used (at this point, in the case that the multi-carrier scheme such as the OFDM is adopted, the symbols may be arrayed in a time axis direction, a frequency axis direction, or a frequency-time axis direction).

The present disclosure is not limited to the above exemplary embodiments. The present disclosure can be made in any mode that achieves the present disclosure and items associated with the present disclosure. For example, the present disclosure can be described as follows.

(1) In the above exemplary embodiments, the case achieved using the coder and the transmission device is mainly described by way of example. Alternatively, the present disclosure can be applied to the case achieved using wired broadcasting, wired communication, electric light wiring communication, optical communication, and a wireless communication device.

(2) A procedure to operate the communication device on the transmission side in each exemplary embodiment is written in a program, the program is previously stored in a ROM (Read Only Memory), and a CPU (Central Processing Unit) may execute the program by reading the program stored in the ROM. The program in which the procedure to operate the communication device on the transmission side is written is stored in a computer-readable storage medium, the program stored in the storage medium is stored in a RAM (Random Access Memory) of a computer, and the CPU of the computer may execute the program by reading the program stored in the RAM.

(3) Then, each configuration of each of the above-described exemplary embodiments and the like may be realized as an LSI (Large Scale Integration) which is typically an integrated circuit having an input terminal and an output terminal. These integrated circuits may be formed as one chip separately, or may be formed as one chip so as to include the entire configuration or part of the configuration of each exemplary embodiment.

The LSI is described here, but the integrated circuit may also be referred to as an IC (Integrated Circuit), a system LSI, a super LSI and an ultra LSI depending on a degree of integration.

A circuit integration technique is not limited to the LSI, and may be realized by a dedicated circuit or a general purpose processor. After manufacturing of the LSI, a programmable FPGA (Field Programmable Gate Array) or a reconfigurable processor which is reconfigurable in connection or settings of circuit cells inside the LSI may be used.

Further, when development of a semiconductor technology or another derived technology provides a circuit integration technology which replaces the LSI, as a matter of course, functional blocks may be integrated by using this technology. There may be biotechnology adaptation or the like as a possibility.

(4) The present disclosure is useful to not only the wireless communication (broadcasting by radio) but also wired communication or broadcasting by cable such as PLC (Power Line Communication), visible light communication, and optical communication.

(5) Although the terms such as the physical layer, the application layer, and the packet level are used in the exemplary embodiments, the terms are simply definitions, but names are not limited to the terms.

(6) Sometimes the physical-layer error correction code is generally referred to as an FEC (Forward Error Correction) scheme.

(7) Sometimes the packet-level error (erasure) correction code is referred to as an AL (Application Layer)-(Forward Error Correction) scheme.

It can be considered herein that a communication and broadcast apparatuses such as a broadcast station, a base station, an access point, a terminal and a mobile phone includes the transmission device. In this case, it can be considered herein that a communication apparatus such as a television, a radio, a terminal, a personal computer, a mobile phone, an access point and a base station includes the reception device. It can also be considered that each of the transmission device and the reception device according to the present disclosure is an apparatus having communication functions and has a form connectable via any interface to a device for executing an application such as a television, a radio, a personal computer, and a mobile phone.

In the exemplary embodiments, symbols other than data symbols, for example, pilot symbols (preambles, unique words, postambles, reference symbols and the like), and control information symbols may be arranged in frames in any way. The symbols are named the pilot symbol and the control information symbol. However, the symbols may be named in any way, and the symbol having the identical function can be interpreted to be identical even if the symbol has a different name.

For example, the pilot symbol only needs to be a known symbol modulated using PSK modulation in the transmission device and reception device (or the reception device may recognize the symbol transmitted from the transmission device by adjusting synchronization). For example, the reception device performs the frequency synchronization, the time synchronization, the channel estimation (of each modulated signal) (estimation of CSI (Channel State Information)), and the signal detection using the symbol.

The control information symbol is one used to transmit the information (such as a modulating scheme used in communication, an error (erasure) correction coding scheme, a coding rate of the error (erasure) correction coding scheme, and setting information in a high order layer) that needs to be transmitted to a communicating party in order to conduct communication except for the data communication (such as application communication).

It is necessary to inform the transmission device and reception device of the transmission method (MIMO, SISO, a space-time block code, and an interleave scheme), the modulation scheme, the error correction coding scheme, and the packet-level error (erasure) correction scheme. This point is occasionally omitted depending on the exemplary embodiment. The symbol transmitting the pieces of information exists in the frame transmitted from the transmission device, and the reception device changes the operation by obtaining the symbol.

Note that the present disclosure is not limited to each exemplary embodiment, and can be carried out with various modifications. For example, the case where the present disclosure is performed as a communication device is described in each exemplary embodiment. However, the present disclosure is not limited to this case, and this communication method can also be used as software.

The present disclosure is useful in restoring the erasure data using the erasure correction code such as the LDPC (Low Density Parity Check) code.

What is claimed is:

1. A decoding device comprising:
a Belief Propagation (BP) decoder that performs BP decoding on an input signal;
a maximum likelihood decoder that performs maximum likelihood decoding on a signal subjected to the BP decoding;
a selector that selects one of the input signal, the signal subjected to the BP decoding, and a signal subjected to the maximum likelihood decoding; and
a controller that decides a combination of a processing capacity and a battery remaining capacity in the decoding device, wherein
in a case where the controller decides that the processing capacity is less than a first threshold, or the processing capacity is equal to or more than the first threshold and the battery remaining capacity is less than a second threshold, the selector selects the input signal,
in a case where the controller decides that the processing capacity is equal to or more than the first threshold and the battery remaining capacity is equal to or more than the second threshold and less than a third threshold, the selector selects the signal subjected to the BP decoding,
in a case where the controller decides that the processing capacity is equal to or more than the first threshold and the battery remaining capacity is equal to or more than the third threshold, the selector selects the signal subjected to the maximum likelihood decoding.

2. A decoding method comprising:
performing, by Belief Propagation (BP) decoder, BP decoding on an input signal;
performing, by a maximum likelihood decoder, maximum likelihood decoding on a signal subjected to the BP decoding;
selecting, by a selector, one of the input signal, the signal subjected to the BP decoding, and a signal subjected to the maximum likelihood decoding; and
deciding, by a controller, a combination of a processing capacity and a battery remaining capacity in the decoding device, wherein
in a case where the controller decides that the processing capacity is less than a first threshold, or the processing capacity is equal to or more than the first threshold and the battery remaining capacity is less than a second threshold, the selector selects the input signal,
in a case where the controller decides that the processing capacity is equal to or more than the first threshold and the battery remaining capacity is equal to or more than the second threshold and less than a third threshold, the selector selects the signal subjected to the BP decoding,
in a case where the controller decides that the processing capacity is equal to or more than the first threshold and the battery remaining capacity is equal to or more than the third threshold, the selector selects the signal subjected to the maximum likelihood decoding.

* * * * *